United States Patent [19]

Kikuda et al.

[11] Patent Number: 5,227,997
[45] Date of Patent: Jul. 13, 1993

[54] SEMICONDUCTOR CIRCUIT DEVICE HAVING MULTIPLEX SELECTION FUNCTIONS

[75] Inventors: Shigeru Kikuda; Takeshi Hamamoto, both of Hyogo, Japan

[73] Assignee: Mitsubishi Denki Kabushiki Kaisha, Tokyo, Japan

[21] Appl. No.: 708,027

[22] Filed: May 31, 1991

[30] Foreign Application Priority Data

Jun. 7, 1990 [JP] Japan .................. 2-150781
Sep. 27, 1990 [JP] Japan .................. 2-259540
Feb. 7, 1991 [JP] Japan .................. 3-016693

[51] Int. Cl.$^5$ ............................... G11C 8/00
[52] U.S. Cl. ..................... 365/189.08; 365/200; 365/230.06; 365/230.08; 371/10.3
[58] Field of Search ............. 365/200, 189.08, 230.06, 365/230.08; 371/10.1, 10.2, 10.3

[56] References Cited

U.S. PATENT DOCUMENTS

| | | | |
|---|---|---|---|
| 3,652,841 | 3/1972 | Lanning | 235/155 |
| 4,176,287 | 11/1979 | Remedi | 307/251 |
| 4,389,715 | 6/1983 | Eaton, Jr. et al. | 365/200 |
| 4,849,938 | 7/1989 | Furutani et al. | 371/10 |
| 4,914,632 | 4/1990 | Fujishima et al. | 365/200 |

FOREIGN PATENT DOCUMENTS 1322068 7/1973 United Kingdom .
2149160A 6/1985 United Kingdom .

OTHER PUBLICATIONS

IEEE Journal of Solid-State Circuits, vol. SC-17, No. 5, Oct. 1982, An Ultralow Power 8K×8-Bit Full CMOS RAM with a Six-Transistor Cell, by Kiyofumi Ochii, et al., pp. 798-803.
1982 IEEE International Journal of Solid-State Circuits Conference, 1982 Digest of Technical Papers, Oct. 1982 vol. SC-17, No. 5, 32K and 16K Static MOS RAMs Using Laser Redundancy Techniques, by Richard J. Smith, et al., pp. 252-253.
LSI Handbook, 1984, pp. 100-101, 3-25.

*Primary Examiner*—Siegfried H. Grimm
*Attorney, Agent, or Firm*—Lowe, Price, LeBlanc & Becker

[57] ABSTRACT

The semiconductor circuit device includes a first column decoder for decoding an internal column address and generating a column select signal which selects one column, and a second column decoder for simultaneously selecting a plurality of successively adjacent columns from a memory cell array in accordance with the column select signal. The second column decoder selects the same column in a duplicated way in response to different column select signals. Since the same column is selected in a duplicate way by the different column select signals, it will be possible to simultaneously select a desired combination of a plurality of columns. A combination of a plurality of columns simultaneously selected can be arbitrarily set and a desired combination of columns can be selected with a simplified circuit structure at high speed. It will be possible to repair a column containing a defective bit without providing a redundant column by providing an input/output control circuit for further selecting a column from the columns simultaneously selected in accordance with the column select signal.

22 Claims, 46 Drawing Sheets

FIG. 14

| Q3 | Q2 | Q1 | Q0 | P3 | P2 | P1 | P0 | SELECT SIGNAL TO BE SELECTED (=ATTAINS "H") |
|----|----|----|----|----|----|----|----|---------------------------------------------|
| L  | L  | L  | H  | L  | L  | H  | H  | SP0, SP1 |
| L  | L  | L  | H  | L  | H  | H  | L  | SP1, SP2 |
| L  | L  | H  | H  | H  | H  | L  | L  | SP2, SP3 |
| L  | L  | H  | H  | H  | L  | L  | L  | SP3, SP4 |
| L  | L  | H  | L  | H  | L  | L  | L  | SP4, SP5 |
| L  | L  | H  | L  | L  | H  | H  | L  | SP5, SP6 |
| L  | H  | H  | L  | L  | L  | H  | H  | SP6, SP7 |
| L  | H  | L  | L  | L  | L  | L  | H  | SP7, SP8 |
| L  | H  | L  | L  | L  | L  | H  | H  | SP8, SP9 |
| L  | H  | L  | L  | H  | H  | H  | L  | SP9, SP10 |
| H  | L  | L  | L  | H  | H  | L  | L  | SP10, SP11 |
| H  | L  | L  | L  | H  | L  | L  | L  | SP11, SP12 |
| H  | L  | L  | L  | L  | H  | L  | L  | SP12, SP13 |
| H  | L  | L  | L  | L  | H  | H  | L  | SP13, SP14 |
| H  | L  | L  | L  | L  | L  | H  | H  | SP14, SP15 |

| C1' | S1' | H | H | L |
|---|---|---|---|---|
| | S0'/C0' | H | L | L |
| L | L | $IS_0'$ | $IS_1'$ | $IS_2'$ |
| L | H | $IS_1'$ | $IS_2'$ | $IS_3'$ |
| H | L | $IS_2'$ | $IS_3'$ | $IS_0'$ |
| H | H | $IS_3'$ | $IS_0'$ | $IS_1'$ |

| | $S_2''$ | H | H | H | L |
|---|---|---|---|---|---|
| | $S_1''$ | H | H | L | L |
| $C_1''$ | $S_0''$ / $C_0''$ | H | L | L | L |
| L | L | $IS_0''$ | $IS_1''$ | $IS_2''$ | $IS_3''$ |
| L | H | $IS_1''$ | $IS_2''$ | $IS_3''$ | $IS_0''$ |
| H | L | $IS_2''$ | $IS_3''$ | $IS_0''$ | $IS_1''$ |
| H | H | $IS_3''$ | $IS_0''$ | $IS_1''$ | $IS_2''$ |

SEMICONDUCTOR CIRCUIT DEVICE HAVING MULTIPLEX SELECTION FUNCTIONS

BACKGROUND OF THE INVENTION

1. Field of the Invention

The invention relates generally to semiconductor circuit devices for decoding a multibit input signal and selectively activating a plurality of subsequent stage circuits in accordance with the result of the decoding and activating methods thereof. More particularly, the invention relates to semiconductor memory devices having a decoder circuit for selecting a row or a column of a memory cell array in response to an external address.

The invention further relates to an improvement of a defective circuit repairing scheme in a semiconductor circuit device having a defective circuit repairing function.

2. Description of the Background Art

As one typical example of a semiconductor circuit device having a function of selectively activating a plurality of subsequent stage circuits, a semiconductor memory device will now be described by way of example.

FIG. 1 is a diagram schematically showing the whole structure of a conventional semiconductor memory device. In FIG. 1, the semiconductor memory device includes a memory cell array 1 in which memory cells each for storing information are arranged in a matrix of rows and columns. In order to select a row and a column respectively from this memory cell array 1, there are provided a row address buffer 2 for receiving an externally applied row address and generating an internal row address RA, a row decoder 3 for decoding the internal row address RA and selecting a corresponding row in the memory cell array 1, a column address buffer 4 for receiving an externally applied column address and generating an internal column address CA, and a column decoder 5 for decoding the internal column address CA and selecting a corresponding column in the memory cell array 1.

A (sense amplifier + I/O) block 6 and an input/output circuit 7 are provided for transmitting and receiving data between a memory cell designated by a row address and a column address, and an outside of the memory device. The sense amplifier of the (sense amplifier + I/O) block 6 senses and amplifies the data of a selected memory cell. The I/O in this block 6 connects a designated column to common data lines (not shown) corresponding to a column select signal from the column decoder 5. The selected column is thereby connected to the input/output circuit 7 over the common data lines.

The input/output circuit 7 derives external data D in response to the data amplified by the sense amplifier in the (sense amplifier + I/O) block 6 at the time of reading data. The input/output circuit 7 generates internal data corresponding to an externally applied data D and supplies the same to the I/O of the block 6 over the common data lines at the time of writing data.

In the structure of the semiconductor memory device shown in FIG. 1, a row address and a column address are supplied in parallel to the row address buffer 2 and the column address buffer 4.

FIG. 2 is a diagram schematically showing the structure of the memory cell array 1 shown in FIG. 1. In FIG. 2, the structure of the memory cell array is shown as an example where the semiconductor memory device is a static type semiconductor memory device. This semiconductor memory device, however, may be a dynamic type semiconductor memory device or a read only memory capable of reading data only.

In FIG. 2, there are representatively shown three word lines WL1 to WL3, and three pairs of bit lines BL0, *BL0, BL1, *BL1, and BL2, *BL2. Memory cells MC10, MC11, MC12, MC20, MC21 and MC22 are provided respectively at crossing points of each of the word lines WL1 to WL2 and the bit line pairs BL0, *BL0, BL1, *BL1 and BL2, *BL2.

One row of memory cells is connected to one word line and one column of memory cells is arranged in one pair of bit lines. Each of the bit line pairs BL0, *BL0, BL1, *BL1, and BL2, *BL2 forms a complementary signal line pair and signals complementary to each other are transmitted to the bit line BL (BL0 to BL2) and the bit line *BL (*BL0 to *BL2).

By selecting one word line and then a pair of bit lines, a memory cell located at the crossing point thereof is selected.

FIG. 3 is a diagram schematically showing the structures of the column decoder and the (sense amplifier + I/O) block shown in FIG. 1. In FIG. 3, the sense amplifier included in the block 6 is omitted.

In FIG. 3, the column decoder 5 includes (m+1) decoder circuits 8-0 to 8-m. Each of the decoder circuits 8-0 to 8-m includes an AND circuit and each receives a predetermined combination of internal column address bits. The decoder circuits 8-0 to 8-m generate a column select signal Y0 to Ym when the predetermined applied predetermined internal column address bits applied thereto all attain "H" of an activate state, where the term "generate" means to bring a select signal to an active state.

In the structure shown in FIG. 3, two columns are selected at the same time, so that a column select signal generated from one decoder circuit selects adjacent two pairs of bit lines.

More precisely, a column select signal from the decoder circuit is supplied to the gate of an I/O gate transistor provided for each bit line pair. I/O gate transistors Tr.1 and Tr.2 are connected to the bit lines BL0, *BL0 and I/O gate transistors Tr.3 and Tr.4 are connected to the bit lines BL1, *BL1, respectively. Similarly, I/O gate transistors Tr.2i+1 and Tr.2i+2 are connected to the bit lines BLi, *BLi, where i=0 to n+1. When any pair of the I/O gate transistors Tr.1 to Tr.2n+4 turns on, a corresponding bit line pair is connected to an I/O line pair which is an internal data transmission line pair.

In FIG. 3, 2 bits of columns are selected at the same time, so that two pairs of internal data transmission lines I/O0, *I/O0 and I/O1, *I/O1, are disposed. The bit line pairs BL2i, *BL2i of even numbers are connected to the internal data transmission line pairs I/O0, *I/O0, and the bit line pairs of odd numbers BL2i+1, *BL2i+1 are connected to the internal data transmission line pair I/O1, *I/O1. A column selecting operation of the circuit shown in FIG. 3 will now be described.

A column select signal Y0 from the decoder circuit 8-0 is supplied to the gates of the I/O gate transistors Tr.1 and Tr.2 and the gates of the I/O gate transistors Tr.3 and Tr.4. Similarly, the column select signal Y1 from the decoder circuit 8-1 is supplied to each gate of the I/O gate transistors Tr.5 to Tr.8. A column select signal Ym from a decoder circuit 8-m is supplied to each gate of I/O gate transistors Tr.2n+1 to Tr.2n+4.

The column decoder 5 receives an internal column address CA from the column address buffer 4 (see FIG. 1). Each of the decoder circuits 8-0 to 8-m generates a column select signal only when this internal column address bits form a predetermined pattern. One decoder circuit is selected in accordance with a combination of the bits of this internal column address CA. The column select signal of the selected decoder circuit rises to an "H" of the active state, and the column select signals from remaining decoder circuits are maintained at "L" of an inactive state.

Now, suppose that the decoder circuit 8-0 is selected by the internal column address CA and the column select signal Y0 rises to "H". At this time, the I/O gate transistors Tr.1 to Tr.4 are brought to an on-state, and the bit line pairs BL0, *BL0, and BL1, *BL1 are connected to the internal data transmission line pairs I/O0, *I/O0 and I/O1, *I/O1, respectively.

At the time of data reading, data on each of the internal data transmission line pairs I/O0, *I/O0, and I/O1, *I/O1 is sensed and amplified by a sense amplifier (not shown) and then transmitted to the input/output circuit 7.

At the time of data writing, write data from the input/output circuit 7 is transmitted onto the corresponding bit line pairs BL0, *BL0, and BL1, *BL1 over the internal data transmission line pairs.

When the decoder circuit 8-1 is selected by an internal column address CA, the column select signal Y1 rises to "H". At this time, the bit line pairs BL2 *BL2 and BL3, *BL3 are connected to the internal data transmission line pairs I/O0, *I/O0, I/O1, *I/O1 through the I/O gate transistors Tr.5, TR.6, and Tr.7, Tr.8. Input/output of data can be thereby done between the selected two columns, i.e., two bit line pairs BL2, *BL2, and BL3, *BL3 and the internal data transmission line pairs I/O0, *I/O0, and I/O1, *I/O1.

Similarly, when the decoder circuit 8-m is selected in accordance with the internal column address CA, the column select signal Ym rises to "H". In this case, the I/O gate transistors Tr.2n+1 to Tr.2n+4 are brought to the on-state, and input/output of data can be done between the bit line pairs BLn, *BLn, and BLn+1, *BLn+1 and the internal data transmission line pairs I/O0, *I/O0 and I/O1, *I/O1.

In this case, at the time of selecting a column, that is when a column select signal Yj (j=0 to m) rises to "H", a word line has been already selected by the output of the row decoder, so that input/output of data can be done for a memory cell located at a crossing of the selected word line and the selected column.

In accordance with the structure as stated above, arbitrary two columns can be connected to the internal data transmission line pairs by externally supplying a column address, and input/output of data of 2 bits can be performed at the same time.

Generally, as the capacity of a semiconductor memory device becomes larger, the possibility becomes high that defective bits (defective memory cells) will exist in the memory cell array. When a semiconductor memory device in which such defective bits exist is disposed of as a defective product, the product yield of the semiconductor memory device is decreased. Accordingly, there is proposed a structure in which a redundant memory cell array is provided extra to the memory cell array, and if there is a defective bit, the defective bit is equivalently repaired by substituting a redundant row or a redundant column in the redundant memory cell array for a row or a column where this defective bit exists (hereinafter referred to as defective row or defective column).

FIG. 4 is a diagram schematically showing the whole structure of a semiconductor memory device having a conventional redundant structure for repairing a defective bit.

In FIG. 4, the conventional semiconductor memory device having a function of repairing a defective bit includes, in addition to a memory cell array 10, a redundant row memory cell array 10 for repairing a defective row and a redundant column memory cell array 11 for repairing a defective column. The redundant row memory cell array 10 and the redundant column memory cell array 11 respectively include an array of memory cells arranged in a matrix of rows and columns so that a plurality of rows and columns can be repaired.

In order to repair a defective row, there are provided a defective row program circuit 12 for storing the address of the defective row and a spare row decoder 3b for supplying a spare row select (redundant row activation) signal SXD in response to an internal row address from a row address buffer 2 and a defective row address from the defective row program circuit 12.

In order to repair a defective column, there are provided a defective column program circuit 13 for storing the address of the defective column and a spare column decoder 5b for generating a redundant column activation signal SYD in response to an internal column address from a column address buffer 4 and a defective column address from the defective column program circuit 13.

There are provided a row address buffer 2, a normal row decoder 3a, and a column address buffer 4, a normal column decoder 5a in order to select a row and a column of the memory cell array 1 in accordance with an external row address and an external column address.

The defective row program circuit 12 and the defective column program circuit 13 respectively include a laser fusable link element such as a fuse element, and a programming of a defective row or a defective column address is performed by selectively blowing off this link element with a laser beam.

The spare row decoder 3b compares an internal row address from the row address buffer 2 with a defective row address programmed in the defective row program circuit 12. When coincidence is found, it generates a redundant row activation signal SXD and selects a redundant row in the redundant row memory cell array 10. At this time, the spare row decoder 3b supplies a normal element disable signal NED to the normal row decoder 3a to deactivate the normal row decoder 3a and inhibits the row selection in the memory cell array 1.

The spare column decoder 5b compares a defective column address stored in the defective column program circuit 13 with an internal column address from the column address buffer 4, and when they coincide with each other, it generates a redundant column activation signal SYD, supplies the same to the redundant column memory cell array 11 and selects a corresponding column. At this time, the spare column decoder 5b also generates a normal element disable signal NED, supplies the same to the normal column decoder 5a and inhibits the column selecting operation by the normal column decoder 5a. An operation of repairing a defective bit in the semiconductor memory device shown in FIG. 4 will be briefly described in the following.

After the semiconductor memory device has been manufactured, a test is conducted to see if this semiconductor memory device functions normally. In this test, if a determination is made that there is a defective bit in the semiconductor memory device, the address of a row or a column including the defective bit is programmed in the defective row program circuit 12 or the defective column program circuit 13 by blowing off a link element with a laser beam and the like.

If externally applied row address and column address select a row and a column which do not include any defective bit, selection of a row and a column in the memory cell array 1 are conducted respectively by the normal row decoder 3a and the normal column decoder 5a. Subsequently, the selected memory cell (the memory cell located at the crossing of the selected row and the selected column) is connected to the input/output circuit 7 through the (sense amplifier +I/O) block 6.

The internal row address and the internal column address respectively received from the row address buffer 2 and the column address buffer 4 are different from the defective row address and the defective column address stored respectively in the defective row program circuit 12 and the defective column program circuit 13, so that the spare row decoder 3b and the spare column decoder 5b both maintain the inactive state.

An operation when an externally applied row address designates a defective row in the memory cell array 1 will now be described. The internal row address from the row address buffer 2 is supplied to the normal row decoder 3a and the spare row decoder 3b. The spare row decoder 3b compares this internal row address with the defective row address stored in the defective row program circuit 12. At this time, as they coincide with each other, the spare row decoder 3b selects a redundant row in the redundant row memory cell array 10, generates a redundant row activation signal SXD and causes a corresponding redundant row to be in a selected state.

Simultaneously, the spare row decoder 3b generates a normal element disable signal NED and supplies the same to the normal row decoder 3a. While the normal row decoder 3a receives an internal row address from the row address buffer 2, the decoding operation is inhibited by this normal element disable signal NED. Accordingly, selection of the defective row in the memory cell array 1 is inhibited.

The normal column decoder 5a decodes the internal column address which designates a normal column from the column address buffer 4 and generates a signal for selecting a corresponding column. The spare column decoder 5b remains in the inactive state as the internal column address is designating the normal column. Accordingly, in this case, a memory cell is selected, which is located at a crossing of a redundant row in the redundant row memory cell array 10 and a column selected by the column select signal from the normal column decoder 5a, and the selected memory cell is connected to the input/output circuit 7 through the block 6.

With the above-mentioned operation, the defective row in the memory cell array 1 is replaced with the redundant row in the redundant row memory cell array 10, so that the defective bit in the memory cell array 1 is equivalently repaired and writing/reading of data is effected accurately.

An operation when an externally applied column address designates a defective column in the memory cell array 1 will now be described. At this time, in the row selecting circuitry, the normal row decoder 3a is brought to the active state, the spare row decoder 3b is brought to the inactive state, and a row corresponding to the internal row address is selected in the memory cell array 1.

In the column selecting circuitry, the spare column decoder 5b is brought to the active state, generates a column select signal SYD and selects a redundant column corresponding to the defective column stored in the defective column program circuit 13 from the redundant column memory cell array 11. The spare column decoder 5b also, generates a normal element disable signal NED and supplies the same to the normal column decoder 5a. While the normal column decoder 5a receives an internal column address from the column address buffer 4, the decoding operation thereof is inhibited by the normal element disable signal NED from the spare column decoder 5b.

Therefore, in this case, a memory cell of a redundant column connected to a normal row is selected, and the selected memory cell is connected to the input/output circuit 7 through the (sense amplifier +I/O) block 6. The defective column in the memory cell array 1 is thereby replaced with a redundant column in the redundant column memory cell array 11 to repair the defective column.

In the case of the structure of the decoder as shown in FIG. 3, two adjacent pairs of bit lines for example, the bit line pairs BL0, *BL0, and BL1, *BL1, the bit line pairs BL2, *BL2 and BL3 and so on can be, in any case, connected to the internal data transmission line pairs I/O0, *I/O0, and I/O1, *I/O1 at the same time. That is, data of 2 bits can be inputted and outputted at the same time.

In the case of the structure of the decoder as shown in FIG. 3, however, the combination of the bit line pairs selected in response to the external column address is uniquely fixed. For example, when the decoder circuit 8-0 is selected, bit line pairs BL0, *BL0 and BL1, *BL1 are selected at that time. Generally, when a decoder circuit 8-i is selected, bit line pairs BL2i, *BL2i and BL2i+1, *BL2i+1 are selected.

The selected combination of the bit line pairs is determined uniquely in accordance with an external column address. Accordingly, for example, when the combination of the bit line pair BL1, *BL1 and the bit line pair BL2, *BL2 is selected and comparison or operation of data from these two columns is effected, the following procedure is needed. At first, a column address for selecting the decoder circuit 8-0 is inputted, the bit line pairs BL0, *BL0 and BL1, *BL1 are selected, and the data of the bit line pair BL1, *BL1 is held, for example, in an external register. Next, an access is made to the semiconductor memory device to select the decoder circuit 8-1, and the bit line pairs BL2, *BL2 and BL3, *BL3 are selected. Thus, the operation of accessing the semiconductor memory device twice is needed, and there arises a problem that a data processing cannot be conducted at high speed.

Generally, in a structure of a conventional decoder, a combination of target objects (subsequent stage circuits) selected by an externally applied designating signal is uniquely determined, so that there is a problem that an arbitrary combination of target objects cannot be selected at the same time. For example, in detecting if something is wrong with a target object to be controlled and locating a place where there is the abnormality by monitoring outputs of a multiplicity of sensors and interpreting the relationship between the outputs of sensors, when the circuit device for effecting this control operation includes a semiconductor circuit device such as a microcomputer and includes a control operation effecting unit in which a combination of sensor designating signals or selected sensors is determined uniquely, the same problem arises, and there also arises a problem that it is impossible to detect if there is an abnormality in the target object and locate a place where there is the abnormality at high speed.

In a conventional semiconductor memory device, when a redundant structure is employed, repairing of a defective bit can be effected and the product yield of the semiconductor memory devices can be improved. In the structure shown in FIG. 4, however, the decoding operation of the normal row decoder and the normal column decoder is inhibited by a normal element disable signal NED generated from the spare row decoder and the spare column decoder. For this reason, there arises a problem that access cannot be made at high speed. This situation will be more specifically described with reference to the drawings.

FIG. 5 is a diagram schematically showing the structure of a unit decoder circuit included in the normal column decoder shown in FIG. 4. In FIG. 5, the unit decoder circuit includes a gate circuit G1 for receiving a predetermined combination of bits of internal column address CA, *CA from the column address buffer 4 at its true inputs and receiving a normal element disable signal NED at its false input, and an inverter circuit G2 for receiving the output of the gate circuit G1. A column select signal Y is generated from the inverter circuit G2 and applied to the gates of the I/O gate transistors TrI, Tr'I.

In FIG. 5, the case in which a pair of bit lines is selected by the unit decoder circuit is shown as an example. However, a plurality of pairs of bit lines may be selected similarly, and in that case, a column select signal Y is applied to the gates of the I/O gate transistors of adjacent bit line pairs.

The internal column address CA, *CA includes a plurality of bits, and the gate circuits G1 receives a predetermined combination of bits in the internal column address of the plurality of bits. The gate circuit G1 supplies a signal Y, of "L" when a combination of the bits of the internal column address CA, *CA set therein coincides with a predetermined combination of bits, and the normal element disable signal NED attains "L". The operation of the decoder circuit shown in FIG. 5 will now be described referring to FIG. 6 which is a waveform diagram of the operation.

In the case of the semiconductor memory device shown in FIG. 4, a column address and a row address are externally applied in parallel at the same time. The strobe timing of the row address and the column address is determined by a chip select signal CS. When the chip select signal CS (not shown in FIG. 4) rises to "H", an external column address Add which has been supplied to the column address buffer 4 is applied to the inside of the device and supplied to the normal column decoder 5a and the spare column decoder 5b.

The normal column decoder 5a performs a decoding operation in response to the internal column address from the column address buffer 4. When an internal column address of a combination predetermined bits is supplied to the gate circuit G1, the output signal Y' of the gate circuit G1 falls to "L", and accordingly, the column select signal Y from the inverter circuit G2 rises to "H".

Simultaneously, a comparing operation of a defective column address from the defective column program circuit 13 and the internal column address CA, *CA is carried out in the spare column decoder 5b. When coincidence is detected in the spare column decoder 5b, a signal SYD for selecting a redundant column is generated, and at the same time, a normal element disable signal NED is generated.

Accordingly, there is a certain period of time T in which the comparing operation is conducted and the decoding operation is completed in the spare column decoder 5b before the normal element disable signal NED rises to "H" after the chip select signal CS rises to "H".

In this period T, the decoding operation has been already conducted in the normal column decoder 5a, so that the column select signal Y rises to "H" and the defective column is connected to the internal data transmission line pair I/O, *I/O in that period.

When the signal NED rises to "H", the output of the gate circuit G1 rises to "H", the column select signal Y falls to "L", and selection of a defective column is inhibited. A selecting operation of a redundant column is conducted under this situation, so that the redundant column can be connected to the internal data transmission line pair I/O, *I/O.

As described above, on selecting a defective column, data of a defective memory cell is read to the internal data transmission line pair I/O, *I/O since the defective column is connected to the internal data transmission line pair I/O, *I/O in the period T. In order to avoid this, it is necessary to connect the redundant column to the input/output circuit 7 after selection of a defective bit is inhibited and replacement by the redundant column is conducted without fail. Therefore, there is a problem that an access time of semiconductor memory device is made longer due to this period T.

Particularly, as this signal NED is supplied in common to each of decoder circuits of the column decoder, to time period in which the signal NED reaches a decoder circuit most distant from the spare column decoder 5b is the longest. As it is necessary to set a write-/read timing of the data taking account of the time period in which the signal NED reaches the decoder circuit in the most distant place, there arises a problem that an access to the semiconductor memory device is further delayed.

This operation is conducted in a similar way in the row selecting circuitry, and when the spare row decoder 3b is activated and the spare row select signal SXD is generated, the normal element disable signal NED is supplied to the normal row decoder 3a and the row selecting operation is inhibited. Therefore, it is necessary to effect a selecting operation of a bit line after a time period has passed in which the defective row is once brought to a selected state. Similarly, the time required for the row selecting operation is made longer, making the access time longer.

There is also a case in which a structure of a normal decoder as shown in FIG. 7 is employed in place of the structure where the decoder circuit is brought to the inactive state by using the signal NED as described above.

FIG. 7 is a diagram showing another structure of a unit decoder circuit contained in a conventional normal column decoder. In FIG. 7, the unit decoder circuit includes a gate circuit G10 for decoding an internal column address CA, *CA, and a column select signal generating circuit LA having a function of bringing a bit line pair to a non-selected state in any case when the bit line pair BL0, *BL0 is a defective column as well as receiving the output of the gate circuit G10 through a link element LE and driving a column select signal Y.

The gate circuit G10 supplies a signal of "L" when the internal column address CA, *CA includes a plurality of bits of a predetermined combination. The link element LE is laser fusable and blown off, for example, with a laser beam when a column (bit line pair BL0, *BL0) selected by the gate circuit G10 is a defective column, and to disconnect the output of the gate circuit G10 and the bit line pair BL0, *BL0.

The column select signal generating circuit LA includes a P channel MOS transistor (insulated gate type field effect transistor) TP1 and an N channel MOS transistor TN1 constituting an inverter for inverting the output of the gate circuit G10 and P channel MOS transistors TP2 and TP3 constituting a latch circuit for initializing the output signal line of the column select signal generating circuit LA to "L" when the power supply is turned on.

The P channel MOS transistor TP2 receives the output signal of the inverter (transistors TP1 and TN1) at the gate. The P channel MOS transistor TP3 receives at the gate a power-on detecting signal *POP which is brought to "L" for a predetermined period of time when the power supply is turned on. The transistors TP2 and TP3 are connected in parallel with each other, and have conduction terminals connected in common to the power supply Vcc, and another conduction terminals of them connected in common to the gates of the transistors TP1 and TN1. The operation of the decoder circuit shown in FIG. 7 will now be described.

When the bit line pair BL0, *BL0 is a normal column, the link element LE is in a conductive state. When the power supply is turned on, the signal *POP is brought to "L" for a predetermined period of time. Responsively to this, the transistor TP3 is brought to the on-state and the power supply potential Vcc is supplied to the gates of the transistors TP1 and TN1. The transistor TN1 is brought to the on-state in response to the transmitted power supply potential Vcc, and the column select signal Y is set to "L" of the ground potential. Even if the signal *POP rises to "H" after a predetermined period of time has passed, the column select signal Y is at "L", so that the transistor TP2 is brought to the on-state, keeping the transistor TN1 in the on-state and the transistor TP1 in an off-state.

When the gate circuit G10 is selected by the internal column address CA, *CA, the gate circuit G10 supplies a signal of "L". At this time, the transistor TP1 is brought to the on-stage, the transistor TN1 is brought to the off-stage, the column select signal Y rises to "H" and the bit line pair BL0, *BL0 is connected to the internal data transmission line pair I/O0, *I/O0 through the transistors Tr0, Tr0'. Selection of a normal column is thereby completed. In this case, the current drive capability of the transistor TP2 is smaller than the current drive capability of the gate circuit G10, so that an on/off operation of the transistors TP1 and TN1 is effected in accordance with the output of the gate circuit G10, regardless of the on-state of the transistor TP2. When the column select signal Y rises to "H", the transistor TP2 is brought to the off-state, so that the column select signal Y is raised to "H" at high speed.

When the bit line pair BL0, *BL0, to which the decoder circuit including the gate circuit G10 is connected, the defective column, the link element LE is blown off with a laser beam and the like. As a result, the gate circuit G10 is disconnected from the bit line pair BL0, *BL0.

When the power supply is turned on, the transistor TP3 causes the transistor TN1 to be in the on-state and causes the column select signal Y to fall to "L". The transistor TP2 is brought to the on-state in response to this "L" column select signal Y, setting the column select signal Y to "L" all the time. Selection of a defective column is thereby inhibited.

In the case of the structure of the decoder circuit using a link element as described above, it is necessary to provide a link element LE for each decoder circuit. When the capacity of a semiconductor memory device becomes larger, it will be necessary to arrange a multiplicity of memory cells in a limited area, so that a bit line pitch will be smaller. It is necessary to form a decoder circuit in accordance with this bit line pitch and locate a link element in accordance with this small bit line pitch.

The link element is blown off with a laser beam. A pitch larger than the bit line pitch is required for the link element, in order to prevent adverse effects on adjacent signal lines (short circuiting of the signal line due to splashes of the melted pieces) caused by the portion blown off at the time of laser fusing. Accordingly, when a bit line pitch is made smaller as the capacity of the semiconductor memory device becomes larger, there arises a problem that it is difficult to provide a link element for each bit line pair.

A structure is employed in place of the memory cell array structure shown in FIG. 4, in which a memory cell array is divided into a plurality of blocks in a mass storage semiconductor memory device and a selecting operation of a row and column is effected for each block.

FIG. 8 is a diagram schematically showing the overall structure of a still another conventional semiconductor memory device. In FIG. 8, the semiconductor memory device includes four divided memory cell array blocks 1a, 1b, 1c and 1d. Each of the memory cell array blocks 1a to 1d includes a plurality of memory cells arranged in rows and columns.

There are provided normal row decoders 30a to 30d, spare row decoders 31a to 31d, redundant row memory cell arrays 10a to 10d and (sense amplifier +I/O) blocks 6a to 6d, corresponding to each of the memory cell array blocks 1a to 1d. An internal row address from the row address buffer 2 is supplied in parallel to each of the normal row decoders 30a to 30d and the spare row decoders 31a to 31d. One row is selected in each of the memory cell array blocks 1a to 1d.

Redundant column memory cell arrays 11a to 11d for repairing a defective column are provided in the memory cell array blocks 1a to 1d.

In order to select a column from each of the memory cell array blocks 1a to 1d, there are provided a column address buffer 4 for receiving an external column address and generating an internal column address, a normal column decoder 5a and a spare column decoder 5b for decoding the internal column address. The normal column decoder 5a is provided in common for the memory cell array blocks 1a to 1d, and the spare column decoder 5b is also provided in common for each of the redundant columns 11a to 11d.

An input/output circuit 7a is provided for selectively effecting input/output of data with the memory cell array blocks 1a and 1b and an input/output circuit 7b is provided for selectively effecting input/output of data with the memory cell array blocks 1c and 1d. An input/output circuit 7c is provided for selectively effecting input/output of data with the input/output circuits 7a and 7b.

Selection of an input/output column in the input/output circuits 7a, 7b and 7c is effected, for example, by decoding a block address to select a block with the most significant row address bit and the most significant column address bit being as the block address in the input/output circuit 7c.

In such a semiconductor memory device, redundant row memory cell arrays 10a to 10d are provided for each of the memory cell array blocks 1a to 1d, and spare row decoders 31a to 31d are provided correspondingly. Accordingly, repairing of a defective row can be effected independently in each of the memory cell array blocks 1a to 1d.

While the redundant column memory cell arrays 11a to 11d are provided respectively corresponding to the memory cell array blocks 1a to 1d, the spare column decoder 5b is provided in common to the redundant column memory cell arrays 11a to 11d. Accordingly, repairing of a defective column is effected in common to each block. That is, replacement with a redundant column is effected in each block regardless of the presence/absence of a defective column in the block. Therefore, for example, when a redundant column in the redundant column memory cell array 11a is used for repairing the defective column in the memory cell array block 1a, a corresponding redundant column is also used in each of the redundant column memory cell arrays 11b to 11d so that there arises a problem that each block cannot utilize the redundant columns independently and repairing of the defective column cannot be performed effectively.

SUMMARY OF THE INVENTION

An object of the invention is to provide a semiconductor circuit device having great flexibility in combination of selected stage circuitry designated by a multiple bit input signal.

Another object of the invention is to provide a semiconductor circuit device capable of freely setting a combination of a plurality of rows or columns simultaneously selected in accordance with an external address.

Still another object of the invention is to provide a semiconductor circuit device for efficiently selecting an arbitrary combination of subsequent circuitry.

Yet another object of the invention is to provide a semiconductor circuit device capable of readily repairing defective subsequent circuitry.

A further object of the invention is to provide a semiconductor circuit device having a function of repairing a defective bit, which does not need a link element for repairing a defective row or a defective column.

Still further object of the invention is to provide a semiconductor circuit device capable of efficiently repairing a defective bit without increasing an access rate.

Yet further object of the invention is to provide a semiconductor circuit device with a function of repairing a defective bit, in which a redundant memory cell can be effectively utilized.

A semiconductor circuit device in accordance with the invention includes selection circuitry responsive to an input signal of a plurality of bits for simultaneously activating a predetermined number of subsequent stage circuitry. This selection circuitry includes circuitry for activating the same subsequent stage circuitry for different input signals in a duplicated way.

In accordance with the structure, it is possible to select and activate an arbitrary combination of subsequent stage circuitry.

Furthermore, when there are provided program circuitry for storing a defective address which specifies defective subsequent stage circuitry, and second selection circuitry for further selecting a predetermined number of subsequent stage circuitry from the plurality of subsequent stage circuitry selected by the selection circuitry, and when the selecting configuration of the second selection circuitry is determined in accordance with a part of the input signal and the comparison result between the defective address and the input signal, repairing of defective subsequent stage circuitry can be effected without providing particular redundant circuitry.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a diagram showing in a table the relationships of input/output signals in the decoder circuit shown in FIG. 13.

FIG. 16 is a diagram showing in a table the relationships of input addresses and first predecoded signals in the predecoder circuit shown in FIG. 15.

FIG. 17 is a diagram showing in a table the relationships of input/output signals in the predecoder circuit shown in FIG. 15.

FIG. 34 is a diagram showing in a table the relationships of input/output signals in the circuit shown in FIG. 33.

FIG. 37 is a diagram showing in a table the relationships of input/output signals in the address converting circuit shown in FIG. 38.

DESCRIPTION OF THE PREFERRED EMBODIMENTS

Figure 9:
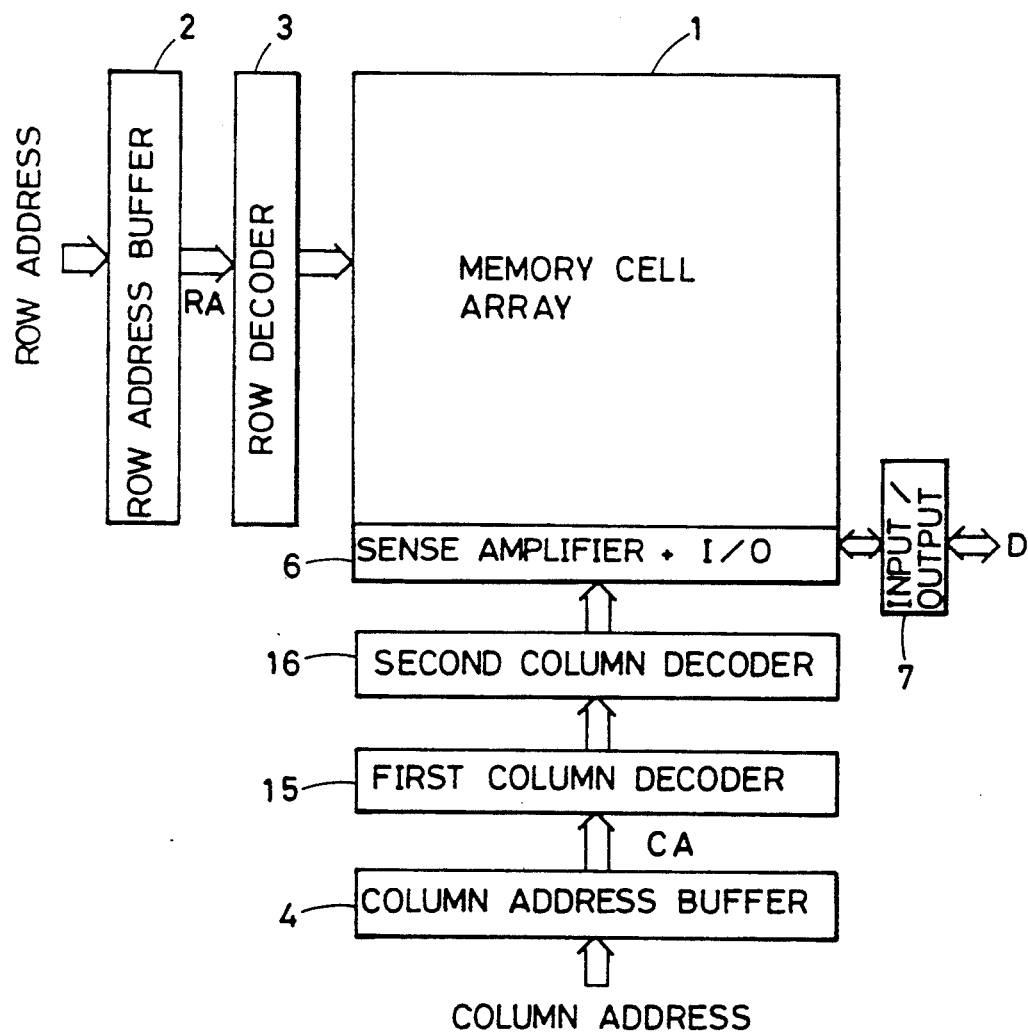
FIG. 9 is a diagram showing a whole structure of a semiconductor memory device according to one embodiment of the present invention.

FIG. 9 is a diagram schematically showing a whole structure of a semiconductor memory device to which present invention is applied. The semiconductor memory device shown in FIG. 9 may be any type of semiconductor memory device as far as it is comprised of such a structure that the memory cells are arranged in a matrix of rows and columns.

In FIG. 9, the semiconductor memory device includes a first column decoder 15 and a second column decoder 16 in addition to the row address buffer 2, the row decoder 3, the column address buffer 4, the (sense amplifier+I/O) block 6 and the input/output circuit 7.

The first column decoder 15 receives an internal column address CA (and *CA) from the column address buffer 4 and generates a first column select signal for selecting a column in a memory cell array 1.

The second column decoder 16 selects a plurality of corresponding columns simultaneously from the memory cell array 1 in response to the first column select signal from the first column decoder 15. The second column decoder 16 has a function of selecting the same column from the memory cell array 1 in response to different first column select signals from the first column decoder 15. An arbitrary combination of columns can be selected from the memory cell array 1 in accordance with an external column address (column address) with this function of the second column decoder 16.

Figure 10:
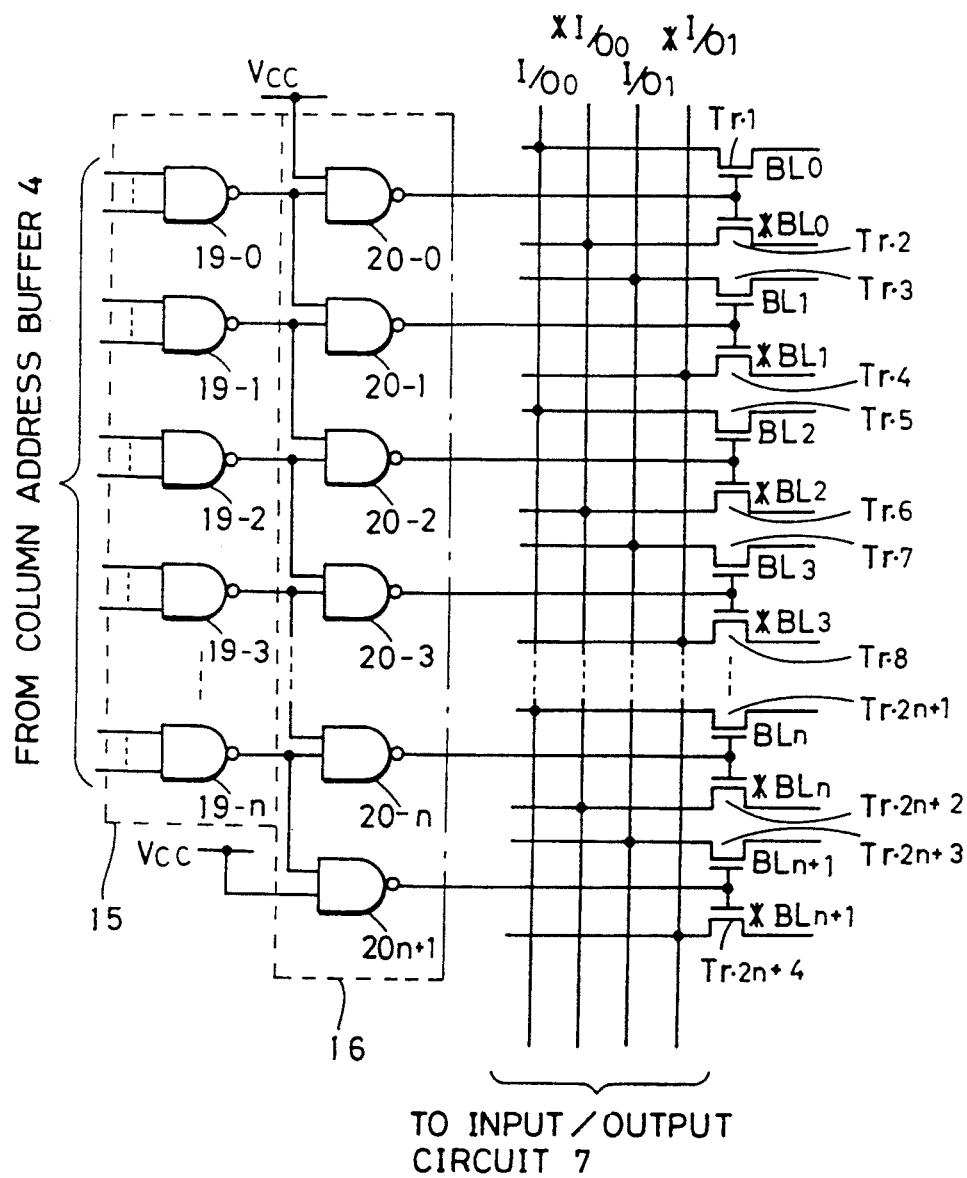
FIG. 10 is a diagram specifically showing a structure of column selecting circuitry in the semiconductor memory device shown in FIG. 9.

FIG. 10 is a diagram specifically showing structures of the first column decoder, the second column decoder and the (sense amplifier+I/O) block shown in FIG. 9. A sense amplifier portion is omitted in FIG. 10. In FIG. 10, the first column decoder 15 includes decoder circuits 19-0 to 19-n each for receiving a predetermined combination of bits of an internal column address signal. The decoder circuits 19-0 to 19-n each include a NAND circuit, each being brought to the selected state and supplying a signal of "L" when a predetermined combination of bits of internal column address signals is supplied.

The second column decoder 16 includes NAND circuits 20-0 to 20-n+1 provided corresponding to bit line pairs BL0, *BL0 to BLn+1, *BLn+1, respectively. The NAND circuit 20-0 receives a power supply voltage Vcc at one input, and receives the output of the decoder circuit 19-0 at the other input. The NAND circuit 20-n+1 receives the output of the decoder circuit 19-n at one input and receives the power supply voltage Vcc at the other input.

Remaining NAND circuits 20-1 to 20-n each receive the outputs of two adjacent decoder circuits. That is, the NAND circuit 20-i (i=1 to n) receives the outputs of the decoder circuits 19-i-1 and 19-i. The NAND circuits 20-0 to 20-n+1 contained in the second column decoder 16 respectively select corresponding bit line pairs and connect the same to the internal data transmission line pairs I/O0, *I/O0, I/O1, *I/O1. The bit line pairs with even numbers (for example BL0, *BL0, BL2, *BL2) are connected to the internal data transmission line pairs I/O0, *I/O0. The bit line pairs with odd numbers (for example bit line pairs BL1, *BL1, BL3, *BL3) are connected to the internal data transmission line pairs I/O1, *I/O1.

In the structure above, each of the NAND circuits 20-1 to 20-n generates a second column select signal when either one of the corresponding decoder circuits is brought to the selected state. For example, the NAND circuit 20-1 generates a second column select signal which brings the bit line pair BL1, *BL1 to the selected state when the decoder circuit 19-0 or the decoder circuit 19-1 is brought to the selected state.

The NAND circuits 20-0 and 20-n+1 generates a second column select signal which brings the bit line pairs BL0, *BL0 and BLn+1, *BLn+1 to the selected state only when the decoder circuits 19-0 and 19-n are brought to the selected state, respectively.

In the second column decoder 16, the NAND circuits 20-1 to 20-n except the NAND circuits 20-0 and 20-n+1 on the both ends can be selected by two decoder circuits, respectively. Accordingly, data of an arbitrary combination of two adjacent columns can be accessed by an external column address. The operation of the column selecting circuitry shown in FIG. 10 will now be described.

Suppose that the decoder 19-0 is selected by an external column address. At this time, the output of the decoder circuit 19-0 only attains "L", and the outputs of the remaining decoder circuits 19-1 to 19-n are at "H". In this case, the NAND circuits 20-0 and 20-1 are brought to the selected state, and the second column select signal of "H" is supplied to the gate of each of the I/O gate transistors Tr.1 to Rr.4. The bit line pair BL0, *BL0 is connected to the internal data transmission line pair I/O0, *I/O0, and the bit line pair BL1, *BL1 is connected to the internal data transmission line pair I/O1, *I/O1.

The operation of selecting a row is conducted in a way similar to that of the conventional ones, and memory cells of 2 bits located at crossings ones, and memory and the selected bit line pairs BL0, *BL0 and BL1, *BL1 are selected and connected to the input/output circuit 7.

Suppose that the decoder circuit 19-1 is selected in response to the column address. At this time, the output of the decoder circuit 19-1 only attains "L". Accordingly, the outputs of the NAND circuits 20-1 and 20-2 rise to "H", and the bit line pair BL1, *BL1 and the bit line pair BL2, *BL2 are respectively connected to the internal data transmission line pairs I/O1, *I/O1 and I/O0, *I/O0.

A combination of NAND circuits simultaneously selected in the second column decoder 16 can be changed in accordance with an external column address, and accordingly a combination of selected bit line pairs can be changed. Therefore, if a column address is properly provided in accordance with a content of process under execution, arbitrary adjacent memory cells of 2 bits can be simultaneously selected.

Figure 11:
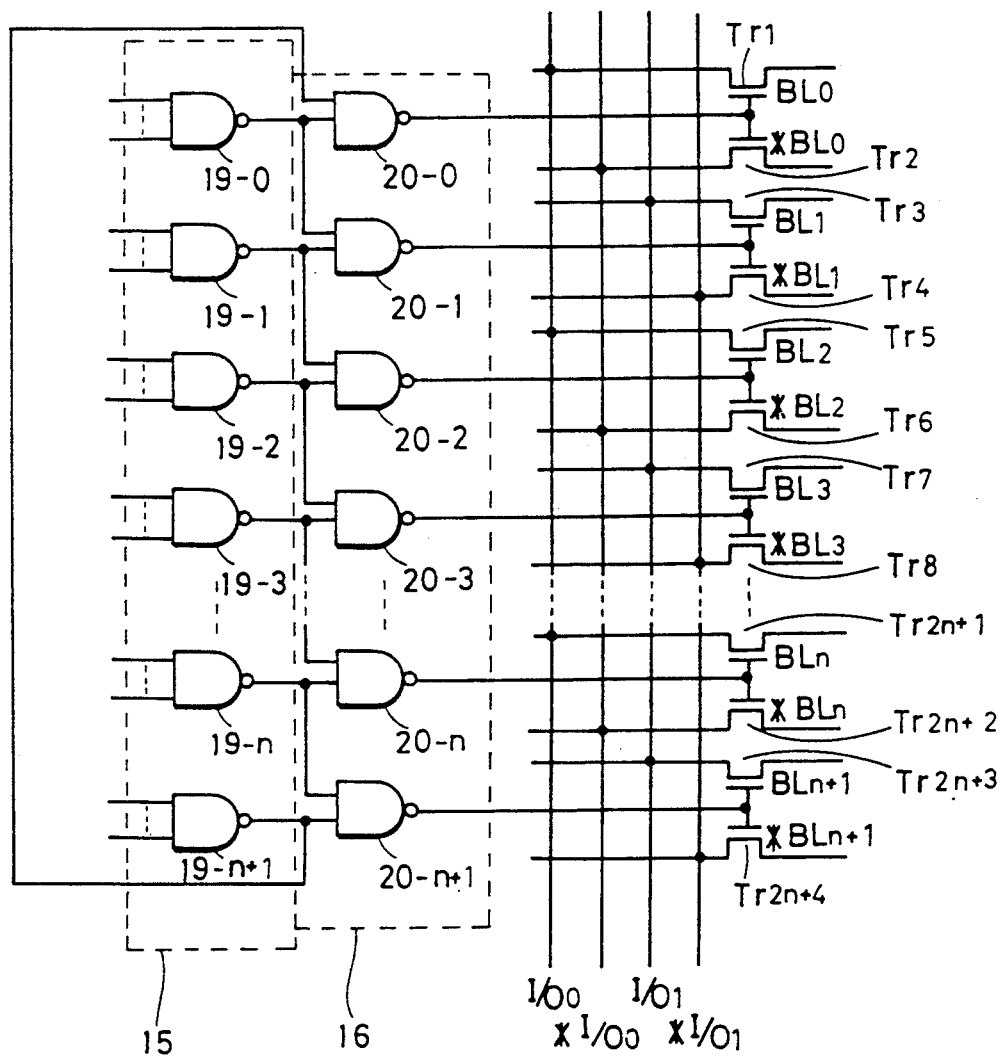
FIG. 11 is a diagram showing a modified example of the column selecting circuitry shown in FIG. 10.

FIG. 11 is a diagram showing a modified example of the column selecting circuitry shown in FIG. 10. In FIG. 11, the first column decoder 15 further includes an additional decoder circuit 19-n+1. The number of decoder circuits and the number of bit line pairs contained in the first column decoder thereby become the same as each other.

Figure 1:
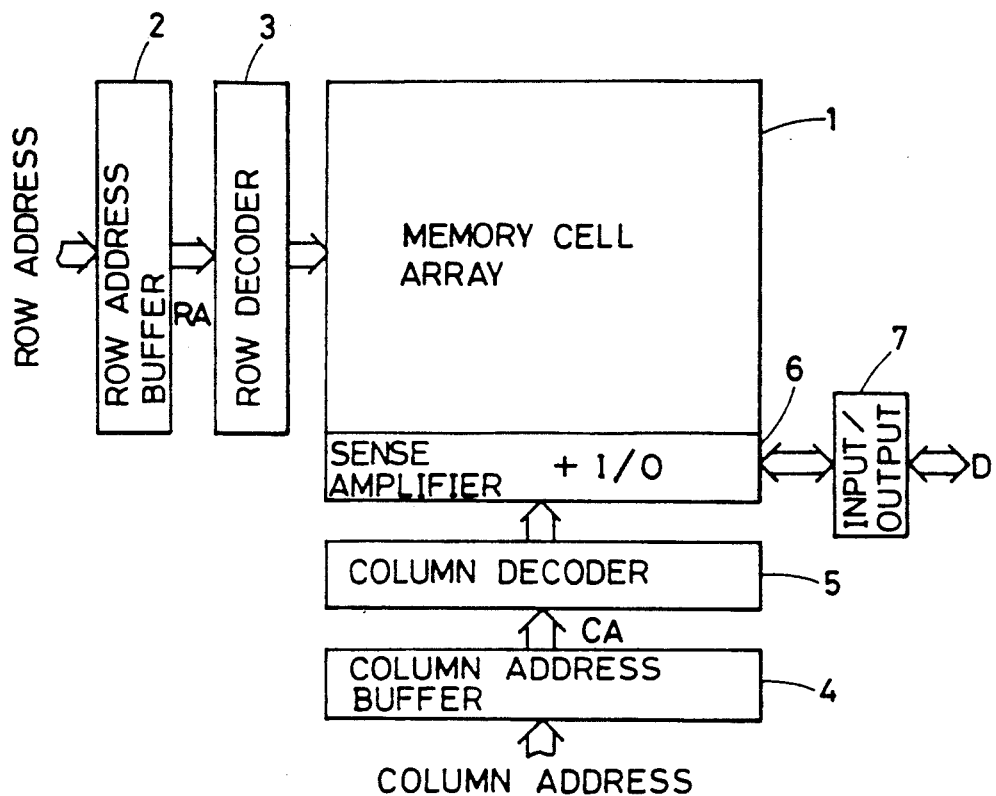
FIG. 1 is a diagram schematically showing the whole structure of a conventional semiconductor memory device.
Figure 2:
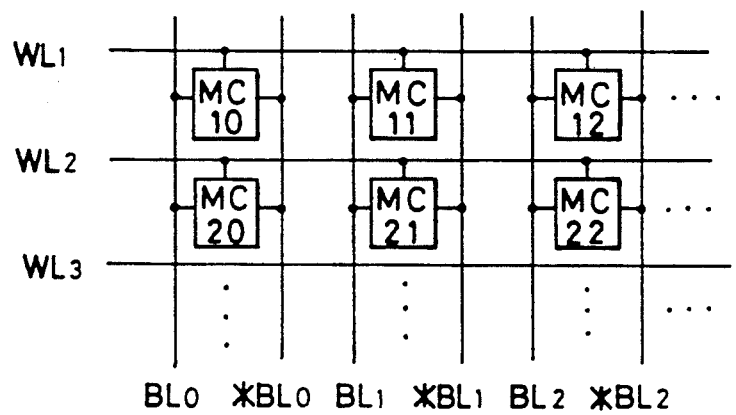
FIG. 2 is a diagram specifically showing a structure of the memory cell array shown in FIG. 1.

While the second column decoder 16 has a structure similar to that of the one shown in FIG. 2, it is different in that the NAND circuits 20-0 and 20-n+1 receive the output of the decoder circuit 19-n+1 in place of the power supply voltage Vcc at each one input. Accordingly, the NAND circuit 20-0 generates a signal which selects the bit line pair BL0, *BL0 when the decoder circuit 19-0 or the decoder circuit 19-n+1 is brought to the selected state.

The NAND circuit 20-n+1 generates a signal which selects the bit line pair BLn+1, *BLn+1 when the decoder circuit 19-n or the decoder circuit 19-n+1 is brought to the selected state.

In the structure shown in FIG. 11, two adjacent pairs of bit lines in a loop relationship can be selected. In the structure shown in FIG. 10, the bit line pair BL0, *BL0 is selected only in combination with the bit line pair BL1, *BL1 at the same time. Similarly, the bit line pair BLn+1, *BLn+1 is simultaneously selected only with the bit line pair BLn, *BLn. In the structure shown in FIG. 11, however, the bit line pair BL0, *BL0 can be simultaneously selected with the bit line pair BL1, *BL1 or the bit line pair BLn+1, *BLn+1. Similarly, the bit line pair BLn+1, *BLn+1 can be simultaneously selected with the bit line pair BLn, *BLn or the bit line pair BL0, *BL0. That is, two arbitrary adjacent pairs of bit lines or two arbitrary pairs of bit lines adjacent to each other over a loop can be simultaneously selected.

Figure 12:
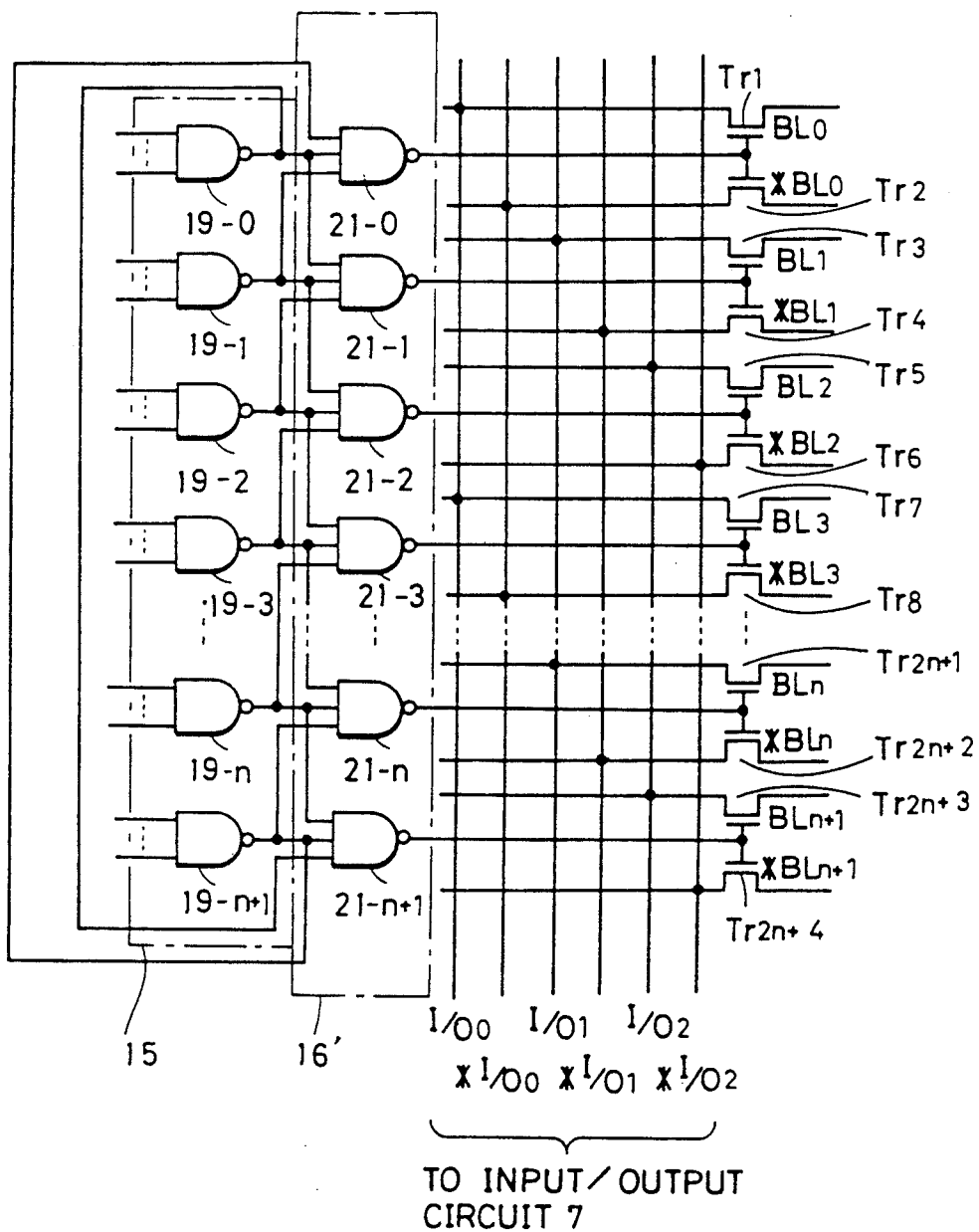
FIG. 12 is a diagram showing a still another modified example of the column selecting circuitry shown in FIG. 10.

FIG. 12 is a diagram showing still another modified example of the column selecting circuitry shown in FIG. 10. In FIG. 12, the first column decoder 15 includes NAND type decoder circuits 19-0 to 19-n+1 similarly to the structure shown in FIG. 11. The second column decoder 16' includes 3-input NAND circuits 21-0 to 21-n+1. Each of the NAND circuits 21-0 to 21-n+1 receives the outputs of three adjacent decoder circuits or three decoder circuits adjacent over a loop. For example, the NAND circuit 21-0 receives the outputs of the decoder circuits 19-0, 19-1 and 19-n+1. The NAND circuit 21-n+1 receives the output of the decoder circuits 19-n, 19-n+1 and 19-0. Remaining NAND circuits 21-i (i=1 to n) receive the outputs of the decoder circuits 19-i-1, 19-1 and 19-i+1.

Each of the NAND circuits 21-0 to 21-n+1 is provided corresponding to the bit line pairs BL0, *BL0 to BLn+1, *BLn+1 respectively. Accordingly, when the NAND circuit 21-j (j=0 to n+1) is selected, the bit line pair BLj, *BLj is selected.

In the structure shown in FIG. 12, when one decoder circuit is selected, three bit line pairs are simultaneously selected and the three selected pairs of bit lines are respectively connected to three pairs of internal data transmission lines I/O0, *I/O0, I/O1, *I/O1, and I/O2, *I/O2. The bit line pair BL3k, *BL3k is connected to the internal data transmission line pair I/O0, *I/O0, the bit line pair BL3k+1, *BL3k+1 is connected to the internal data transmission line pair I/O1, *I/O1, and the bit line pair BL3k+2, *BL3k+2 is connected to the internal data transmission line pair I/O2, *I/O2, where k is an arbitrary integer.

In the structure shown in FIG. 12, when one decoder circuit is selected, three pairs of bit lines are simultaneously selected, and the same bit line pair is selected in response to different external column addresses in a duplicated way, so that arbitrary adjacent memory cells of 3 bits or arbitrary memory cells of 3 bits adjacent over a loop can be simultaneously selected.

The internal column address CA (and *CA) is decoded by the NAND type decoder circuit and a plurality of columns are simultaneously selected by the output of this decoder circuit in the structure described above. Each of the decoder circuits receives an internal column address CA and *CA) including a predetermined combination of bits. An address predecode system is widely employed in a mass storage semiconductor memory device for reduction in an area occupied by a decoder and for speeding up of the decoding operation. An arbitrary combination of a plurality of bit line pairs can be simultaneously selected using such an address predecode system.

Figure 13:
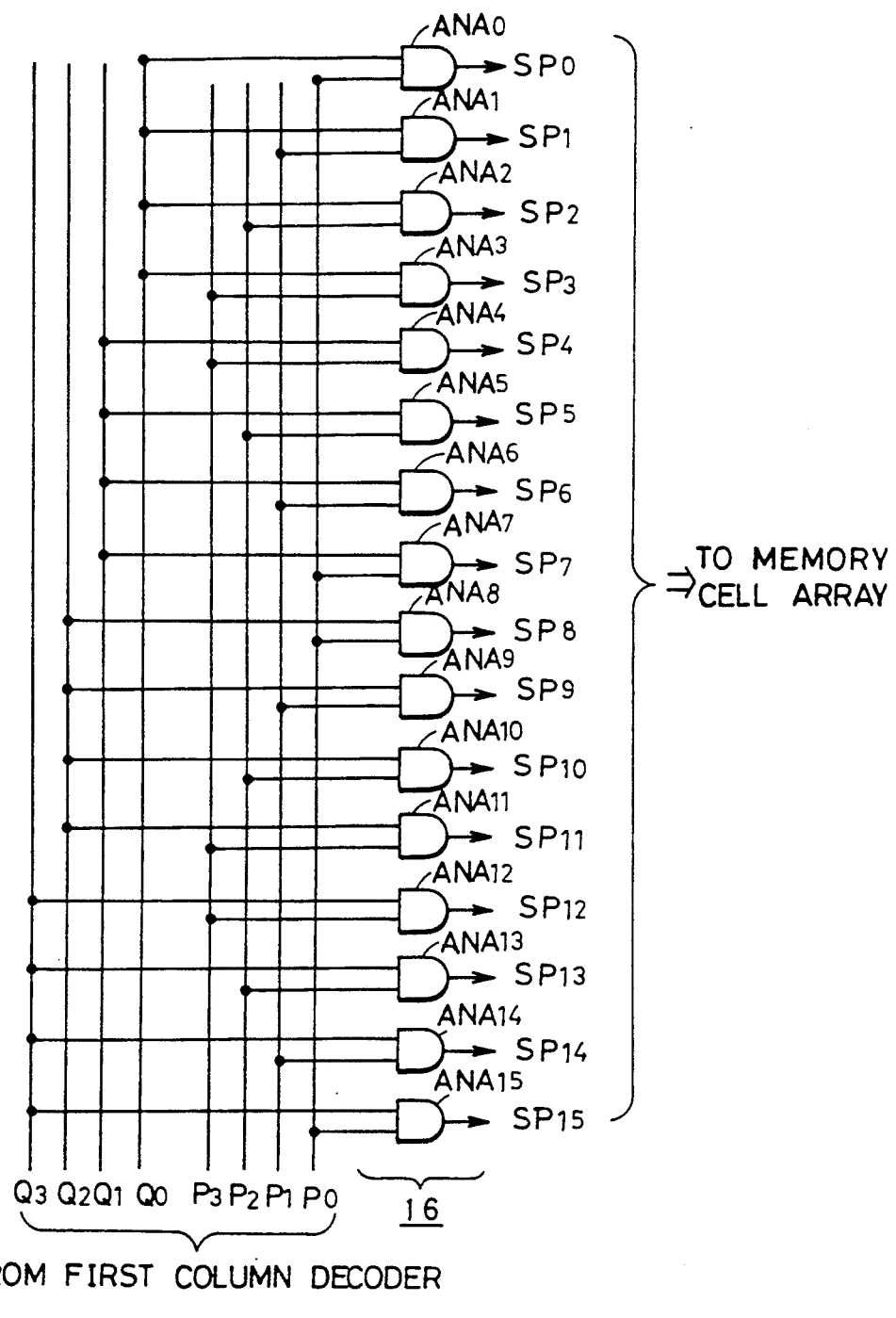
FIG. 13 is a diagram showing another example of a structure of the second column decoder shown in FIG. 9.

FIG. 13 is a diagram showing a structure of a column selecting circuitry in a semiconductor circuit device in accordance with a third aspect of the invention. While a structure of a decoder is shown in FIG. 13 as an example where 16 columns (16 pairs of bit lines) are provided, the structure of this decoder can be readily expanded.

The second column decoder 16 includes AND circuits ANA0 to ANA15 to which a predetermined by corresponding combination of predecoded signals are supplied. Column select signals (select signals) SP0 to SP15 are respectively generated from the AND circuits ANA0 to ANA15. Predecoded signals P0 to P3 and Q0 to Q3 are generated by predecoding a plurality of adjacent bits of an address signal. A specific structure of a first column decoder (predecoder) 15 for generating these predecoded signals P0 to P3 and Q0 to Q3 will be described in detail in the following. The AND circuits ANA0 to ANA15, when predecoded signals supplied to the both inputs thereof both attain of the active state "H", cause corresponding select signals to rise to "H" of the active state.

The AND circuits ANA0 to ANA15 are divided into four groups. These groups are specified by the predecoded signal of 4-bits Q0 to Q3. When the predecoded signal bit Q0 is brought to the-active state, the AND circuits ANA0 to ANA3 of a first group are designated. When the bit Q1 is brought to the active state, the AND circuits ANA4 to ANA7 of a second group are designated. When the bit Q2 is brought to the active state, the AND circuits ANA8 to ANA11 are designated. When the bit Q3 is brought to the active state, the AND circuits ANA12 to ANA15 are designated.

The AND circuits ANA0 to ANA15 have allotted element numbers indicating positions in the respective groups. These element numbers are given in a mirror-reflection relationship with respect to boundary lines of the groups. That is, the element numbers in a group is provided in an increasing order, and then a decreasing order in the adjacent group which ordering is repeated for all the groups cyclically. These element numbers are specified by the predecoded signal P0 to P3. Each bit of the predecoded signal P0 to P3 designates one from each group, that is, a total of four AND circuits. Suppose now that the element numbers of the AND circuits ANA0 to ANA3 are 0, 1, 2, 3 and the element numbers of the AND circuits ANA4 to ANA8 are 3, 2, 1, 0. The change of these element numbers is also repeated in the AND circuits ANA9 to ANA15, the AND circuits ANA8 to ANA11 are provided with the element numbers 0 to 3, and the AND circuits ANA12 to ANA15 are provided with the element numbers 3 to 0. The predecoded signal bit P0 designates AND circuits of the element number 0. The predecoded signal bit P1 designates AND circuits of the element number 1. The predecoded signal bit P2 designates AND circuits of the element number 2. The predecoded signal bit P3 designates AND circuits of the element number 3.

The number of bits which are brought to the an active state in the predecoded signal bits P0 to P3 and Q0 to Q3 is constant so that two AND circuits which are always adjacent to each other only are brought to the selected state. That is, when 2 adjacent in the predecoded signal P0 to P3 bits are simultaneously brought to the active state, only 1 bit in the predecoded signal Q0 to Q3 is brought to the active state. When only 1 bit in the predecoded signal P0 to P3 is brought to the active state, 2 adjacent bits in the predecoded signal Q0 to Q3 are brought to the an active state. For example, if the predecoded signal bit Q0 is brought to the active state of "H" and the predecoded signal bits P0 and P1 attain "H" of the active state, the AND circuits ANA0 and ANA1 having the element numbers 0 and 1 of the group number 0 are selected, and the select signals SP0 and SP1 attain "H" of the active state. As a result, two adjacent columns are simultaneously selected. Therefore, when the predecoded signal bits Q0 to Q3 for specifying a group number and the predecoded signal bits P0 to P3 for specifying an element number are appropriately and selectively brought to the active state, an arbitrary combination of two adjacent AND circuits can be simultaneously brought to the selected state, and an arbitrary combination of two adjacent pairs of bit lines can be selected. FIG. 14 shows in a table the correspondence between the active states of these predecoded signal bits P0 to P3 and Q0 to Q3 and the select signals SP0 to SP15 generated associatively.

As is obvious from FIG. 14, the number of bits which are brought to the active state in the predecoded signals P0 to P3 and Q0 to Q3 is 3 in any case, and adjacent bits are brought to the active state in one group. With the combination of the bits in the active state, select signals for selecting an arbitrary combination of columns adjacent to each other are be generated from corresponding AND circuits. The structure in which the select signals for column selection are generated using such a predecoded signal is substantially the same as a conventional decoder using a predecode system in terms of the scale of the circuit and the area of the layout, except that the method of generating the predecoded signals P0 to P3 and Q0 and Q3 and the order of connecting the predecoded signals to each AND circuit are different. Accordingly, an arbitrary combination of two adjacent columns can be selected with an extremely simplified circuit structure, without increasing the area occupied by the decoder.

Figure 15:
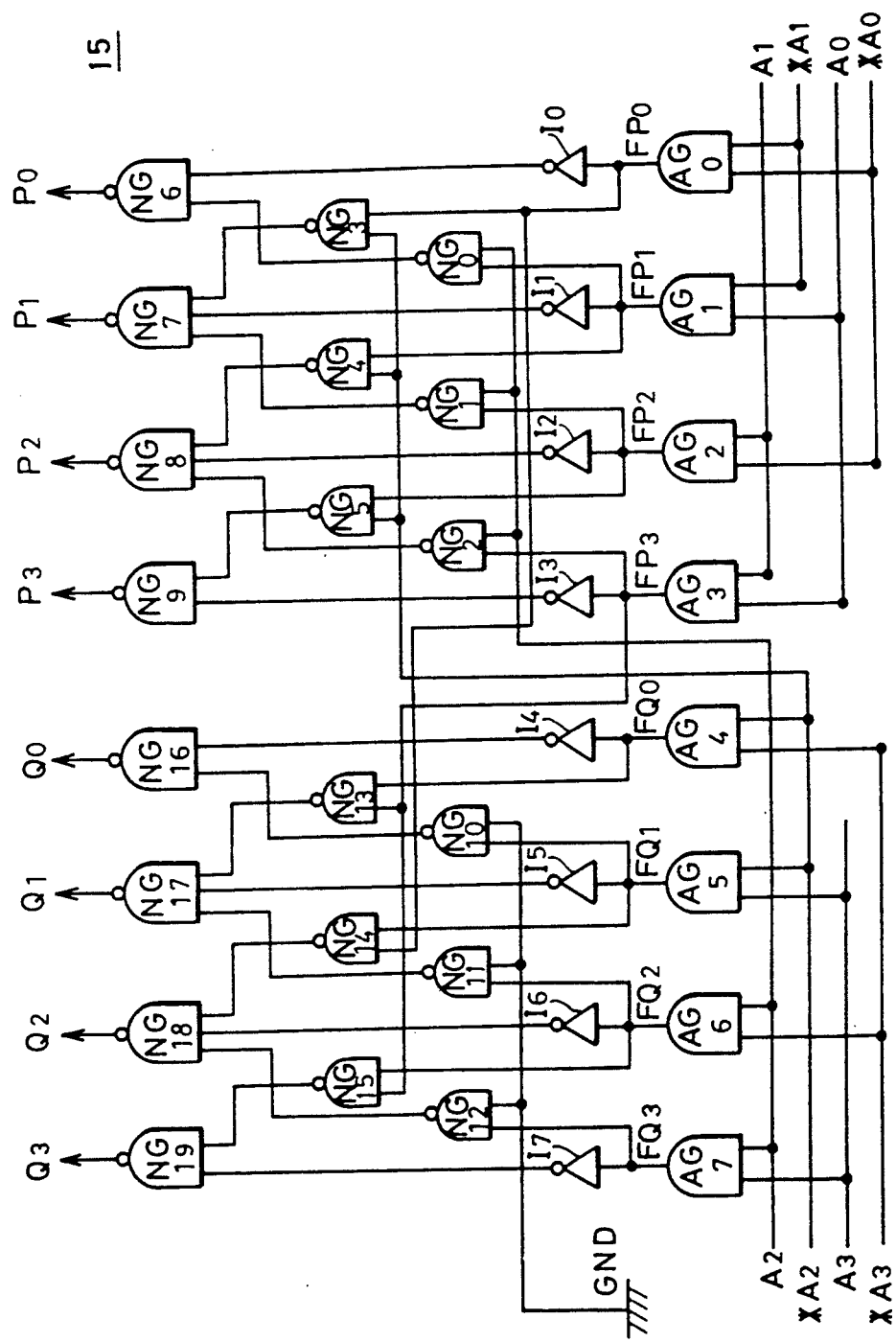
FIG. 15 is a diagram showing one example of a specific structure of a first column decoder circuit (predecoder circuit) utilized in combination with the decoder circuit shown in FIG. 13.

FIG. 15 is a diagram showing one example of a specific circuit structure of a first column decoder 15 (hereinafter referred to as predecoder) for generating a predecoded signal including a plurality of bits P0 to P3 and Q0 to Q3. In FIG. 15, the predecoder 15 receives a column address of 4-bits A0 to A4 (a total of 8 bits when complementary internal address thereof *A0 to *A3 is added) in order to designate one of 16 columns. These address bits A0 to A3 are address bits adjacent to each other.

In FIG. 15, the first column decoder 15 (predecoder) includes AND circuits AG0 to AG3 for generating a first predecoded signal of 4 bits FP0 to FP3 from the address signal bits A0, *A0, and A1, *A1, and AND circuits AG4 to AG7 for generating a first predecoded signal of 4 bits FQ0 to FQ3 from the address signal bits A2, *A2 and A3, *A3. These first predecoded signals FP0 to FP3 and FQ0 to FQ3 correspond to predecode signals in a predecoder used in a conventional semiconductor memory device. The AND circuit AG0 receives the bits *A1 and *A0. The AND circuit AG1 receives the address bits *A1 and A0. The AND circuit AG2 receives the address bits A1 and *A0. The AND circuit AG3 receives the address bits A0 and A1. The AND circuit AG4 receives the address bits *A2 and *A3. The AND circuit AG5 receives the address bits *A2 and A3. The AND circuit AG 6 receives the address bits A2 and *A3. The AND circuit AG7 receives the address bits A2 and A3.

Predecoded signal bits P0 to P3 and Q0 to Q3 are generated from the first predecoded signal bits FP0 to FP3 and FQ0 to FQ3 in the present invention.

The first predecoded signal bit FP0 is supplied to the inverter circuit I0 and the NAND circuit NG3, and also to the NAND circuit NG14. The first predecoded signal bit FP1 is supplied to the NAND circuit NG0, the inverter circuit I1 and the NAND circuit NG4. The bit FP2 is supplied to the inverter circuit I2, the NAND circuit NG1, and the NAND circuit NG5. The bit FP3 is supplied to the inverter circuit I3, the NAND circuit NG2, and also to the NAND circuits NG13 and NG15.

The bit FQ0 is supplied to the inverter circuit I4 and also to the NAND circuit NG13. The bit FQ2 is supplied to the inverter circuit I5, the NAND circuit NG10 and the NAND circuit NG14. The bit FQ2 is supplied to the inverter circuit I6, the NAND circuits NG11 and NG15. The bit FQ3 is supplied to the inverter circuit I7 and the NAND circuit NG12. The ground potential GND is also supplied to the NAND circuits NG10, NG11, and NG12.

The address bit *A2 is commonly supplied to the NAND circuits NG3, NG4 and NG5. The address bit A2 is also supplied to the NAND circuits NG0, NG1 and NG2.

The NAND circuit NG6 for generating the bit P0 receives the output of the inverter circuit I0 and the output of the NAND circuit NG0. The NAND circuit NG7 for generating the bit P1 receives the outputs of the NAND circuit NG3, the NAND circuit NG1 and the inverter circuit I1. The NAND circuit NG8 for generating the bit P2 receives the outputs of the inverter circuit I2, the NAND circuit NG4, and the NAND circuit NG2. The NAND circuit NG9 for generating the bit P3 receives the outputs of the NAND circuit NG5 and the inverter circuit I3.

The NAND circuit NG16 for generating the bit Q0 receives the outputs of the inverter circuit I4 and the NAND circuit NG10. The NAND circuit NG17 for generating the bit Q1 receives the outputs of the NAND circuit NG13, the NAND circuit NG11 and the inverter circuit I5. The NAND circuit NG18 for generating the bit Q2 receives the outputs of the inverter circuit I6, the NAND circuit NG14 and the NAND circuit NG12. The NAND circuit NG19 for generating the bit Q3 receives the outputs of the NAND circuit NG15 and the inverter circuit I7.

In the structure of the predecoder shown in FIG. 15, a plurality of columns (2 columns) can be selected at the same time by decoding an address signal of a plurality of adjacent bits of and bringing to the active state a plurality of successively adjacent of bits which in either one of the groups of the predecoded signal P0 to P3 for specifying an element number and the predecoded signal Q0 to Q3 for specifying a group number. The operation of the predecoder shown in FIG. 15 will now be described.

Figure 8:
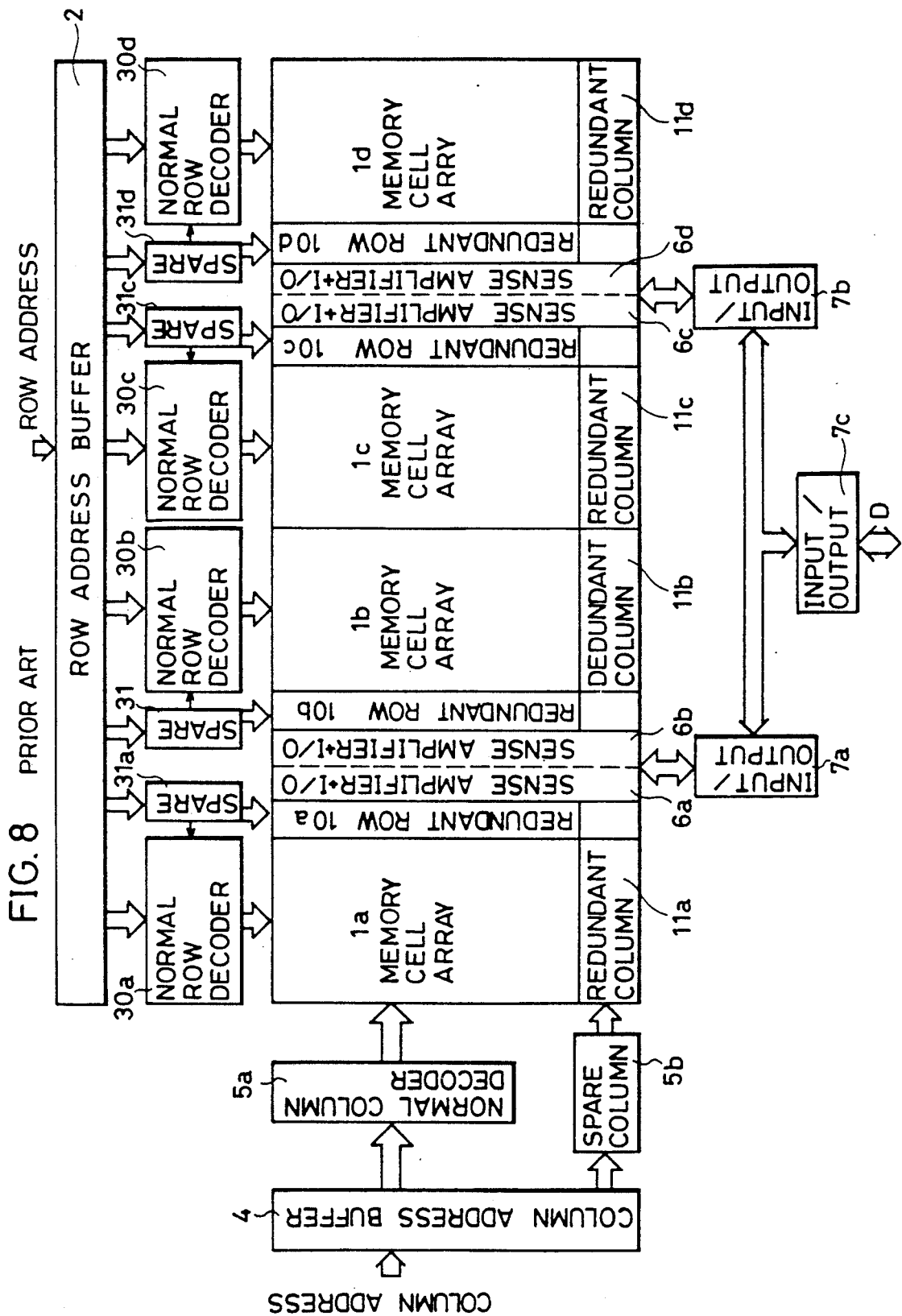
FIG. 8 is a diagram showing still another example of a structure of a conventional semiconductor memory device.
Figure 16:
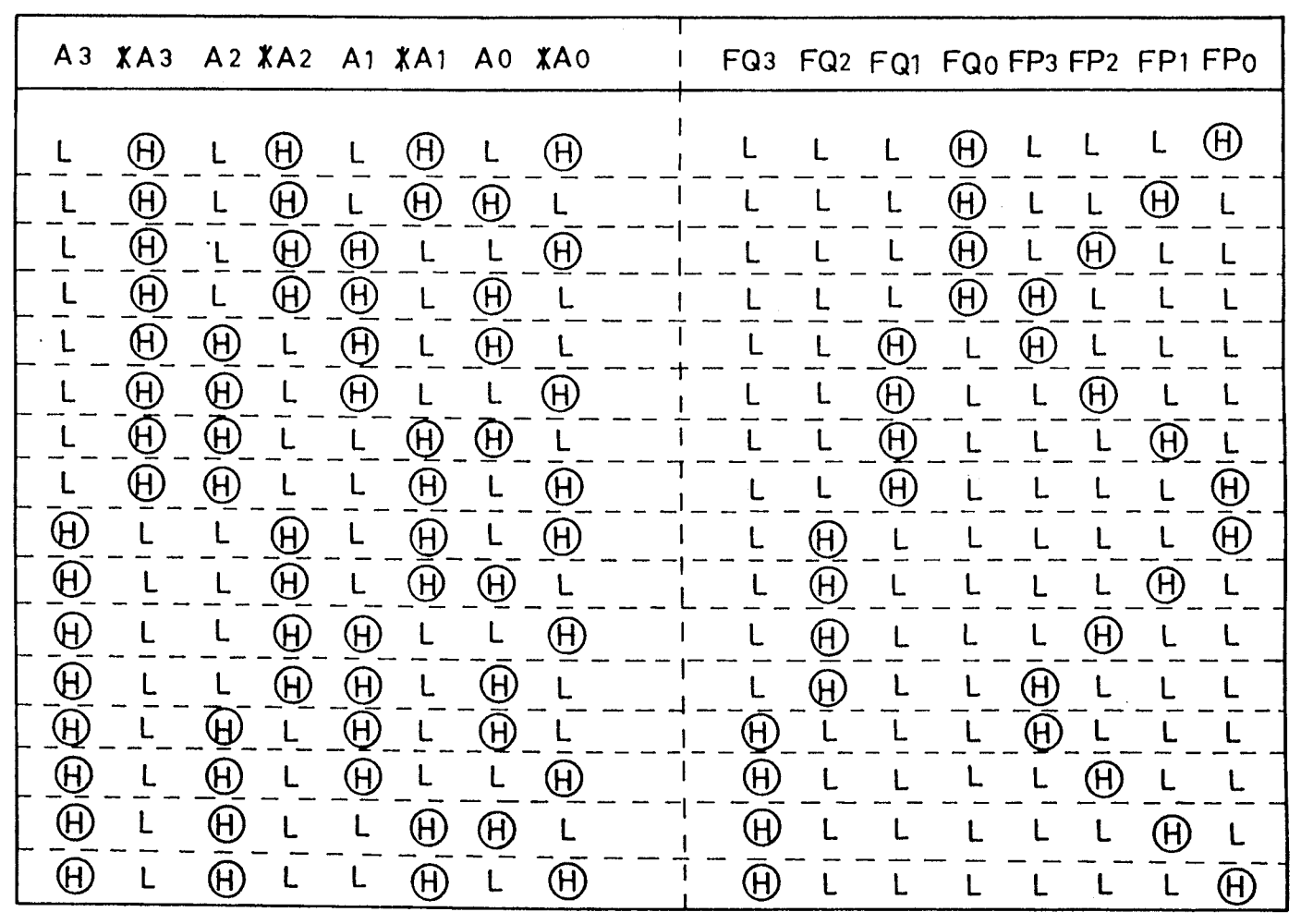

Each of the AND circuits AG0 to AG7 generates a signal in the active state when the both inputs are in the active state of "H". When the address signal of 4 bits A0 to A3 and its complementary address signal of 4 bits *A0 to *A3 are provided, the first predecoded signals FP0 to FP3 and FQ0 to FQ3 are generated by the AND circuits AG0 to AG7. The decoding operation in these AND circuits AG0 to AG7 is the same as the operation of the predecoder which has been conventionally used. That is, the first predecoded signal FQ0 to FQ3 selects one group and another first predecoded signal FP0 to FP3 designates one element. FIG. 16 shows in a table the corresponding relationships between the first predecoded signal bits FP0 to FP3 and FQ0 to FQ3 and the bits of the applied address signals A0 to A3 and *A0 to *A3. In FIG. 16, "L" indicates the inactive state, that is, an output state of an "L" level, and "H" indicates the active state, that is, an "H" level. As is seen from FIG. 8, one AND circuit among the AND circuits AG0 to AG3 and one AND circuit among the AND circuits AG4 to AG7 are selected in accordance with the combination of the input address signal bits A0 to A3 and *A0 to *A3. As a result, one of the bits FP0 to FP3 is brought to the active state and one of the bits FQ0 to FQ3 is brought to the active state.

The first predecoded signal bits FP0 to FP3 and FQ0 to FQ3 generated from the AND circuits AG0 to AG7 are supplied to the inverter circuits I0 to I7 and the NAND circuits NG0 to NG15. The inverter circuits invert the supplied signals. The NAND circuits supply a signal of "L" only when the both inputs are at "H".

The outputs of the inverter circuits I0 to I7 and the NAND circuits NG0 to NG5 and NG10 to NG15 are supplied to the NAND circuits NG6 to NG9 and NG16 to NG19 of the final stage. The predecoded signal bits P0 to P3 and Q0 to Q3 are generated from the NAND circuits NG6 to NG9 and NG16 to NG19 of the final stage. The operation when the bits of the first predecoded signal FQ0 and FP0 are in the active state of "H" will be described in the following.

At this time, the bits FP0, FQ0 and *A2 are in the active state of "H" and remaining first predecoded signal bits FP1 to FP3 and FQ1 to FQ3 and the address bit A2 are at "L". Only the inverter circuits I0 and I7 supply a signal of "L" among the inverter circuits I0 to I7, and the remaining inverter circuits supply a signal of "H".

As the address bit A2 is at "L", the NAND circuits NG0 to NG3 all supply a signal of "H". The NAND circuits NG10 to NG12 receives the ground voltage GND of "L" at one input of each of them, so that they all supply a signal of "H".

Among the NAND circuits NG3 to NG5, only the NAND circuit NG3 supplies a signal of "L" as the address bit *A2 is at "H" and the bit FP0 is at "H". The bit FP3 is at "L" and the bit FQ1 is at "L", so that the NAND circuits NG13 to NG15 all supply a signal of "H".

Among the NAND circuits NG6 to NG9 and NG16 to NG19 in the final stage, only the NAND circuits NG6, NG7, and NG16 supply a signal of "H", and all of the remaining supply a signal of "L". At this time, only the bits P0, P1 and Q0 in the predecoded signal bits P0 to P3 and Q0 to Q3 are brought to the active state of "H".

Figure 17:
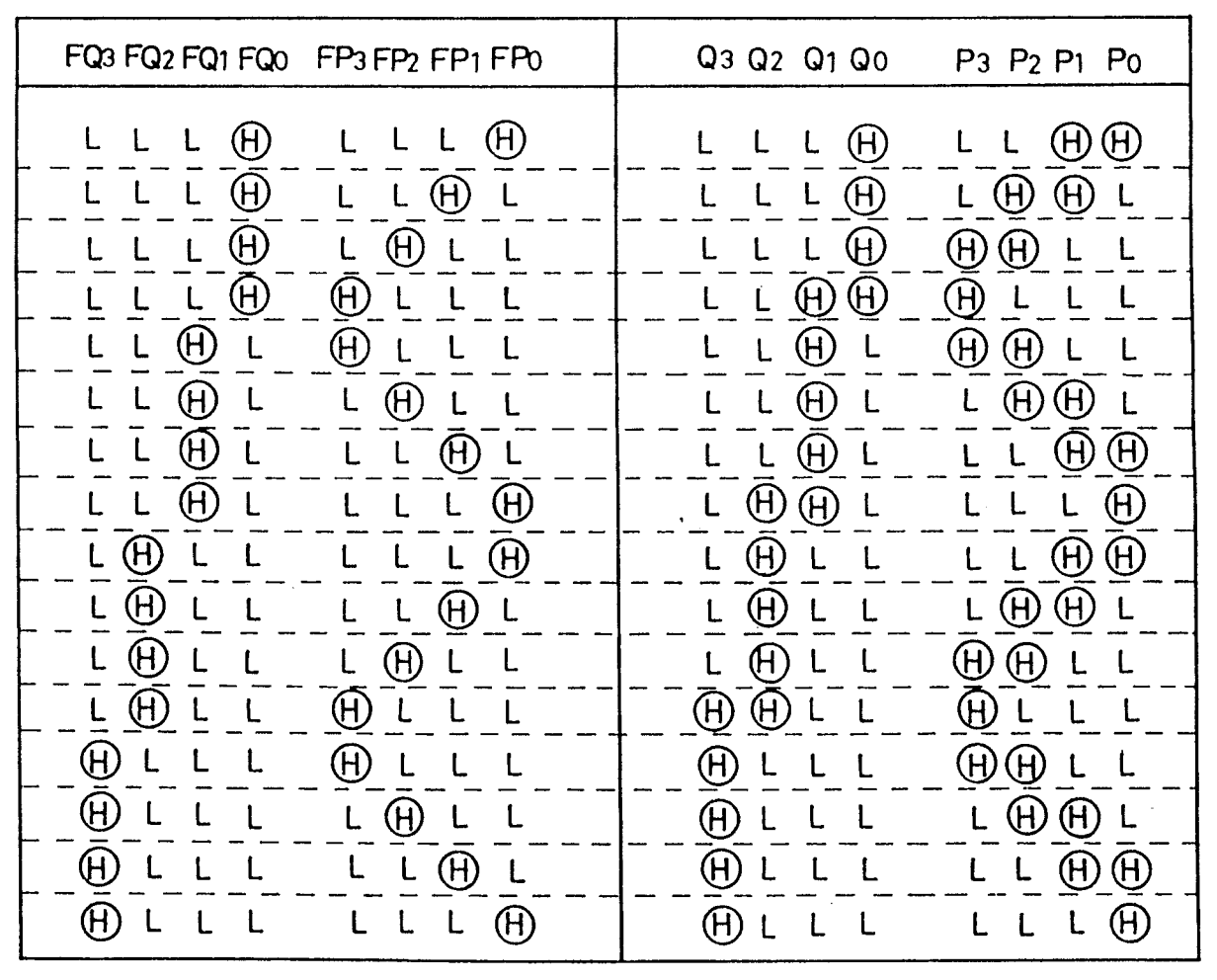

In the circuit structure of the predecoder shown in FIG. 15, the relationship of the first predecoded signal bits FP0 to FP3 and FQ0 to FQ3 and the predecoded signal bits P0 to P3 and Q0 to Q3 as shown in FIG. 17 can be obtained according to the same consideration.

As shown in FIG. 17, when adjacent bits of the predecoded signal bits P0 to P3 are brought to the active state, only 1 bit among the bits Q0 to Q3 is in the active state. When only 1 bit among the bits P0 to P3 is in active state, 2 adjacent bits among the bits Q0 to Q3 are in the active state.

The predecoded signals P0 to P3 and Q0 to Q3 obtained from the relationship shown in a table of FIG. 17 are the same as the predecoded signals P0 to P3 and Q0 to Q3 shown in FIG. 14. That is, the predecoded signals P0 to P3 and Q0 to Q3 can be generated for generating select signals for selecting two adjacent columns by using the predecoder circuit shown in FIG. 15.

While the predecode circuit as shown in FIG. 15 becomes somewhat larger in circuit scale compared with the structure of a conventional predecoder, one predecode circuit is sufficiently enough for a memory block having one decoder in a semiconductor memory device, so that the increase in layout area with the increase of the circuit scale is very small.

While the description is made as to a 4-bit to 16-bit decoder, that is, a decoder which selects two arbitrary adjacent bits among 16 bits in accordance with address bits of 4 bits in the circuit structure of the predecoder shown in FIG. 15, the above-mentioned predecoder can be applied in the case in which the number of bits is arbitrary continuously adjacent decoder circuits can be brought to the selected state for any address signal. That is, if the structure is made such that the decoder circuit is divided into groups, element numbers in the groups of the decoder circuit are provided, the sum of the number of bits which are brought to the active state in a group number specifying signal and an element number specifying signal is constant, and the predecoded signals are generated so that adjacent bits may be activated.

A circuit structure for generating the same predecoded signals is not necessarily limited to the circuit structure shown in FIG. 15.

Figure 18:
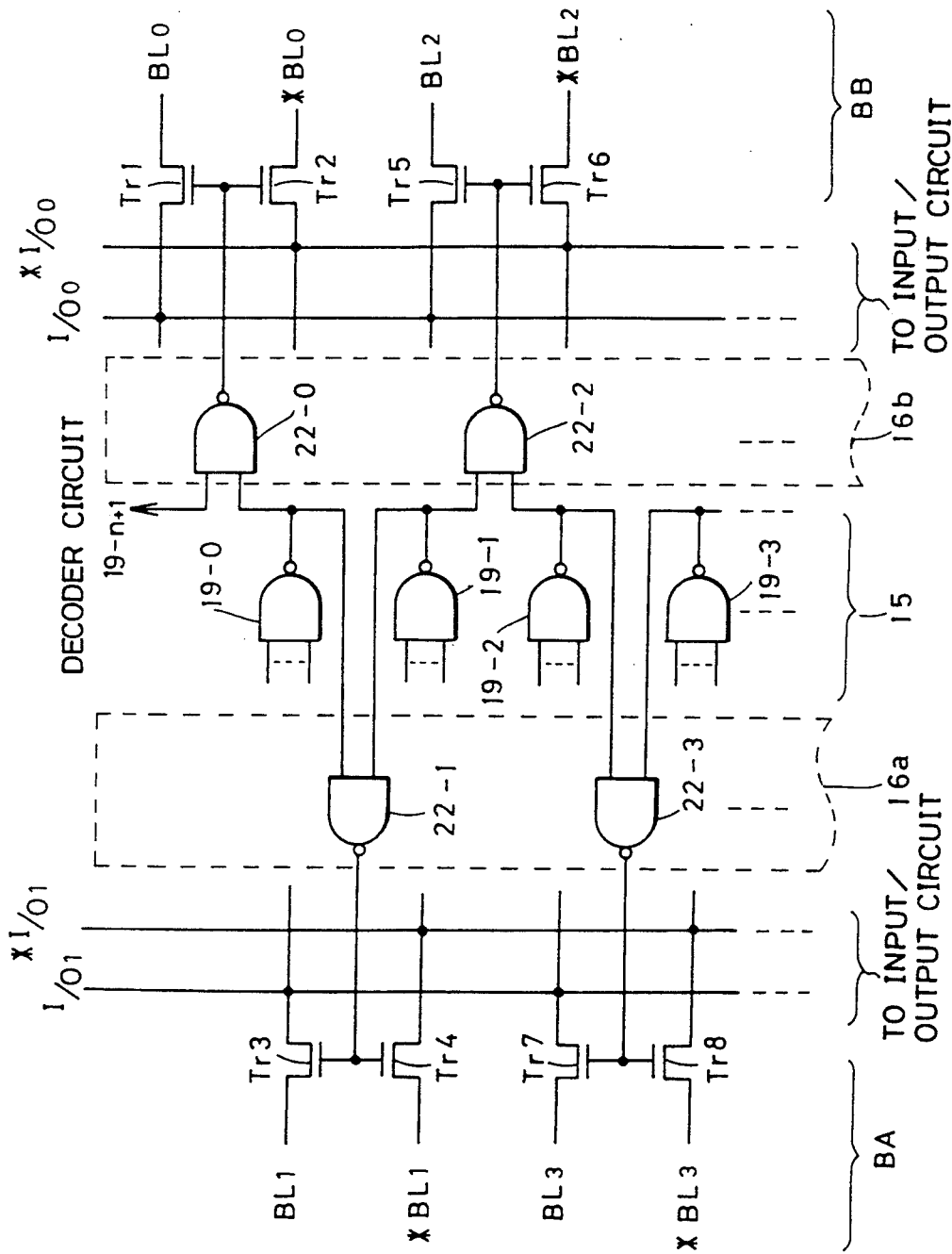
FIG. 18 is a diagram schematically showing structures of column selecting circuitry and memory cell blocks in still another embodiment of the semiconductor memory device shown in FIG. 9.

FIG. 18 is a diagram showing a structure of a portion related to a column selecting circuitry of a semiconductor memory device in accordance with still another embodiment of the present invention. In FIG. 18, the memory cell array is divided into two memory cell blocks BA and BB. Bit line pairs of odd number BL1, *BL1, . . . are arranged in the first memory cell block BA. Bit line pairs of even number BL0, *BL0, . . . are arranged in the second memory cell block BB.

Figure 3:
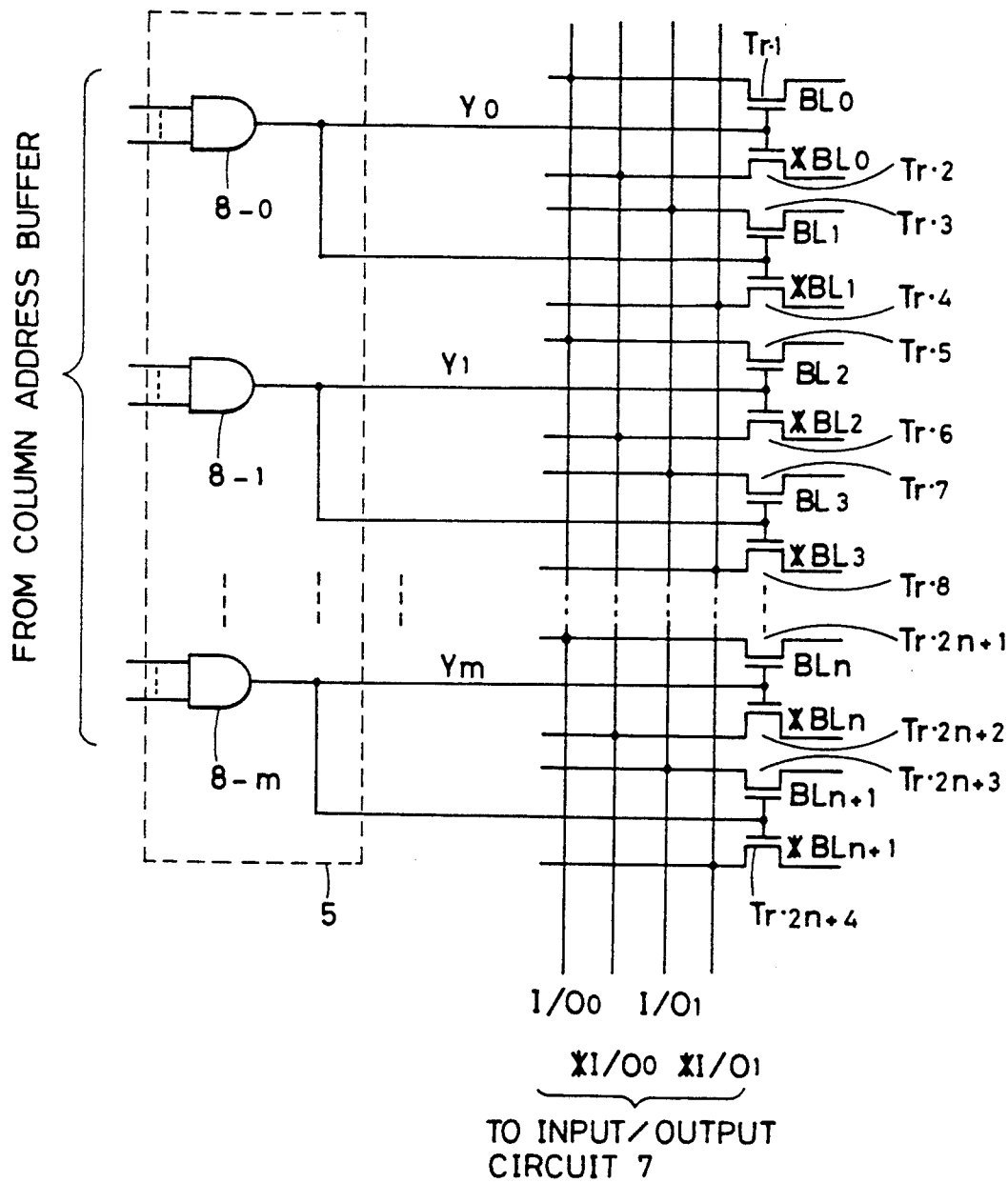
FIG. 3 is a diagram specifically showing one example of a structure of column selecting circuitry in the semiconductor memory device shown in FIG. 1.
Figure 4:
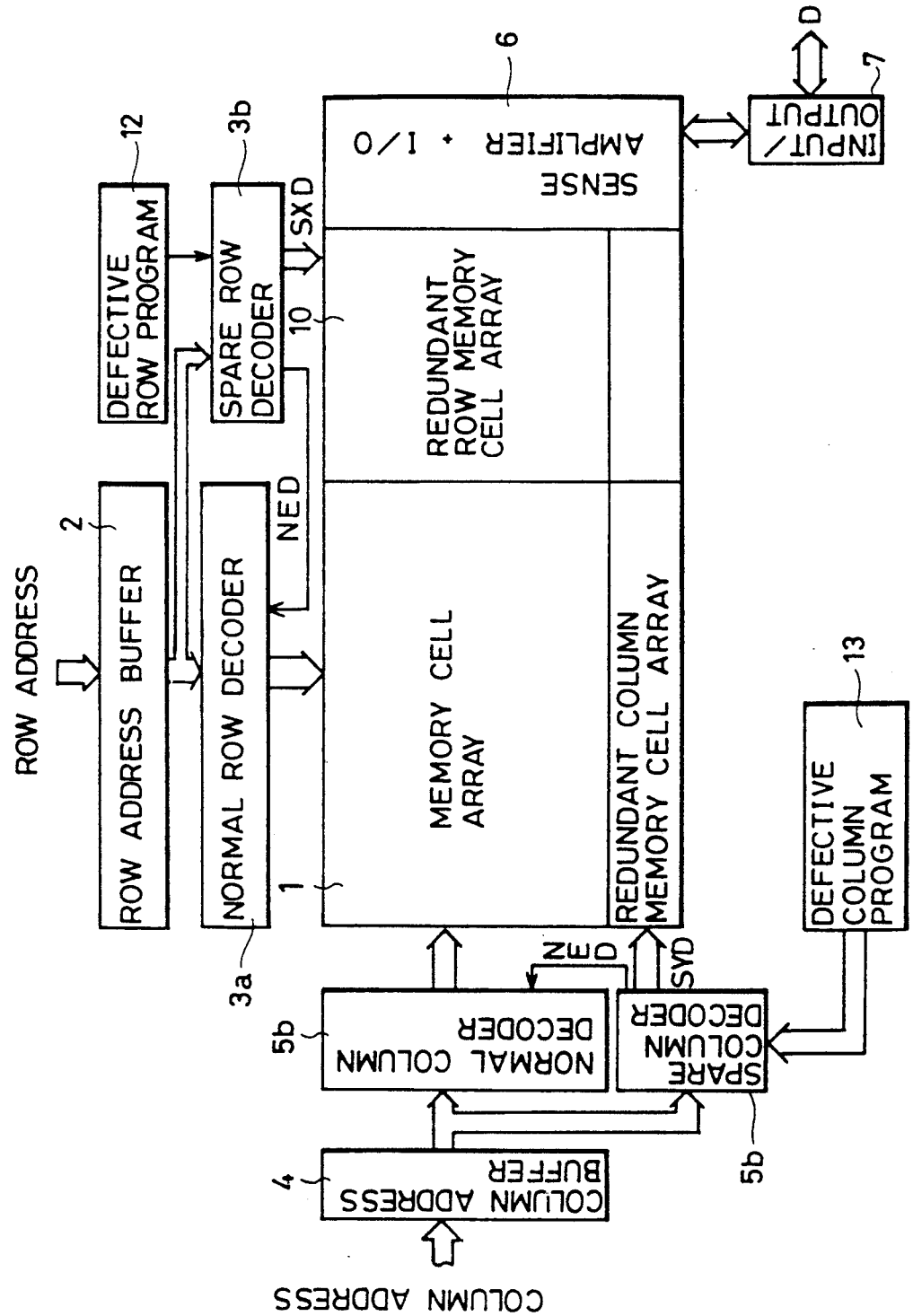
FIG. 4 is a diagram showing another example of a structure of a conventional semiconductor memory device.
Figure 5:
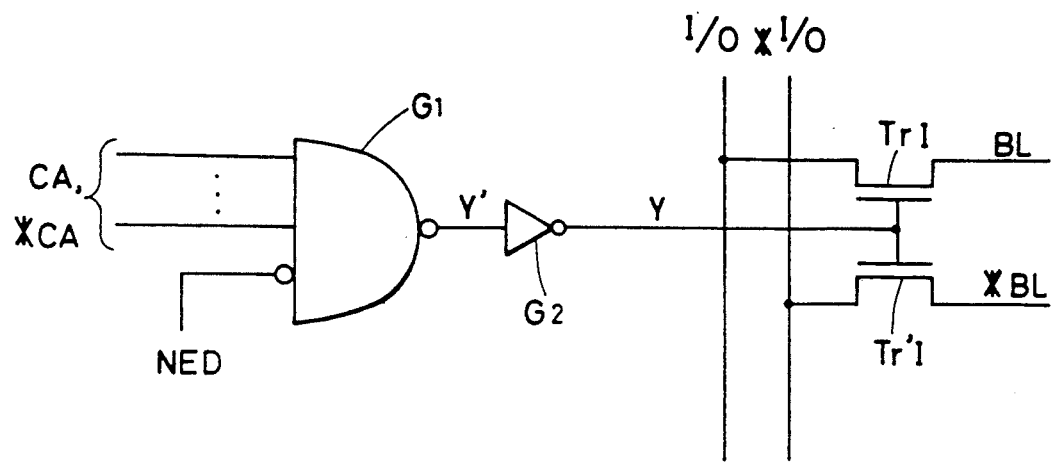
FIG. 5 is a diagram showing one example of a structure of a decoder circuit contained in a column decoder in the semiconductor memory device shown in FIG. 4.
Figure 6:
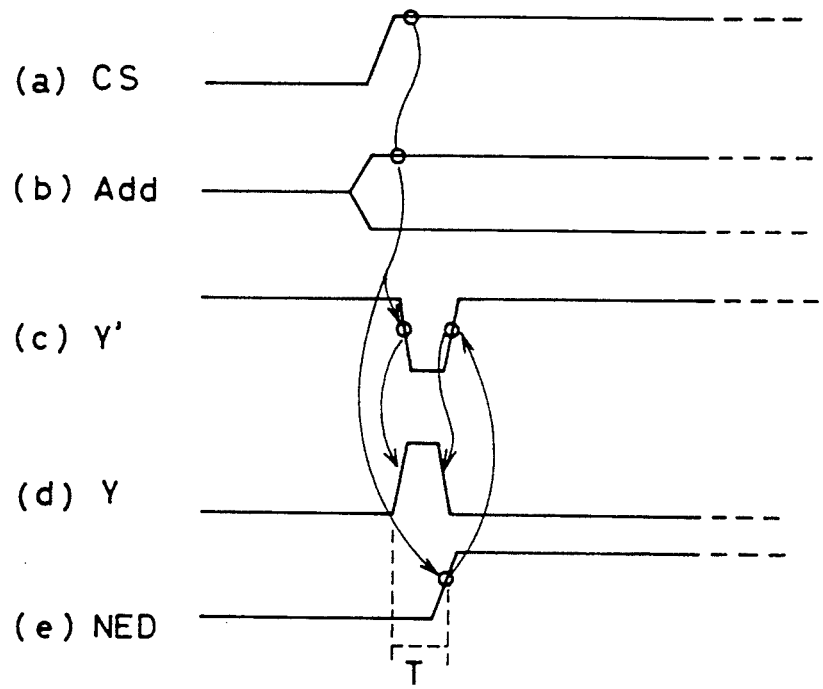
FIG. 6 is a signal waveform diagram showing the operation of the unit column decoder circuit shown in FIG. 5.
Figure 7:
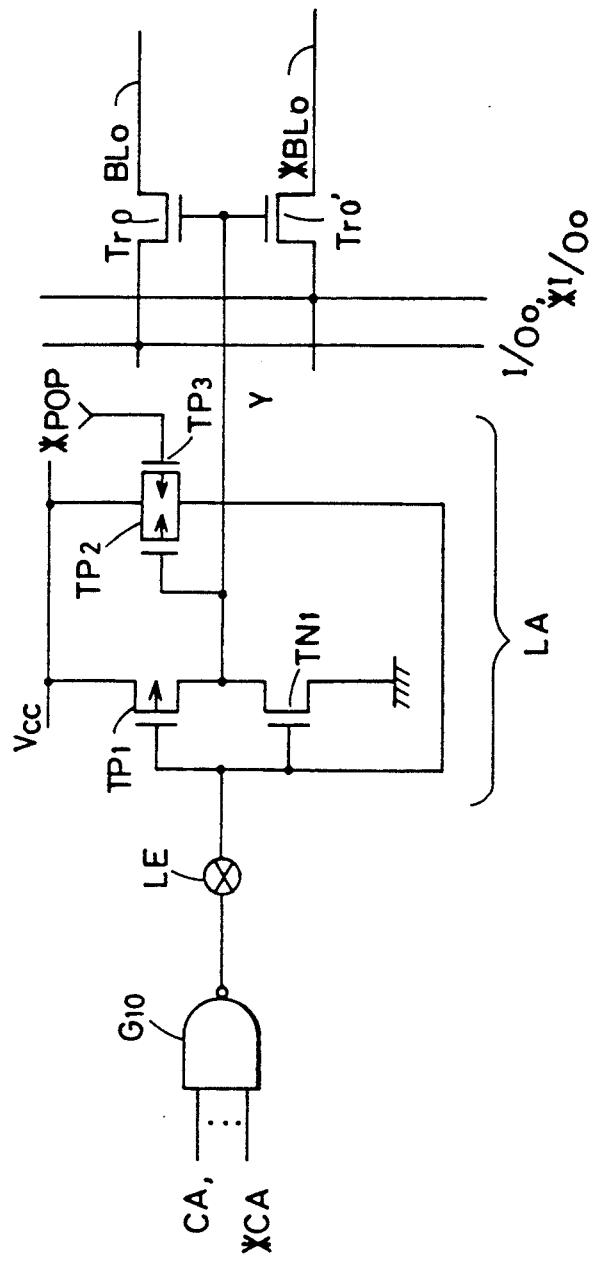
FIG. 7 is a diagram showing another example of a structure of a unit column decoder circuit output portion in a conventional semiconductor memory device.

A first column decoder 15 is provided common to the two memory cell blocks BA and BB. The first column decoder 15 includes NAND type decoder circuits 19-0 to 193, 3, . . . n or n+1 decoder circuits are provided in the first column decoder 15 similarly to the structures shown in FIGS. 2 to 4. In FIG. 10, however, only four decoder circuits 19-0 to 19-3 are representatively shown to simplify the figure.

One second column decoder 16a responsive to a decode signal from the first column decoder 15 for selecting one column therefrom is provided in the first memory cell block BA. The other second column decoder 16b is provided responsive to the output of the first column decoder 15 for selecting one column from the second memory cell block BB. The second column decoder 16a includes NAND circuits 2-1, 22-3, . . . provided corresponding to the bit line pairs BL1, *BL1, BL3, *BL3, . . . of the first memory cell block BA.

Similarly, the other second column decoder 16b includes NAND circuits 22-0, 22-2, . . . provided corresponding to the bit line pairs BL0, *BL0, BL2, *BL2, respectively . . . in the second memory cell block BB. Each of the NAND circuits 22-0 to 22-3 is provided to receive the outputs of two decoder circuits. While it is not shown specifically in the structure shown in FIG. 18, the NAND circuit 22-0 receives the output of the decoder circuit 19-n+1 at its one input. Where there is no need to form such a loop, one input of the NAND circuit 22-0 is connected to receive the power supply potential Vcc.

In accordance with the structure shown in FIG. 18, when the decoder circuit 19-0 is selected, the outputs of NAND circuits 22-0 and 22-1 respectively attain "H" and the bit line pairs BL0, *BL0, BL1, *BL1 are selected. When the decoder circuit 19-1 is selected, the outputs of the NAND circuits 22-1 and 22-2 both attain "H", and the bit line pairs BL1, *BL1, and BL2, *BL2 are selected.

The selected bit line pairs of the memory cell block BA are connected to the internal data transmission line pair I/O1, *I/O1. The selected bit line pairs of the memory cell block BB are connected to the internal data transmission line pairs I/O0, *I/O0.

Accordingly, in the structure shown in FIG. 18, when one column is selected from each of the memory cell blocks BA and BB, there may be two different combinations of memory cells of 2 bits which are selected simultaneously. As in the structure shown in FIG. 18, if the memory cell array is divided into two blocks, it will be possible to simultaneously select an arbitrary combination of bit line pairs from different memory cell blocks not to simultaneously select physically adjacent bit line pairs in a common memory cell array.

In the structure of the decoding system as shown in FIG. 18, the same bit line selection can be effected when the select signals SP0 to SP16 from the decoder shown in FIG. 13 are divided into groups of even numbers and odd numbers, and distributed to the blocks BB and BA.

In all the above-mentioned embodiments, the column selecting circuitry selects physically adjacent bit line pairs. These simultaneously selected bit line pairs, however, need not particularly be physically adjacent bit line pairs and may be arbitrary, and if the inputs of the NAND circuits contained in the second column decoder are connected to every other decoder circuits, every other bit line pairs can be simultaneously selected. This is the same in the structure of the decoder circuit shown in FIG. 15, and arbitrary combinations of select signals among the select signals SP0 to SP16 can be simultaneously brought to the active state.

While memory cells of 2 bits or 3 bits are simultaneously selected in each of the above-mentioned embodiments, when memory cells of n bits are simultaneously selected, the NAND circuit contained in the second column decoder may have n inputs, and when the outputs of n different decoder circuits are connected to each input thereof, memory cells of n bits can be simultaneously selected. In this case, one input of each of the NAND circuits located on the both end sides may be connected to the power supply potential Vcc. In this case, simply, column selection in a loop is not conducted. This is the same in the case of the decoder shown in FIG. 15. The structure may be adapted such that the predecoded signals simultaneously bring the n bits to the selected state. In such a structure, one group contains $2^n$ bits and the number of bits which are in the active state in the predecoded signals P and Q (Q0 to Q3) becomes n+1.

While the operation of the column selecting circuitry was described in the description above, this structure may be also applied to the operation of the row selecting circuitry.

Figure 19:
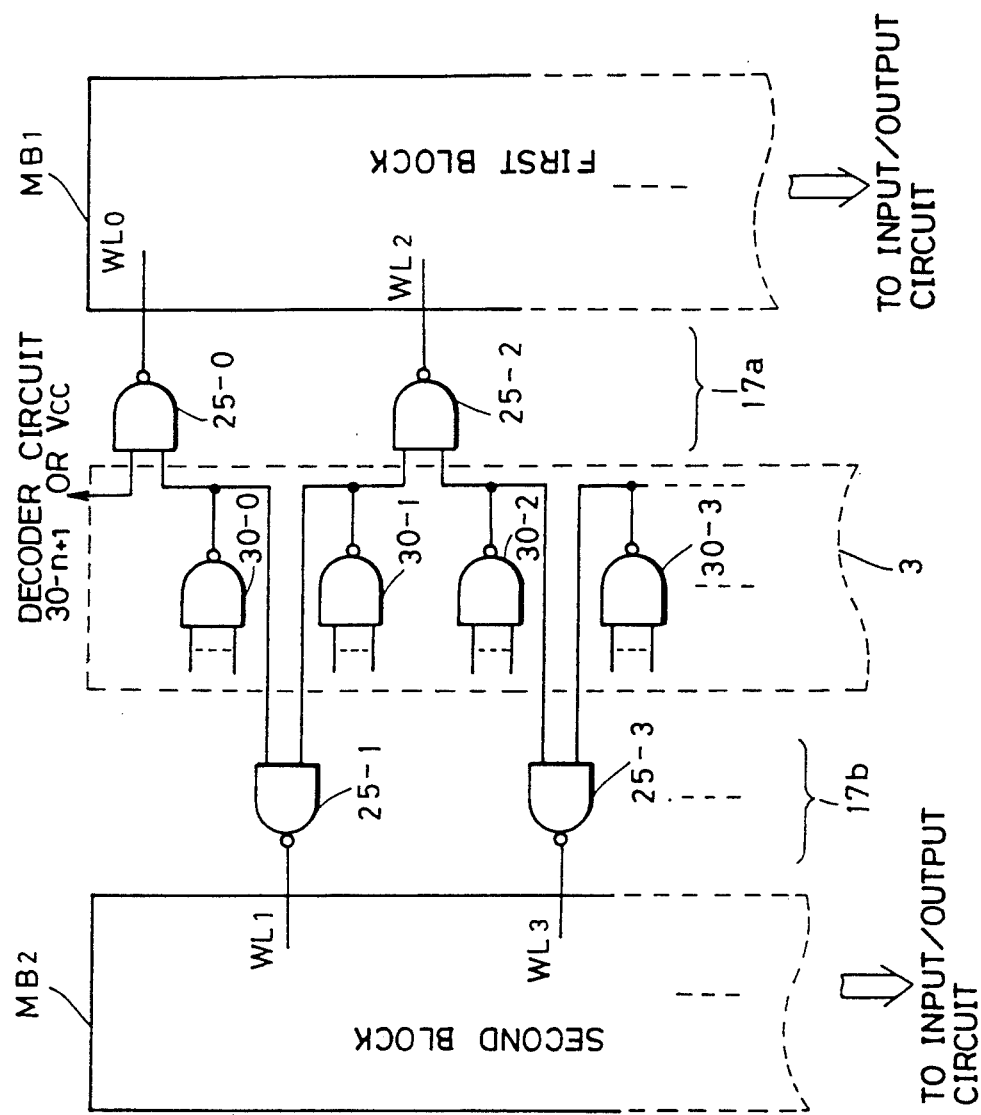
FIG. 19 is a diagram specifically showing a structure of row selecting circuitry in a semiconductor memory device in accordance with a second aspect of the invention.

FIG. 19 is a diagram showing a structure of still another embodiment of a semiconductor memory device in accordance with the present invention. In FIG. 19, a circuit portion related to row selection is only representatively shown and the column selecting circuitry is omitted. In FIG. 19, the memory cell array is divided into two memory cell blocks MB1 and MB2. Word lines of even numbers WL0, WL2, . . . are arranged in the first memory cell block MB1 and word lines of odd numbers WL1, WL3, . . . are arranged in the second memory cell block MB2.

A first word driver 17a is provided for the first memory cell block MB1 and a second word driver 17b is provided for the second memory cell block MB2. The first word driver 17a includes 2-input NAND circuits 25-0, 25-2, . . . provided corresponding to each of the word lines in the first memory cell block MB1.

The second word driver 17b includes 2-input NAND circuits 25-1, 25-3, . . . provided corresponding to each word line in the second memory cell block MB2.

A row decoder 3 is provided commonly for two memory cell blocks MB1 and MB2 for driving the word drivers 17a and 17b in response to an external row address. The row decoder 3 includes NAND type decoder circuits 30-0, 30-1, 30-2, 30-3, . . .

The word drivers 17a and 17b includes 2-input NAND circuits provided corresponding to the word lines contained correspondingly in the first and second memory blocks MB1 and MB2. In FIG. 19, however, four decoder circuits 30-0 to 30-3 and four 2-input NAND circuits 25-0 to 25-3 are only representatively shown in order to simplify the figure.

The output of the decoder circuit 30-0 is supplied to one input of each of the two NAND circuits 25-0 and 25-1. The output of the decoder circuit 30-1 is supplied to the other input of the NAND circuit 25-1 and one input of the NAND circuit 25-2. The output of a decoder circuit 30-i (i=1 to m; m is the number of word lines contained in one memory cell block) is supplied to the NAND circuits 25-i and 25-i+1. The other input of the NAND circuit 25-0 is connected to the output of a decoder circuit 30-m+1 (not shown) or to the power supply potential Vcc. To which it is connected depends on whether the simultaneously selected word lines form a loop or not.

In the structure shown in FIG. 19, for example, if the decoder circuit 30-0 is selected, the outputs of the NAND circuits 25-0 and 25-1 attain "H", and the word line WL0 in the first memory cell block MB1 and the word line W11 in the second memory cell block MB2 are selected. If the decoder circuit 30-1 is selected, the word line WL2 in the first memory cell block MB1 and the word line WL1 in the second memory cell block MB2 are selected by the NAND circuits 25-1 and 25-2.

In the structure shown in FIG. 19, a common word line can be selected in accordance with different external row addresses in a duplicated way, so that an arbitrary combination of two word lines respectively from the memory cell blocks can be simultaneously selected. Therefore, for example, if the first and second memory cell blocks MB1 and MB2 store picture data, respectively, data of different rows or the same row different pictures can be simultaneously read and processed.

In a conventional semiconductor memory device, when a row decoder is commonly provided for each array block in a memory cell array of a divided block dividing scheme, a word line of the same address is selected from each of the divided memory cell blocks and a combination of word lines selected in accordance with an external row address is uniquely determined. However, if a structure of a word line selection circuit including a row decoder and a word driver as shown in FIG. 19 is employed, combinations of word lines selected simultaneously from each of the memory cell blocks can be desirably set. In this case, the 2-input NAND circuit contained in the word driver need not receive the output of an adjacent decoder circuit and as far as a condition is satisfied that all the word lines can be selected in accordance with external row addresses, the structure may be adapted to have the outputs of decoder circuits of an arbitrary combination supplied to a 2-input NAND circuit of a word driver.

It is apparent that the row decoder 3 and the word drivers 17a and 17b shown in FIG. 19 may be replaced with the structure of the predecoder circuit and the decoder circuit shown in FIGS. 13 and 15. In this case, the select signals of even number select word lines of the first memory cell block MB1 and the select signals of odd number select the word lines of the second memory cell block MB2. Also, at this time, the select signals may be generated for selecting an arbitrary combination of word lines of the first memory cell block MB1 and the second memory cell block MB2.

There may be provided a functional circuit for effecting a predetermined function in place of memory cells of one column or one row as shown in the above-mentioned embodiment, as a subsequent stage circuit selected by the output of the decoder in a duplicated way. For example, as shown in FIG. 20, a monitor system is considered including n sensors SE1 to SEn each for effecting a predetermined function as a subsequent stage circuit.

Figure 20:
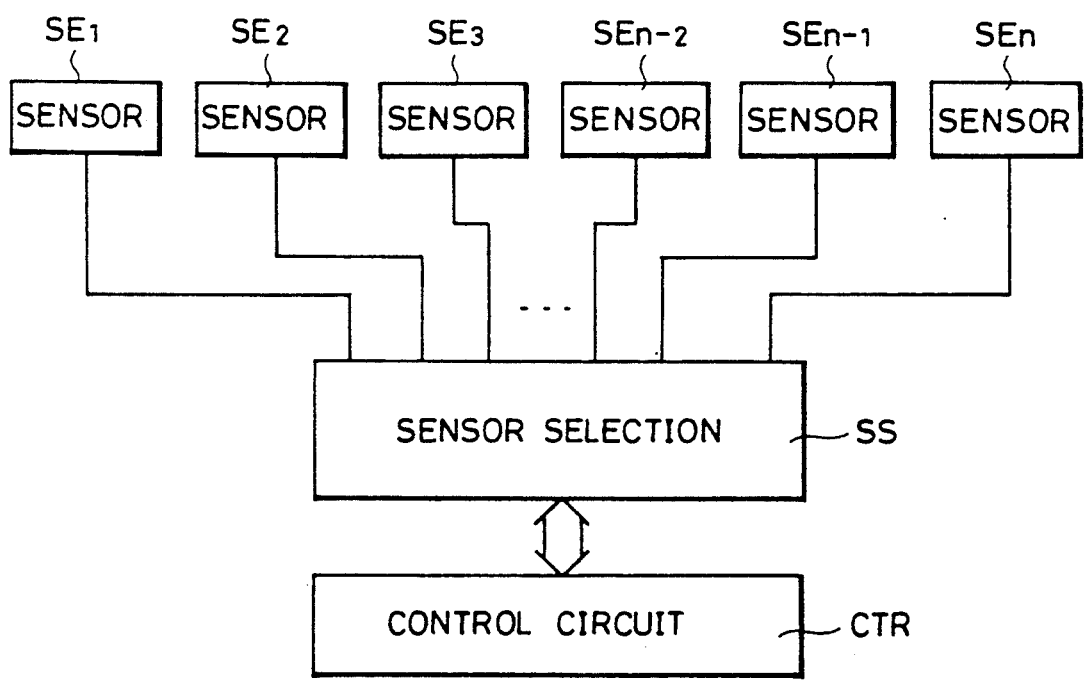
FIG. 20 is a diagram showing another example of a structure of a semiconductor circuit device in accordance with the second aspect.

In the monitor system shown in FIG. 20, the state of the operation of a device to be controlled (not shown) is monitored by the outputs of the sensors SE1 to SEn. Selection of the sensors SE1 to SEn is performed by a sensor selection circuit SS. Suppose that the bit width of a sensor select signal from a control circuit CTR is 4 bits and 64 sensors are provided. The sensor selection circuit SS decodes the sensor select signal of 4 bits from the control circuit CTR and selects corresponding sensors.

In this case, when the combination of sensors simultaneously selected by the sensor select signal is uniquely determined and there arises a need for comparing the outputs of different combinations of sensors, the sensor select signal must be supplied twice. In such a case, if a decoding system such as in the present invention is applied in the sensor selection circuit SS, the outputs of arbitrary combination of sensors can be monitored by one time access and detection of an abnormality in the operating state of the device to be controlled and location of the abnormal point can be effected at high speed.

When the duplicated row/column selecting scheme shown in FIG. 9 is employed, a defective bit can be repaired without specially providing a redundant row/column in a semiconductor memory device. A defective bit repairing scheme using the duplicated row/column selecting scheme in accordance with the present invention will be described in the following.

Figure 21:
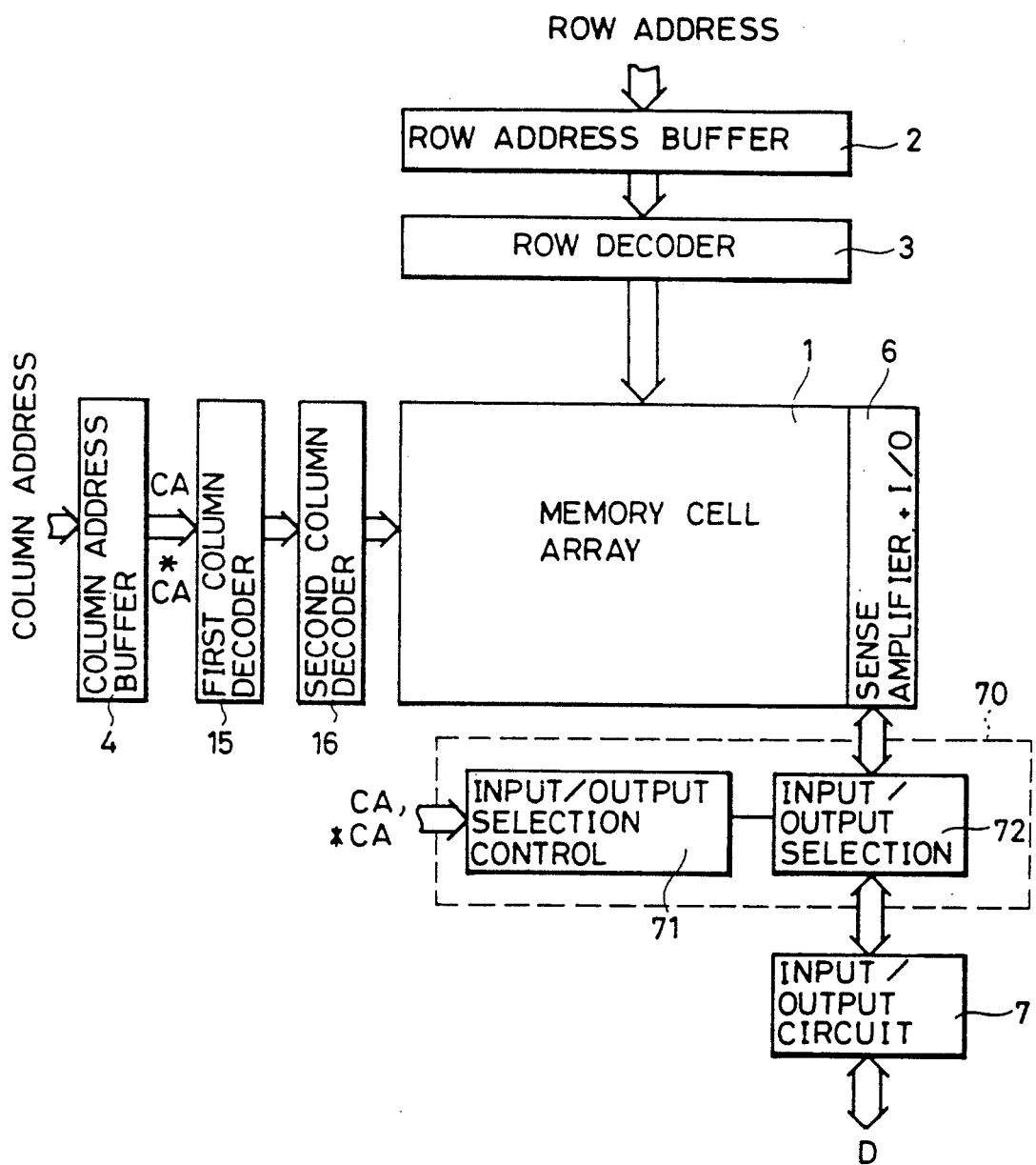
FIG. 21 is a diagram showing one example of a whole structure of a semiconductor memory device in accordance with a third aspect of the invention.

FIG. 21 is a diagram showing one example of a whole structure of a semiconductor memory device in accordance with another aspect of the invention. In FIG. 21, the semiconductor memory device includes an I/O selection control block 70 provided between the (sense amplifier+I/O) block 6 and the input/output circuit 7 in addition to the structure shown in FIG. 9. The I/O selection control block 70 further selects a column among columns in the memory cell array 1 selected by the second column decoder 16 depending on whether the column address is even or odd.

The memory cell array 1 includes an array of memory cells arranged in a matrix having rows and columns. The memory cell array 1 includes a redundant column whose position is not fixed.

The I/O selection control block 70 includes an input/output selection control circuit 71 for receiving an internal column address CA, *CA, comparing a defective column address stored therein and the applied internal column address and generating a control signal in accordance with the result of the comparison, and an input/output selection circuit 72 responsive to the selection control signal from the input/output selection control circuit 71 for further selecting at least one column from the plurality of columns selected by the second column decoder 16.

The selecting manner in which the input/output selection circuit 72 further selects from the plurality of columns selected by the second column decoder is determined in response to the control signal from the input/output selection control circuit 71. The selecting manner of the input/output selection circuit 72 is determined so that a column including a defective bit can not be selected in any case. In this way, when a defective column in the memory cell array 1 is selected by the internal column address CA, *CA, not this defective column but another column is connected to the input/output circuit 7, so that the defective column is repaired.

When the structure as shown in FIG. 21 is employed, while the circuit for programming a defective column address is required, there will be no need to provide a fuse in an output stage of each column decoder circuit in order to bring the defective column to a non-selected state, and it will become possible to completely repair a defective bit even if the bit line pitch becomes smaller. In accordance with the structure shown in FIG. 21, no spare column decoder is used, so that there is no need to bring the normal column decoder to the inactive state at the time of selecting a spare column decoder and it will be possible to perform a column selecting operation at high speed. The structure of the semiconductor memory device shown in FIG. 21 will be specifically described in the following with reference to the drawings.

Figure 22:
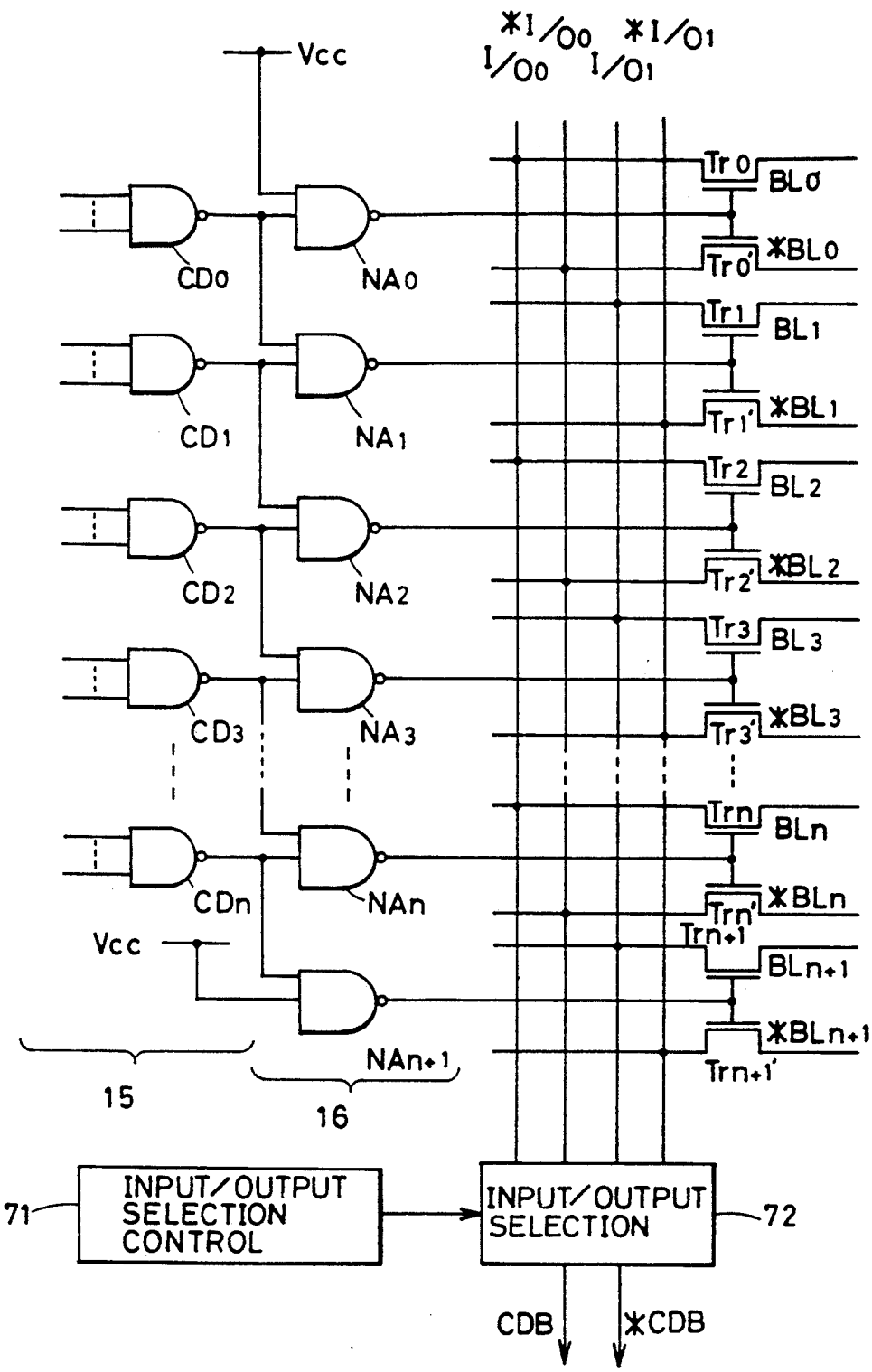
FIG. 22 is a diagram schematically showing a structure of column selecting circuitry in the semiconductor memory device shown in FIG. 16.

FIG. 22 is a diagram showing one example of a specific structure of the column selecting circuitry in the semiconductor memory device shown in FIG. 21. In FIG. 22, the first column decoder 15 includes NAND type unit decoder circuits CD0 to CDn. A predetermined different combination of bits of an internal column address signal is transmitted to each of the decoder circuits CD0 to CDn.

The second column decoder 16 includes 2-input NAND circuits NA0 to NAn+1. The NAND circuits NA0 to NAn+1 respectively constitute a unit column selection circuit. The NAND circuit NA0 receives the power supply potential Vcc at its one input, and receives the output of the unit decoder circuit CD0 at the other input. The NAND circuit NAn+1 receives the power supply potential Vcc at its one input and receives the output of the unit decoder circuit CDn at the other input. Remaining NAND circuits NAi (i=1 to n) receive the outputs of the unit decoder circuits CDi and CDi-1. Two pairs of bit lines are thereby selected in response to one column address.

Each of the NAND circuits NA0 to NAn+1 is provided corresponding to the bit line pairs BL0, *BL0 to BLn+1, *BLn+1. The outputs of the NAND circuits NA0 to NAn+1 are respectively transmitted to the gates of the I/O gate transistors Tr0, Tr0, to Trn+1, Trn+1' provided correspondingly to each bit line pair.

The two pairs of bit lines simultaneously selected in accordance with the internal column address are connected to the internal data transmission line pairs I/O0, *I/O1, and I/O1, *I/O1 at the same time. The bit line pairs of even number BL0, *BL0, . . . are connected to the internal data transmission line pair I/O0, *I/O0. The bit line pairs of odd number BL1, *BL1, . . . are connected to the internal data transmission line pair I/O1, *I/O0.

The input/output selection circuit 72 selects either one pair of the two internal data transmission line pairs I/O0, *I/O0 and I/O1, *I/O1 and connects the same to the common data bus CDB, *CDB in response to the control signal from the input/output selection control circuit 71. The common data bus CDB, *CDB is connected to an external input/output pin terminal (not shown) through the input/output circuit 7.

The input/output selection control circuit 71, through not clearly shown, includes a defective column program circuit for storing a column address indicating a defecting column. The program of this defective column address is executed, for example, blowing off a fuse. If there is no defective column, the input/output selection control circuit 71 controls the selecting operation of the input/output selection circuit 72 and connects the internal data transmission line pair I/O0, *I/O0 to the common data bus CDB, *CDB when an external column address designates a column of even number.

If there is no defective column and an external column address designates a column of odd number (bit line pair), the input/output selection control circuit 71 controls the selecting operation of the input/output selection circuit 72 and connects the internal data transmission line pair I/O1, *I/O1 to the common data bus CDB, *CDB.

Now, suppose that there is a defective column. In this case, the input/output selection control circuit 71 compares a received external column address and the defective column address programmed therein. If the external column address is smaller than the defective column address, the selecting operation of the input/output selection circuit 72 is controlled so that the same operation may be conducted as when there is no defective column as described above.

If the external column address is equal to or larger than the defective column address, the input/output selection control circuit 71 generates a control signal and changes the selecting operation of the input/output selection circuit 72. That is, if there is a defective column, the following operation is conducted when a column address smaller than this defective column address (an address higher in the address space than the defective column address) is supplied. When the external column address designates a column of even number, the internal data transmission line pair I/O0, *I/O0 is connected to the common data bus CDB, *CDB. When the external column address designates a column of odd number (bit line pair), the internal data transmission line pair I/O1, *I/O1 is connected to the common data bus CDB, *CDB.

In the address space where an external column address is equal to or larger than the defective column address (that is, an address space lower than the defective column address), when the external column address designates a column of even number (bit line pair), the internal data transmission line pair I/O1, *I/O1 is connected to the common data bus CDB, *CDB. When the external column address designates a bit line pair of odd number (column), the internal data transmission line pair I/O0, *I/O0 is connected to the common data bus CDB, *CDB.

The designation of a column of even number (bit line pair) and a column of odd number (bit line pair) is determined depending, for example, the least significant bit of the internal column address.

In accordance with the structure described above, data (or column) of 2 bits is selected by the second column decoder 16 in any case and a selecting operation of 1 bit from the data of 2 bits selected by the second column decoder 16 is further performed so that a defective column should not be selected in the input/output selection circuit 72.

A column selecting operation in the input/output selection circuit 72 will now be specifically described. Suppose that the bit line pair BL3, *BL3 is a defective column. When an external column address selects any one of the decoder circuits CD0 to CD2, the external column address is smaller than the address of the bit line pair BL3, *BL3. The decoder circuits CD0 to CDn are provided respectively corresponding to the bit line pairs. Accordingly, when any of the decoder circuits CD0 and CD2 is selected, the internal data transmission line pair I/O0, *I/O0 is selected by the input/output selection circuit 72 while the internal data transmission line pair I/O1, *I/O1 is selected by the input/output selection circuit 72 when the decoder circuit CD1 is selected.

Suppose that the decoder circuit CD3 is selected by the external column address. In this case, the bit line pairs BL, *BL3 and BL4, *BL4 are brought to the selected state. The bit line pair BL3, *BL3 is a defective column and is a bit line pair to be brought to the non-selected state. At this time, the input/output selection control circuit 71 gives the input/output selection circuit 72 an instruction to change the selecting manner. The input/output selection circuit 72 selects the internal data transmission line pair I/O0, *I/O0 and connects the same to the common data bus CDB, *CDB in response to this selecting manner change instruction. When a bit line pair of even number is designated, the internal data transmission line pair I/O1, *I/O1 is selected until the decoder circuit CDn is selected. When a bit line pair of odd number (a decoder circuit of odd number) is selected, the internal data transmission line pair I/O0, *I/O0 is selected by the input/output selection circuit 72. The bit line pair BL3, *BL3 is thereby brought to the non-selected state in any case, and repairing of the defective column has been effected.

In the structure shown in FIG. 22, whichever bit line pair the defective column is, the defective column can be brought to the non-selected state in any case and an access to a memory cell of in the memory cell array n columns can be made using n+1 pairs of bit lines only by changing the selecting manner in the input/output selection circuit 72, so that repairing of one defective column is conducted. A description will be made in the following as to specific structures of the input/output selection control circuit 71 and the input/output selection circuit 72.

Figure 23:
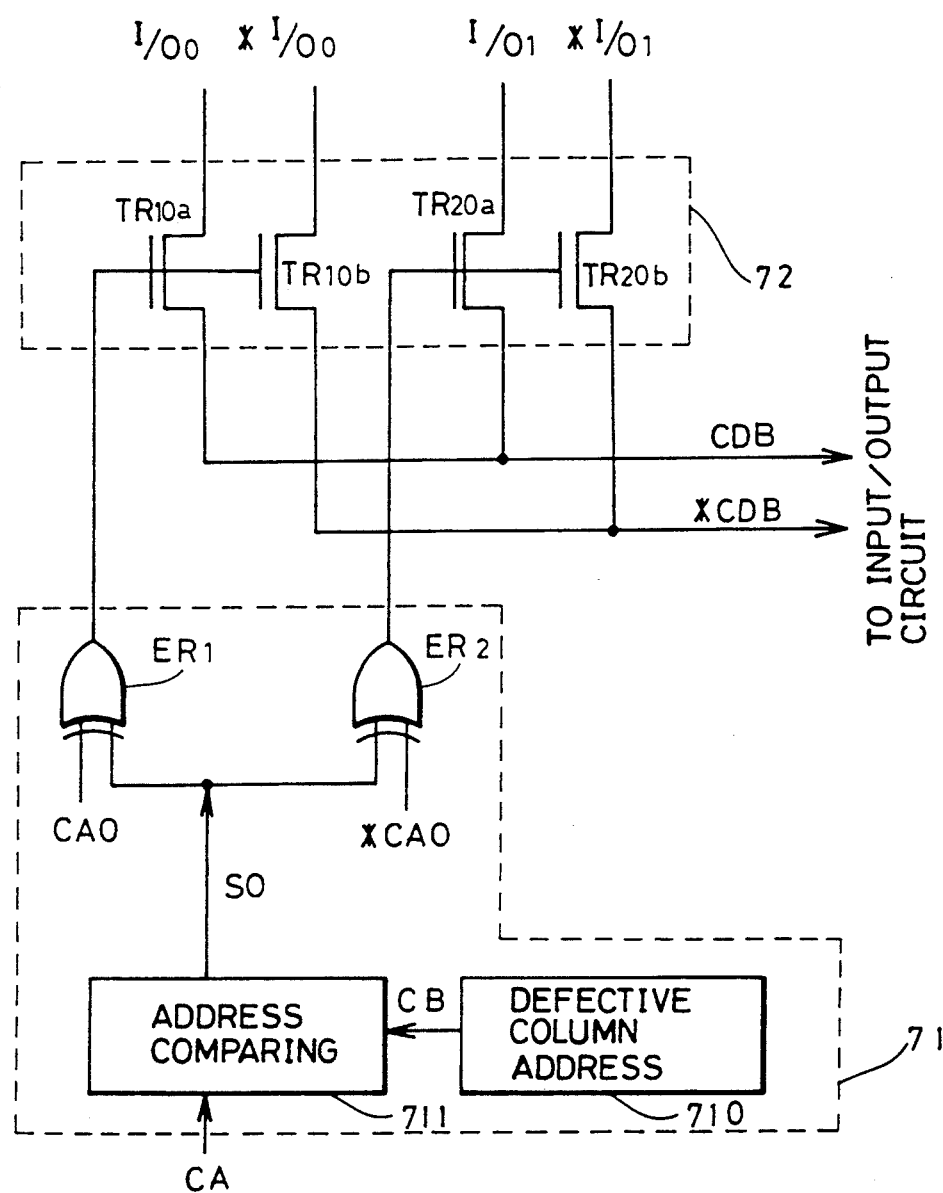
FIG. 23 is a diagram showing one example of a specific structure of the input/output selection control circuit shown in FIG. 17.

FIG. 23 is a diagram showing one example of specific structures of the input/output selection control circuit and the input/output selection circuit shown in FIG. 22. In FIG. 23, the input/output selection control circuit 71 includes a defective column address program circuit 710 for storing a defective column address CB indicating a defective column, an address comparing circuit 711 for comparing an internal column address CA and a defective column address CB programmed in this defective column address program circuit 710 and non-coincidence detection circuits ER1 and ER2 responsive to the control signal SO from the address comparing circuit 711 and the least significant internal column address bits CA0, *CA0 for generating a selection control signal.

The defective column address program circuit 710 includes a plurality of laser fusable link elements and stores an address indicating a defective column by selectively blowing off the link elements with a laser beam. The address comparing circuit 711 compares the programmed defective column address CB and the internal column address CA, and if the internal column address CA is smaller than the defective column address CB, it causes the control signal S0 to rise to "H". Conversely, if the defective column address CB is equal to or larger than the internal column address CA, the address comparing circuit 711 causes the control signal S0 to fall to "L".

The non-coincidence detection circuit ER1 receives the least significant internal column address bit CA0 and the control signal S0. The non-coincidence detection circuit ER2 receives the control signal S0 and a complementary internal column address least significant bit *CA0. The non-coincidence detection circuits ER1 and ER2 supply a signal of "H" when signals supplied to the inputs do not logically coincide.

The input/output selection circuit 72 includes transfer gate transistors TR10a, TR10b, and TR20a, TR20b provided respectively for the internal data transmission line pairs I/O0, *I/O0 and I/O1, *I/O1. The output of the non-coincidence detection circuit ER1 is supplied to the gates of the transfer gate transistors TR10a and TR10b. The output signal of the non-coincidence detection circuit ER2 is supplied to the gates of the transfer gate transistors TR20a and TR20b.

When the internal column address CA is less than the defective column address CB, the control signal S0 attains "H". When a column of even number is selected, the least significant column address bit CA0 attains "L (0)" and the complementary least significant column address bit *CA0 attains "H (1)". Accordingly, the non-coincidence detection circuit ER1 supplies a signal of "H" and the non-coincidence detection circuit ER2 supplies a signal of "L". As a result, the transfer gate transistors TR10a and TR10b are brought to the on-state and the internal data transmission line pair I/O0, *I/O0 is connected to the common data bus CDB, *CDB.

Conversely, when a column of odd number is designated by the internal column address, the least significant column address bit CA0 attains "H" and the complementary internal column address bit *CA0 attains "L". In this case, the output signal of the non-coincidence detection circuit ER2 rises to "H" and the transfer gate transistors TR20a and TR20b are brought to the on-state. The internal data transmission line pair I/O1, *I/O1 are thereby connected to the common data bus CDB, *CDB.

When the internal column address CA becomes equal to or greater than the defective column address CB, the control signal S0 attains "L". In this case, in contrast to the case described above, the transfer gate transistors TR10a and TR10b are brought to the on-state when the least significant column address bit CA0 is at "H". When the least significant column address bit CA0 is at "L", the output of the non-coincidence detection circuit ER2 attains "H" and the transfer gate transistors TR20a and TR20b are brought to the on-state. Accordingly, in a column address space including column addresses equal to or larger in value than this defective column address CB, when a column of even number is designated, the internal data transmission line pair I/O1, *I/O1 is connected to the common data bus CDB, *CDB while the internal data transmission line pair I/O0, *I/O0 is connected to the common data buses CDB, *CDB when a column of odd number is designated. Therefore, when a defective column is designated, a column subsequently adjacent to the defective column is selected instead, and thereafter, column addresses to be selected are shifted in the direction of the lower side (larger column addresses) one by one.

Figure 24:
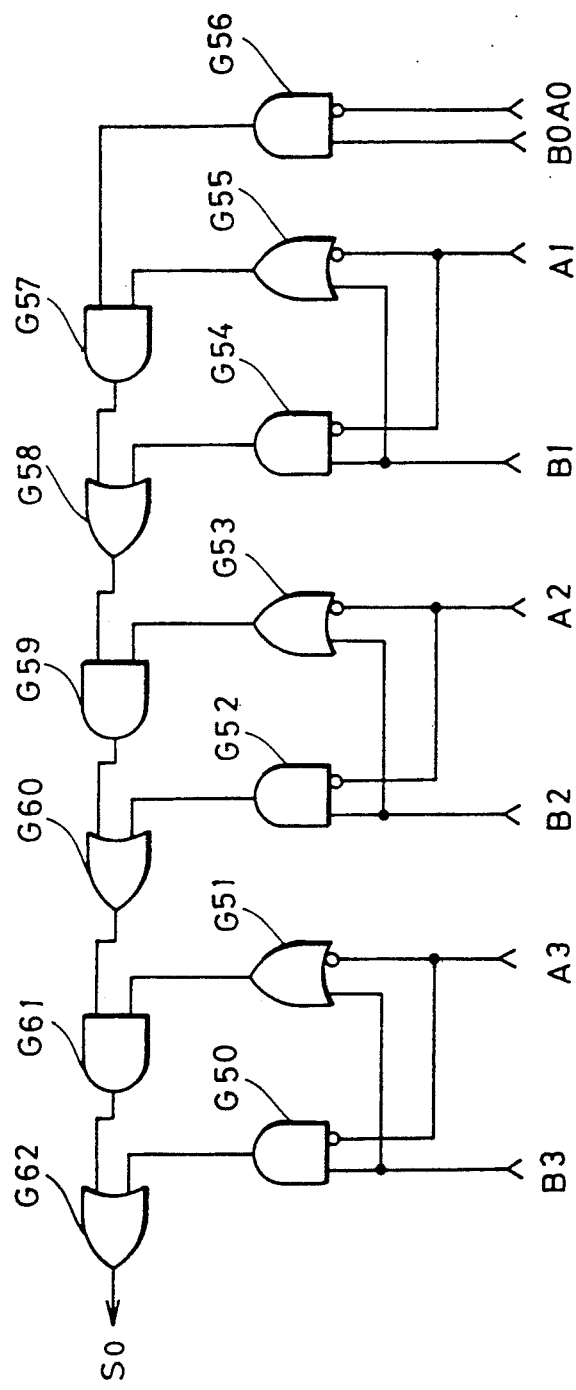
FIG. 24 is a diagram showing one example of a structure of the address comparing circuit shown in FIG. 17.

FIG. 24 is a diagram showing one example of a specific structure of the address comparing circuit 711. The address comparing circuit shown in FIG. 24 compares column addresses of 4 bits. This structure, however, can be easily expanded with respect to an arbitrary number of bits. In FIG. 24, the address comparing circuit 711 includes gate circuits G50 and G51 provided for the most significant address bits B3 and A3, gate circuits G52 and G53 provided for second bits B2 and A2, gate circuits G54 and G55 provided for third bits B1 and A1, a gate circuit G56 provided for the least significant bits B0 and A0, and cascade-connected gate circuits G57, G58, G59, G60, G61 and G62.

The gate circuit G50 receives an address bit B3 at its true input and an address bit A3 at its false input. The gate circuit G51 receives the address bit B3 at its true input and the address bit A3 at its false input.

The gate circuit G52 receives an address bit B2 at its true input and an address bit A2 at its false input. The gate circuit G53 receives the address bit B2 at its true input, and the address bit A1 at its false input and the address bit A2 at its false input.

The gate circuit G54 supplies an address bit B1 at its true input and an address bit A1 at its false input. The gate circuit G55 receives the address bit B1 at its true input, and the address bit al at its false input. The gate circuit G56 receives an address bit B0 at its true input and an address bit A0 at its false input.

Each of the gate circuits G50, G52, G54 and G56 supplies a signal of "H" only when an address bit supplied to its true input is at "H" and address bit supplied to its false inputs at "L".

Each of the gate circuits G51, G53, and G55 supplies a signal of "H" when address bit supplied to its true input is at "H" or address bit supplied to its false inputs is at "L".

The gate circuit G57 receives the output of the gate circuit G55 and the output of the gate circuit G56. The gate circuit G58 receives the output of the gate circuit G57 and the output of the gate circuit G54.

The gate circuit G59 receives the output of the gate circuit G58 and the output of the gate circuit G53. The gate circuit G60 receives the output of the gate circuit G59 and the output of the gate circuit G52.

The gate circuit G61 receives the output of the gate circuit G60 and the output of the gate circuit G51. The gate circuit G62 receives the output of the gate circuit G61 and the output of the gate circuit G50. The gate circuit G62 supplies a control signal S0 indicating the result of comparison between the address bits A3 to A0 and the address bits B3 to B0.

The gate circuits G57, G59 and G61 are 2-input AND gates and supply a signal of "H" when both each inputs are at "H". The gate circuits G58, G60 and G62 each are OR gate supplying a signal of "H" when the one input thereof is provided with a signal of "H". The operation thereof will now be described.

When the address bit B3 is "H (1)", and the address bit A3 is "L (0)", the gate circuit G50 supplies a signal of "H". In this case, the output of the gate circuit G60 attains "H". The address bits B3 and A3 are the most significant address bits. Therefore, if the column address B (the address including the address bits B3 to B0) is larger in value than the column address A (the address including the address bits A3 to A0), the control signal S0 attains "H". When the address bit B3 and the address bit A3 are at the same logical level, the output of the gate circuit G50 attains "L" while the output of the gate circuit G51 attains "H". In this case, the gate circuit G61 is brought to an enable state to select the comparing results of the address bits of lower order.

When the address bit B3 is "L" and the address bit A3 is "H", the outputs of the gate circuits G50 and G51 both attain "L". In this case, the output of the gate circuit G61 attains "L", and accordingly, the output S0 of the gate circuit G62 also attains "L". Therefore, when the column address B is smaller in value than the column address A, the control signal S0 attains "L".

Then, the address bits B2 and A2 are compared with each other in the circuit block of the gate circuits G52, G53, G60 and G59, the address bits B1 and A1 are compared with each other in the circuit block of the gate circuits G54, G55, G57 and G58, and signals corresponding to the results of each comparison are supplied from the circuit blocks.

The gate circuit G56 supplies a signal of "H" only when the address bit B0 is "H" and the address bit A0 is "L". Therefore, in this case, when the address bits B3, B2 and B1 are equal to the address bits A3, A2 and A1, respectively, a signal of a logic level in accordance with the result of comparison between the least significant address bits B0, and A0 is supplied. When the least significant address bit B0 is equal to the least significant address bit A0, the output of the gate circuit G56 attains "L". When the column address B is equal to the column address A, the outputs of the gate circuits G50, G52, G54 and G56 all attain "L", and the level of the control signal S0 becomes "L".

Accordingly, in the structure shown in FIG. 24, the structure of the address comparing circuit shown in FIG. 23 can be obtained when the address bits B3 to B0 (column address B) are used as the defective column address CB and the column address A including the address bits A3 to A0 is used as the internal column address CA.

Figure 25:
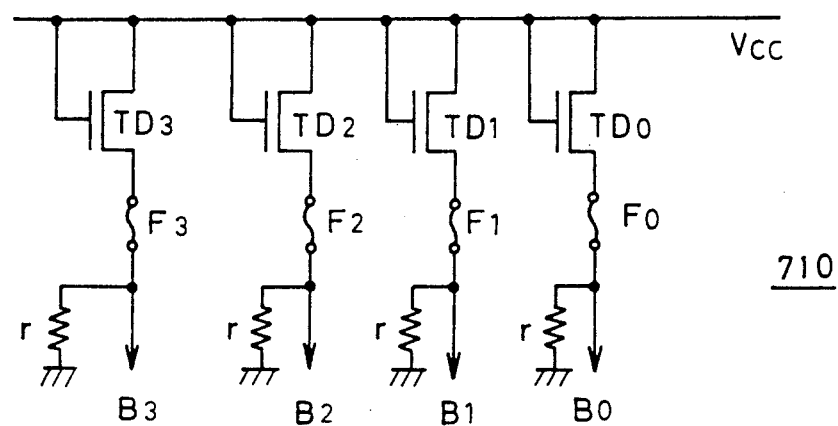
FIG. 25 is a diagram showing one example of a specific structure of the defective column address program circuit shown in FIG. 17.

FIG. 25 is a diagram showing one example of a specific structure of the defective column address program circuit 710 shown in FIG. 23. In FIG. 25, a case of a column address of 4 bits is shown as an example. In FIG. 25, the defective column address program circuit 710 includes resistance-connected n channel MOS transistors TD3, TD2, TD1 and TD0, link elements F3, F2, F1 and F0 including, for example, a fuse element which can be blown off with a laser beam and a resistor r having a relatively high resistance. The defective column address bit line B3 is connected to the power supply potential Vcc through the link element F3 and the transistor TD3. The defective column address bit line B2 is connected to the power supply potential Vcc through the link element F2 and the transistor TD2. The defective address bit line B1 is connected to the power supply potential Vcc through the link element F1 and the transistor TD1. The defective column address bit line B0 is connected to the power supply potential Vcc over the link element F0 and the transistor TD0.

The resistor r connected to each of the defective column address bit lines B3 to B0 sets a corresponding defective column address bits to "L" without fail at the time of disconnecting the link elements. Since this resistance element r has a relatively high resistance, a current flowing therethrough is small, and in a non-disconnected state of corresponding fuse element (F3 to F0), it has no adverse effect on the transmission of the power supply voltage Vcc from the corresponding transistors TD3 to TD0 to the corresponding address bit lines B3 to B0. According to such a structure, when the link elements F3 to F0 are appropriately blown off in accordance with the defective column address, the defective column address can be programmed.

In this case, when the number of bits of the defective column address which the defective column address program circuit 710 stores is equal to the number of bits of the internal column address, if there is no defective column, there may be a case that the defective column which the defective column address program circuit 710 would be, for example, 1111 and coincide with an address of a maximum column contained in the memory cell array. In such a case, replacement of a column having a normal maximum column address prevented in selecting a normal column by making the number of defective column address bits stored in the program circuit 710 larger than the number of internal column address bits in this semiconductor memory-device by 1 bit, using this extra 1 bit as the most significant address bit, maintaining this most significant defective column address bit at "H" when there is no defective column and programming this most significant defective column address bit to "L" when there is a defective column. In this case, the address comparing circuit 711 may have a structure such that the most significant internal address bit corresponding to the extra address bit is "L".

In the structure shown in FIG. 23, one defective column is repaired by simultaneously selecting memory cells of 2 bits with the second column decoder and further selecting a memory cell of 1 bit with the input/output selection circuit 72. However, it is also possible to implement a structure in which a plurality of defective columns may be repaired.

Figure 26:
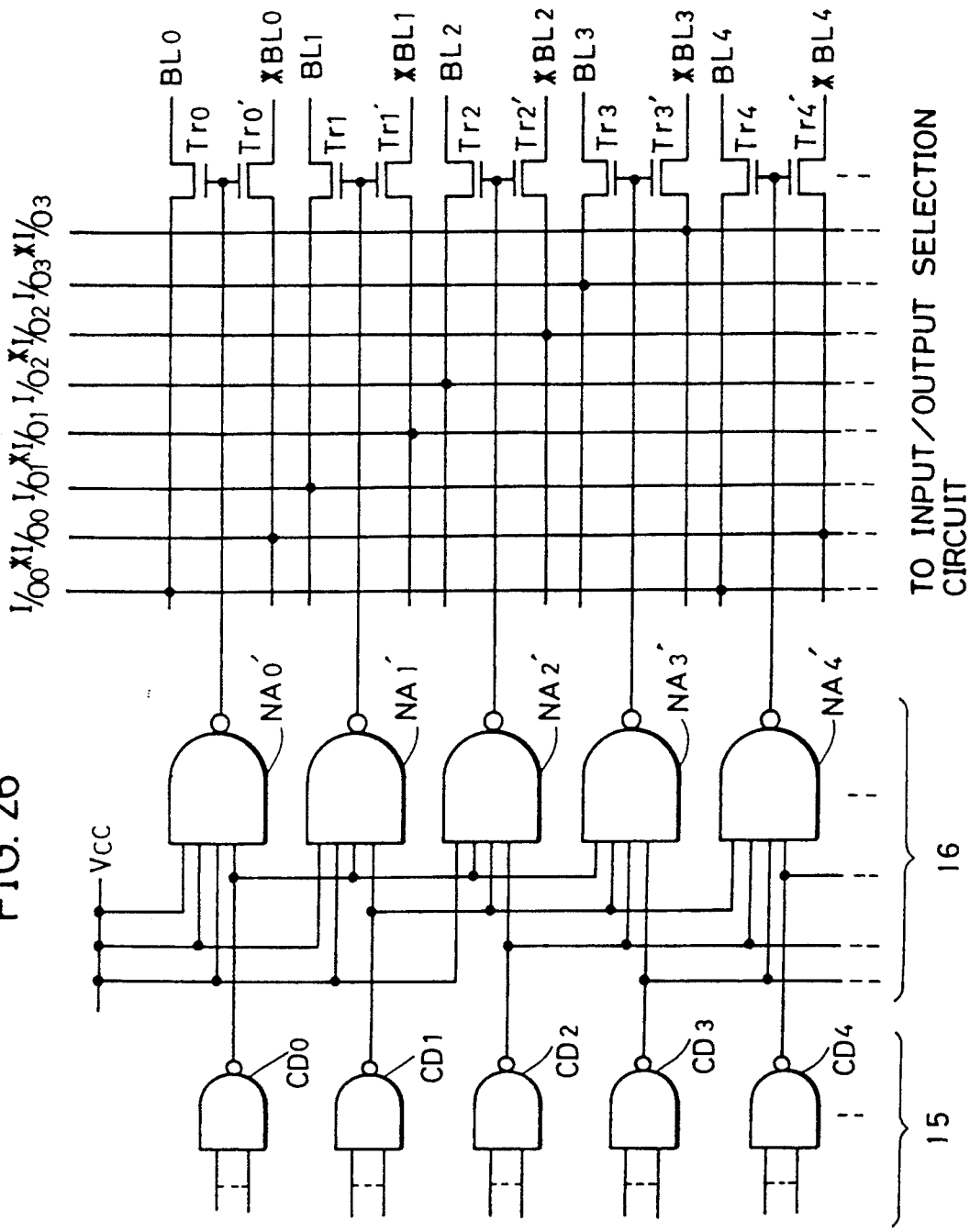
FIG. 26 is a diagram schematically showing a structure of column selecting circuitry in another embodiment of the semiconductor memory device in accordance with the third aspect.

FIG. 26 is a diagram showing a structure of column selecting circuitry in a semiconductor memory device in accordance with still another embodiment of the invention. In FIG. 26, a first column decoder 15 includes NAND type unit decoder circuits CD0 to CD4, . . .

The second column decoder 16, includes 4-input NAND circuits NA0' to NA4' provided respectively corresponding to the bit line pairs BL0, *BL0 to BL4, *BL4. In FIG. 26, while a predetermined number (m) of bit line pairs are provided, a portion related to four bit line pairs is only shown as an example to simplify the figure. The output of one decoder circuit CDi (i=0 to n) is supplied to the NAND circuits NAi', NAi+1', NAi+2' and NAi+3'. In the structure shown in FIG. 26, bit line pairs adjacent to each other in a loop are not selected and the power supply potential Vcc is supplied to the inputs of NAND circuits NA0' to NA2'. In this structure, when one unit decoder circuit CDi is selected, four NAND circuits NAi' to NAi+3' are simultaneously brought to the selected state and four pairs of bit lines are simultaneously selected.

Four pairs of internal data transmission lines I/00, *I/00, I/01, *I/01, I/02, *I/02, and I/03, *I/03 are provided in order to enable simultaneous selection of four pairs of bit lines. Each bit line pair is connected to the internal data transmission line pairs I/00 to I/03, *I/00 to *I/03 so that four pairs of bit lines simultaneously selected by one unit decoder circuit may be connected to different internal data transmission line pairs, respectively. That is, the bit line pairs BL4k, *BL4k to BL4k+3, *BL4k+3 are sequentially connected to the internal data transmission line pairs I/00, *I/00 to I/03, *I/03, respectively, where k is an arbitrary integer.

Four pairs of internal data transmission lines I/00, *I/00 to I/03, *I/03 are connected to the input/output selection circuit 72 (see FIG. 22). The input/output selection circuit 72 selects a specific internal data transmission line pair among these four pairs of internal data transmission lines in accordance with the internal column address (that is, the selected unit decoder circuit).

Figure 27:
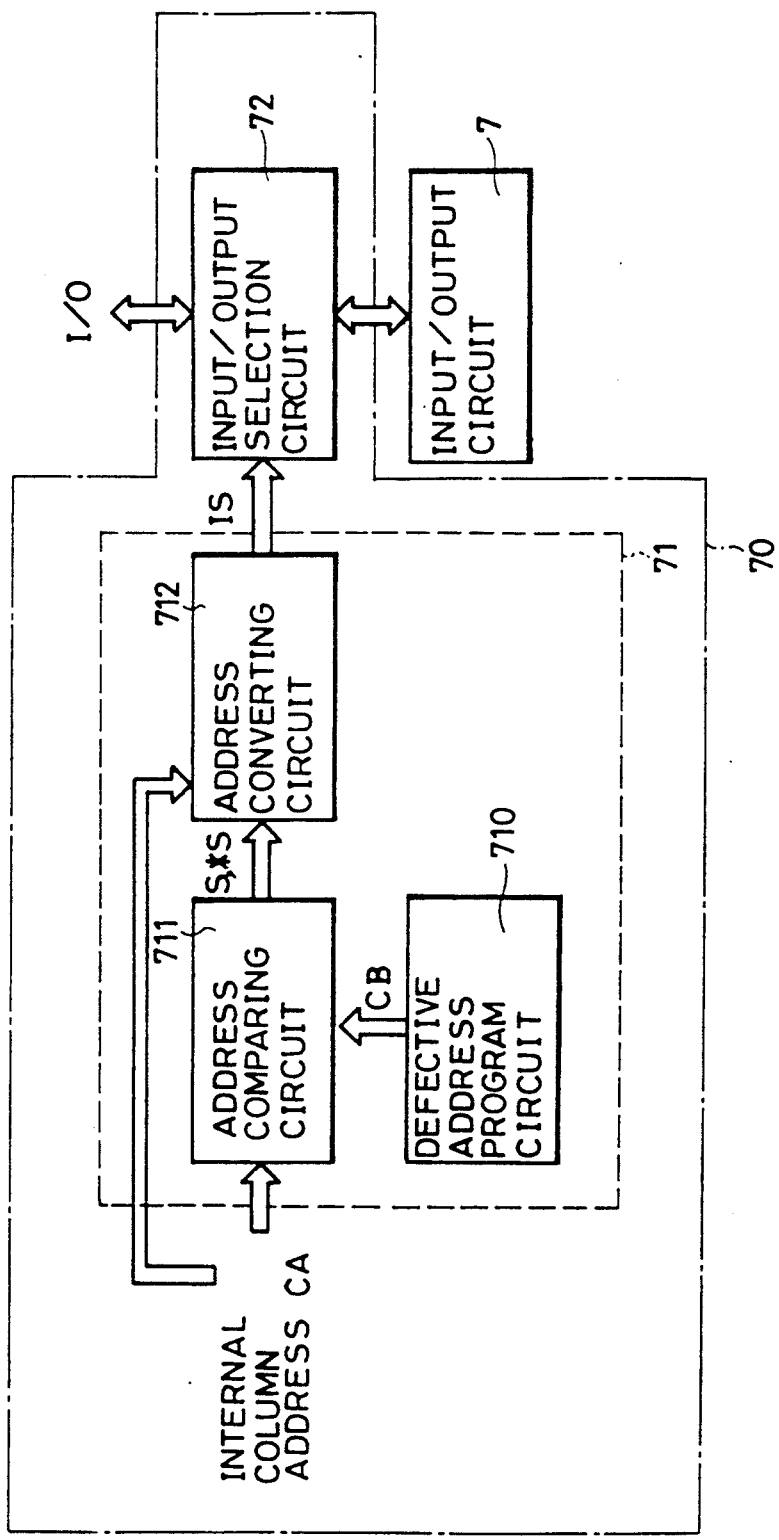
FIG. 27 is a diagram schematically showing a structure of an input/output control circuit block applied to the column selecting circuitry shown in FIG. 26.

FIG. 27 is a diagram showing one example of a detailed structure of the I/0 selection control block 70 shown in FIG. 21. In FIG. 27, the input/output selection control circuit 71 includes a defective column address program circuit 710 for storing a defective column address CB indicating a defective column, an address comparing circuit 711 for comparing the internal column address CA (and *CA) with the defective column address CB indicating the defective column programmed in this defective column address program circuit 710, and an address converting circuit 712 responsive to control signals S, *S from the address comparing circuit 711 and the internal column address CA, *CA for generating a selection control signal IS.

Figures 28, 29:
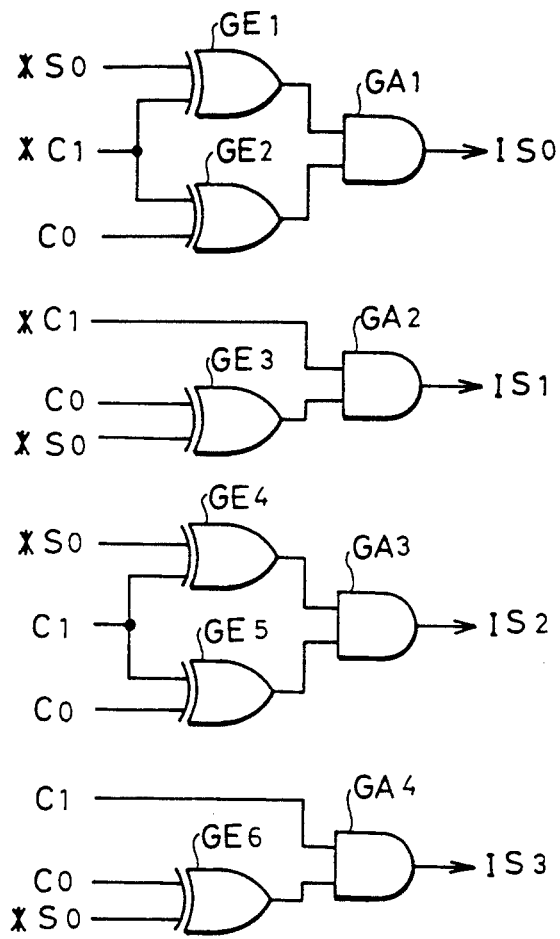
FIG. 28 is a diagram showing one example of a structure of the input stage in the address converting circuit shown in FIG. 27.
FIG. 29 is a diagram showing in a table the relationships of input/output signals in the circuit shown in FIG. 28.

FIG. 28 is a diagram showing one example of a specific structure of the input stage of the address converting circuit 712 shown in FIG. 27. The address converting circuit 712 shown in FIG. 28 generates a signal for connecting three pairs of bit lines to the input/output circuit-7 as well as repairing one defective column from four pairs of bit lines selected simultaneously.

In FIG. 28, the address converting circuit 712a includes gate circuits GE1 to GE6 for detecting a noncoincidence of the logical values of the supplied input signals, respectively, and AND gate circuits GA1 to GA4 each for generating selection control signals IS0, IS1, IS2, and IS3 which determine the manner of selecting an internal data transmission line pair in the input/output selection circuit 72.

The gate circuit GE1 receives the control signal *S0 and the internal column address bit *C1. The gate circuit GE receives the internal column address bits C0 and *C1. The gate circuit GE3 receives the control signal *S0 and the internal column address bit C0. The gate circuit GE4 receives the control signal *S0 and the internal column address bit C1. The gate circuit GE5 receives the internal column address bits C1, C0. The gate circuit GE6 receives the control signal *S0 and the internal column address bit C0. The control signal *S0 is a control signal generated from the address comparing circuit 711 and is a complementary signal of the control signal S0 shown in FIG. 23. The internal column address bits C0 and C1 are address bits of lower order of the internal column address CA, and *C1 is a complementary address bit of the address bit C1.

The AND circuit GA1 receives the outputs of the gate circuits GE1 and GE2 and generates a control signal IS0. The AND circuit GA2 receives the internal column address bit *C1 and the output of the gate circuit GE3 and generates a control signal IS1. The AND gate circuit GA3 receives the outputs of the gate circuits GE4 and GE5 and generates a control signal IS2. The AND gate circuit GA4 receives the internal column address bit C1 and the output of the gate circuit GE6 and generates a control signal IS3.

FIG. 29 is a diagram showing in a table the operation of the address converting circuit 712a shown in FIG. 28. As obvious from the table shown in FIG. 29, in this address converting circuit 712a, only one of the four selection control signals IS0 to IS3 is brought to the selected state and rises to "H" by a combination of the control signals S0, *S0 from the address comparing circuit 711 and 2 least significant bits C0, *C0, C1, *C1 of the internal column address.

Figure 30:
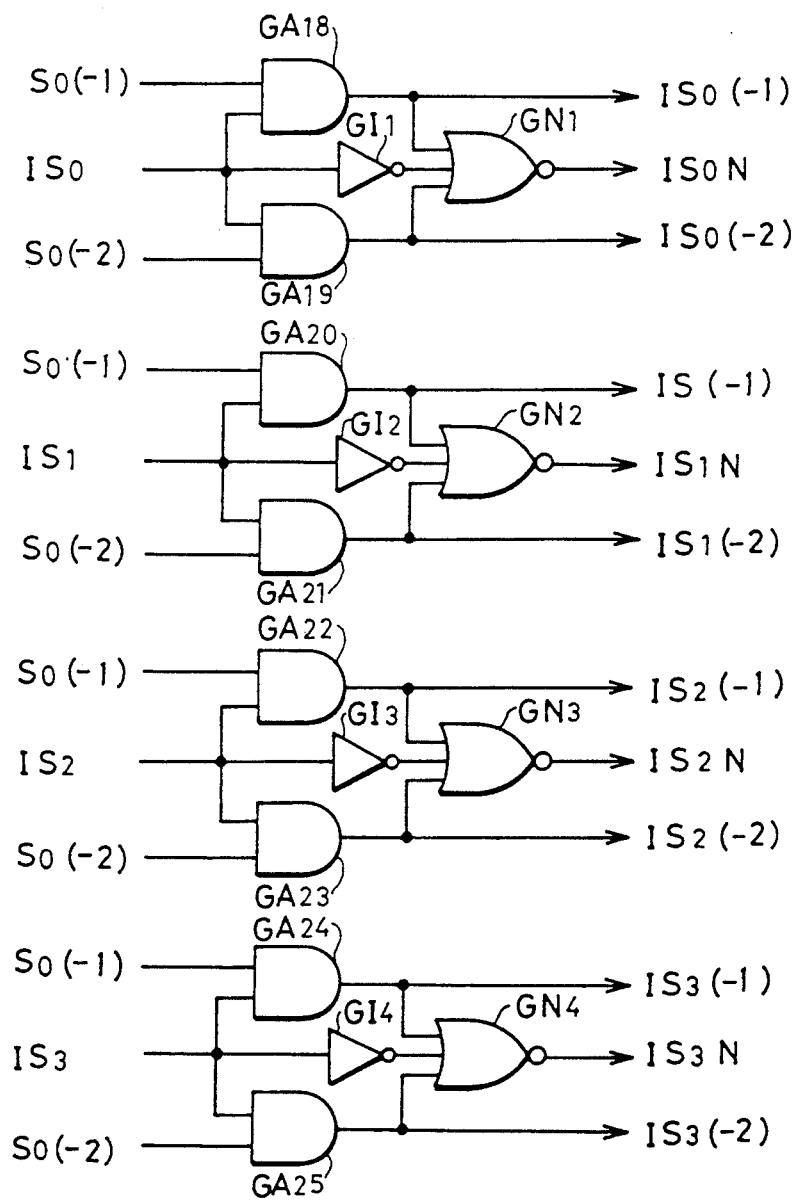
FIG. 30 is a diagram specifically showing one example of a structure of the output stage in the address converting circuit shown in FIG. 27.

The selection control signals IS0 to IS3 generated from the first circuit 712a shown in FIG. 28 are further supplied to a second circuit shown in FIG. 30. The second circuit shown in FIG. 30 constitutes the output portion of the address converting circuit 712. Selection control signals IS0N to IS3N, IS0 (−1) to IS3 (−1), and IS0 (−2) to IS3 (−2) which determine a selecting manner in the input/output selection circuit 72 are generated from the second circuit.

In FIG. 30, the second circuit 712b which constitutes the output stage contained in the address converting circuit 712 includes 2-input AND gate circuits GA18 to GA25, inverter circuits GI1 to GI4 for inverting received signals, and NOR gate circuits GN1 to GN4 for supplying a signal of "H" only when all received inputs are at "L". The second circuit 712b includes four independent circuit blocks. The circuit block for receiving the control signals S0 (−1), IS0 and S0 (−2) generates control signals IS0 (−1), IS0N, and IS0 (−2) for maintaining the order of internal data transmission line pairs as their numbers and connecting the line pairs to the common data bus (data bus of 3 bits). When the control signals IS1 (−1), IS1N, and IS1 (−2) are generated, the connecting manner of the internal data transmission line pairs and the common data bus is shifted by 1 bit. When the control signals IS2 (−1), IS2N and IS2 (−2) are generated, the connection of the internal data transmission line pairs and the common data bus is shifted by 2 bits. When the control signals IS3 (−1), IS3N, and IS3 (−2) are generated, the connection between the internal data transmission line pairs and the common data bus is shifted by 3 bits.

The control signals IS0 to IS3 are selection control signals generated from the first circuit block 712a shown in FIG. 28. The control signal S0 (−1) attains "H" only when the internal column address CA is smaller in value than the defective column address by 1 (decimal number). The control signal S0 (−2) attains "H" only when the internal column address CA is smaller in value than the defective column address by 2 (decimal number). These control signals S0 (−1) and S0 (−2) are generated from the address comparing circuit 711 shown in FIG. 19, and contained in the control signals S, *S. Therefore, the address comparing circuit 711 compares the defective column address programmed in the defective address program circuit 710, the column address smaller than the defective column address by 1, and the column address smaller than the defective column address by 2 with a received internal column address CA.

The control signal ISj (−1) (j=0, 1, 2, 3) is generated when the control signal ISj and the control signal S0

(−1) both attain "H" in the circuit structure shown in FIG. 30. The control signal ISjN is generated when the control signal Isj is at "H" and the control signals ISj (−1) and ISj (−2) are both at "L".

Figure 31A:
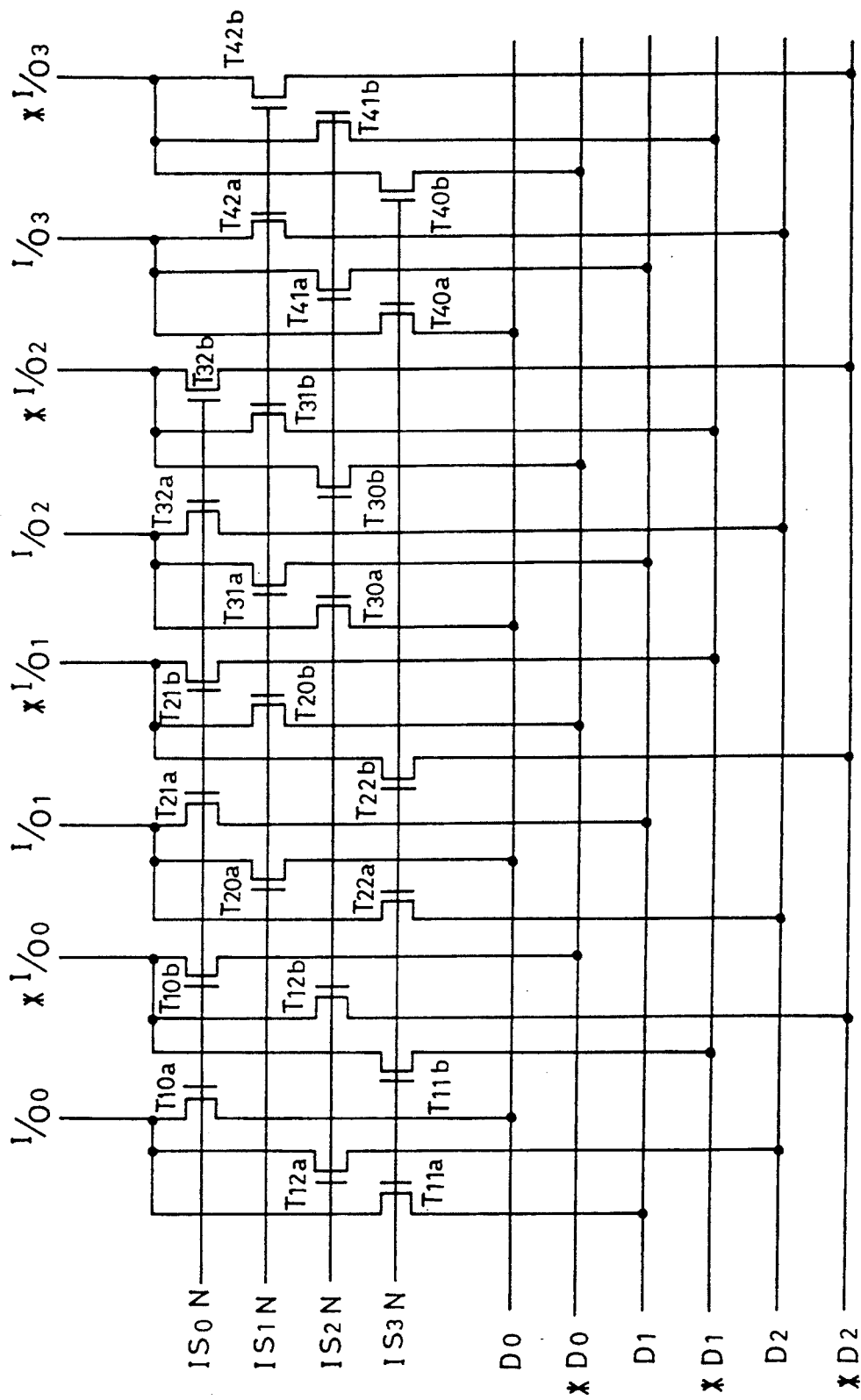
FIG. 31A is a diagram showing one example of a specific structure of the input/output selection circuit shown in FIG. 27.
Figure 31B:
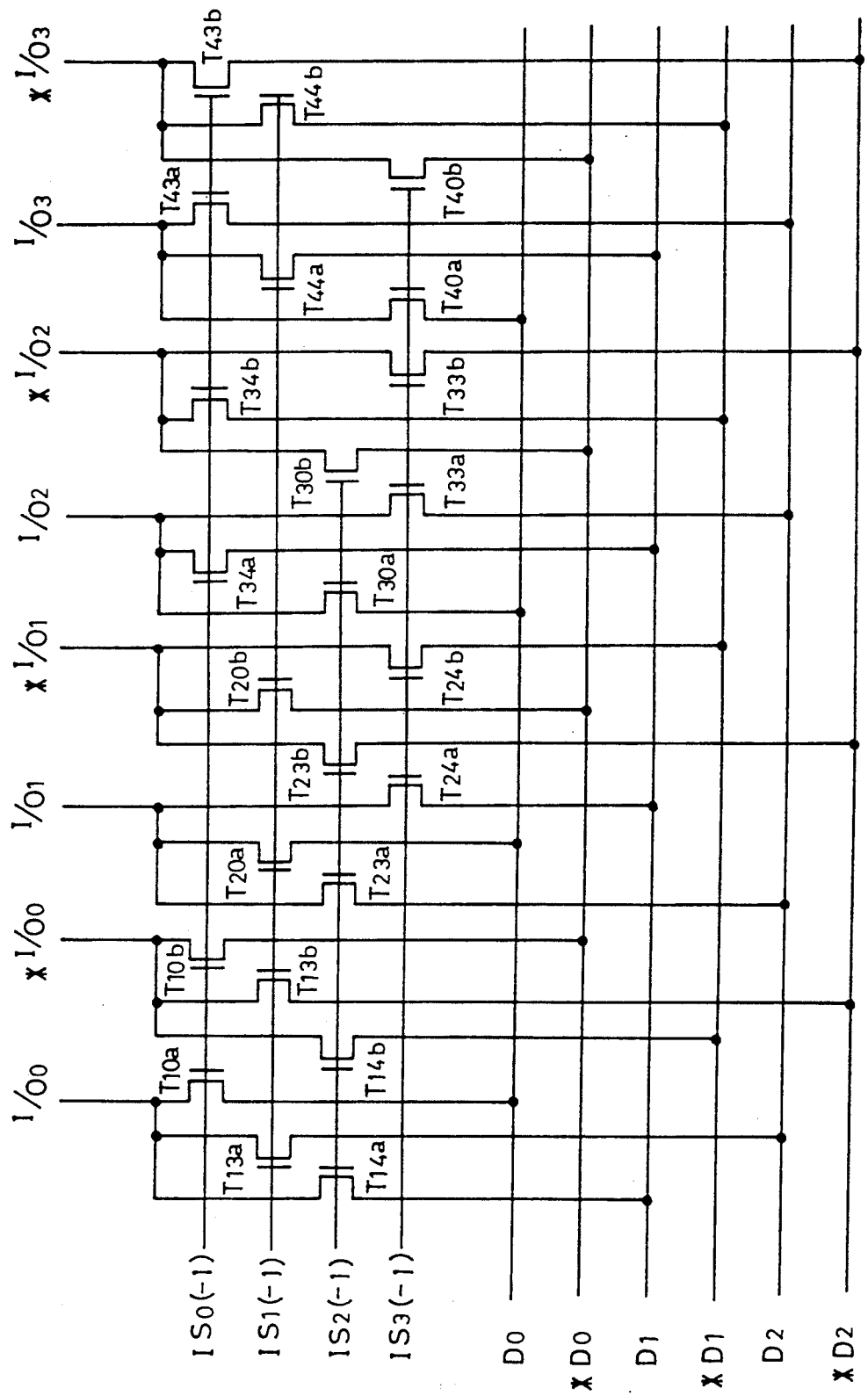
FIG. 31B is a diagram showing one example of a specific structure of the input/output selection circuit shown in FIG. 27.
Figure 31C:
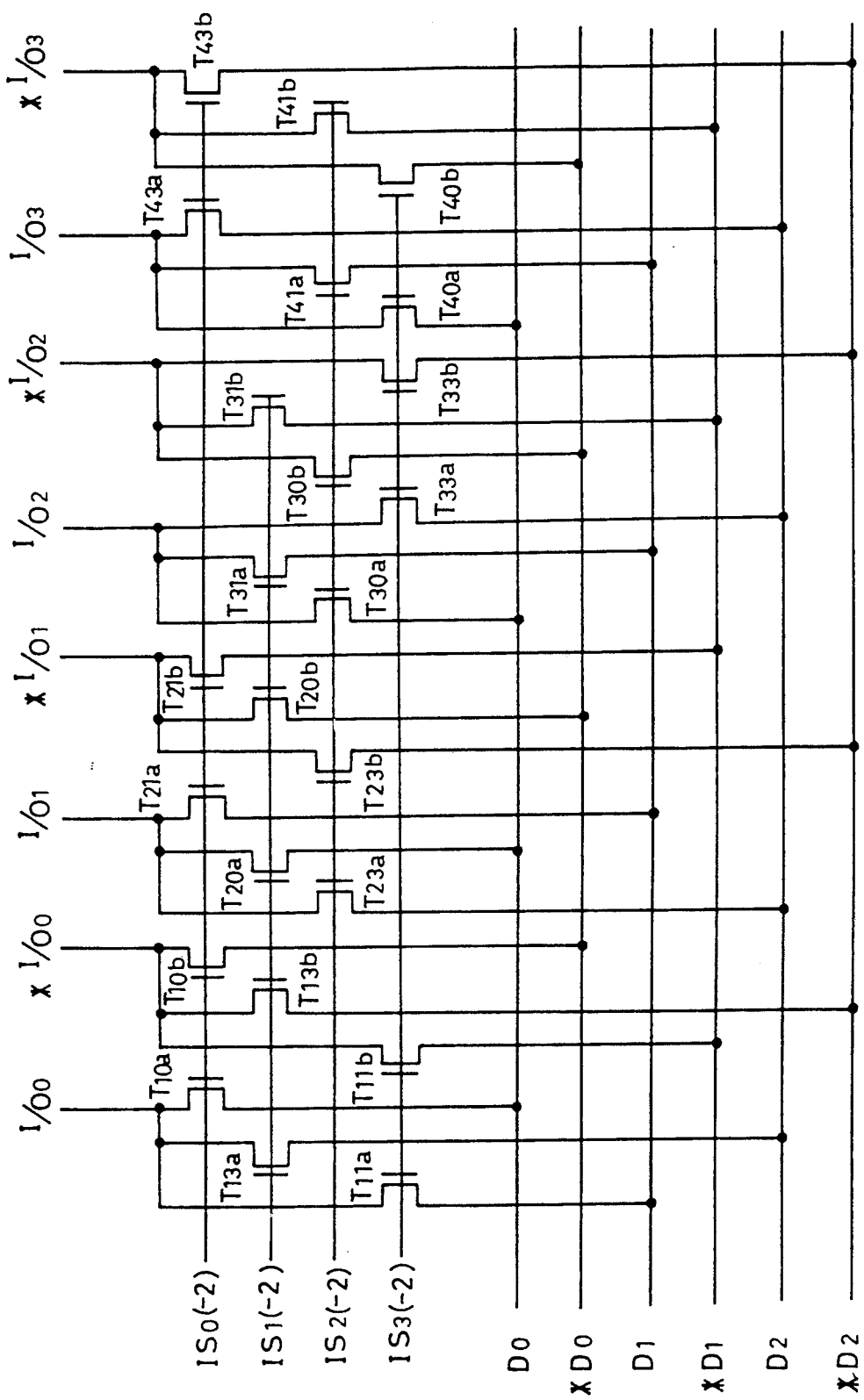
FIG. 31C is a diagram showing one example of a specific structure of the input/output selection circuit shown in FIG. 27.

In FIGS. 31A to 31C, there are shown structures of input/output selection circuits classified according to control signals, which are operating by control signal generated from the second circuit shown in FIG. 30. FIG. 31A shows a portion of an input/output selection circuit which operates in response to the control signals IS0N to IS3N. FIG. 31B shows a portion of an input/output selection circuit which operates in response to the control signals IS0 (−1) to IS3 (−1). FIG. 31C is a diagram showing a circuit structure of a portion which operates in response to the control signals IS0 (−2) to IS3 (−2). Though the circuit structures of FIGS. 31A to 31C are separately shown as if they were independent circuit structures, this is shown to make it easier to understand the operation of the input/output selection circuit, and the structure may be adapted so that a signal of logical sum of signals of each of FIGS. 31A to 31C is supplied to the transistors (transfer gate transistors) respectively provided in each internal data transmission line pair. Alternatively, the control signals may be decoded using a PLD (Programmable-Logic-Device), for selectively driving transfer gate transistors connected to the internal data transmission line pairs. Any circuit structure may be employed in which the structures of the input/output selection circuits shown in FIGS. 31A to 31C may be equivalently implemented. Corresponding transfer gate transistors each through the FIGS. 31A to 31C are given the same reference numerals.

In FIG. 31A, when the control signal IS0N is generated, the transfer gate transistors T10a, T10b, T20a, T21b, T32a, T32b are brought to a conductive state and the internal data transmission line pairs I/00, *I/00, I/01, *I/01, and I/02, *I/02 are connected to the common data bus line pairs D0, *D0, D1, *D1, D2, *D2, respectively.

When the control signal IS1N is generated, the transfer gate transistors T20a, T20b, T31a, T31b, and T42a, T42b are brought to an on-state, and the internal data transmission line pairs I/01, *I/01, I/02, *I/02 and I/03, *I/03 are connected to the common data bus line pairs D0, *D0, D1, *D1, and D2, *D2, respectively.

When the control signal IS2N is generated, the transfer gate transistors T12a, T12b, T30a, T30b, and T41a, T41b are brought to the on-state, and the internal data transmission line pairs I/00, *I/00, I/02, *I/02, and I/03, *I/03 are connected to the common data bus line pairs D2, *D2, D0, *D0, and D1, *D1, respectively.

When the control signal IS3N is generated, the transfer gate transistors T11a, T11b, T22a, T22b, and T40a, T40b are brought to the on-state, and the internal data transmission line pairs I/00, *I/00, I/01, *I/01 and I/03, *I/03 are connected to the common data bus line pairs D1, *D1, D2, *D2, and D0, *D0, respectively.

In FIG. 31B, when the control signal IS0 (−1) is generated, the transfer gate transistors T10a, T10b, T34a, T34b, and T43a, T43b are brought to the on-state, and the internal data transmission line pairs I/00, *I/00, I/02, *I/02, and I/03, *I/03 are connected to the common data bus line pairs D0, *D0, D1, *D1, and D2, *D2, respectively. When the control signal IS1 (−1) is generated, the transfer gate transistors T13a, T13b, T20a, T20b, T44a, T44b are brought to the on-state and the internal data transmission line pairs I/00, *I/00, I/01, *I/01, and I/03, *I/03 are connected to the common data bus line pairs D2, *D2, D0, *D0, and D1, *D1, respectively.

When the control signal IS2 (−1) is generated, the transfer gate transistors T14a, T14b, T23a, T23b, and T30a, T30b are brought to the on-state, and the internal data transmission line pairs I/00, *I/00, I/01, *I/01, and I/02, *I/02 are connected to the internal common data bus line pairs D1, *D1, D2, *D2, and D0, *D0, respectively.

When the control signal IS3 (−1) is generated, the transfer gate transistors T24a, T24b, T33a, T33b, and T40a, T40b are brought to the on-state, and the internal data transmission line pairs I/01, *I/01, I/02, *I/02, I/03, *I/03 are connected to the common data bus line pairs D1, *D1, D2, *D2 and D0, *D0, respectively.

In FIG. 31C, when the control signal IS0 (−2) is generated, the transfer gate transistors T10a, T10b, T21a, T21b, and T43a, T43b are brought to the on-state and the internal data transmission line pairs I/00, *I/00, I/01, *I/01, and I/03, *I/03 are connected to the common data bus line pairs D0, *D0, D1, *D1, and D3, *D3, respectively.

When the control signal IS1 (−2) is generated, the transfer gate transistors T13a, T13b, T20a, T20b, and T31a, T31b are brought to the on-state and the internal data transmission line pairs I/00, *I/00, I/01, *I/01, and I/02, *I/02 are connected to the common data bus line pairs D2, *D2, D0, *D0, and D1, *D1, respectively.

When the control signal IS2 (−2) is generated, the transfer gate transistors T23a, T23b, T30a, T30b, T41a, T41b are brought to the on-state and the internal data transmission line pairs I/01, *I/01, I/02, *I/02, and I/03, *I/03 are respectively connected to the common data bus line pairs D2, *D2, D0, *D0, and D1, *D1.

When the control signal IS3 (−2) is generated, the transfer gate transistors T11a, T11b, T33a, T33b, T40a, T40b are brought to the on-state respectively, and the internal data transmission line pairs I/00, *I/00, I/02, *I/02, and I/03, *I/03 are connected to the common data bus line pairs D1, *D1, D2, *D2, and D0, *D0, respectively. The operation thereof will be described in the following.

If there is no defective bit or an internal column address CA is smaller in value than the defective column address CB, the output signal bit S0 from the address comparing circuit 711 is "H". In this case, in accordance with the relationship shown in FIG. 29, the control signals IS0, IS1, IS2, and IS3 attain "H" respectively for (L, L), (L, H), (H, L), and (H, H) of least significant bits (C1, C0) of the internal column address CA.

In the circuit structure shown in FIG. 30, if the internal column address CA is smaller in value than the defective column address CB by 3 or more (decimal number), when one of the control signals IS0 to IS3 is generated, a corresponding control signal of the signals IS0N to IS3N attains "H".

When the internal column address CA is smaller in value than the defective column address CB by 1 (decimal number), the signal S0 (−1) attains "H", and in accordance with the circuit structure shown in FIG. 30, the control signals IS0 (−1) to IS3 (−1) attain "H", respectively, when the control signals IS0 to IS3 attain "H".

When the internal column address CA is smaller in value than the defective column address CB by 2 (decimal number), the signal SO (−2) attain "H", and in accordance with the circuit structure shown in FIG. 30, when the control signals IS0 to IS3 attains "H", respectively, the corresponding control signals IS0 (−2) to IS3 (−2) attain "H".

When the internal column address CA is equal to or larger in value than the defective column address CB, the output signal bit S0 from the address comparing circuit 711 attains "L". Therefore, in accordance with the relationship of the signals shown in FIG. 29, the control signals IS1, IS2, IS3, and IS0 attain "H", respectively, for (L, L), (L, H), (H, L), (H, H) of 2 least significant bits (C1, C0) of the internal column address CA.

Furthermore, in accordance with the circuit structure shown in FIG. 30, the control signals IS1N, IS2N, IS3N, and IS0N attain "H" for respective states of the bits (C1, C0) of the above-mentioned internal column address.

Suppose that a defect is generated in a memory cell connected to the bit line pair BL4, *BL4, for example, in the structure shown in FIG. 26. In this case, the defective column address CB is 4 (decimal number). If an externally applied column address is "0 (decimal number)" and the unit decoder circuit CD0 is selected, the NAND circuits NA0', NA1', NA2', and NA3' contained in the second column decoder 16' are selected. In this case, the selection gate transistors TR0, TR0' to TR3, TR3' are brought to the on-state and the internal data transmission line pairs I/00, *I/00 to I/03 *I/03, are connected to the bit line pairs BL0, *BL0 to BL3, *BL3, respectively. The internal column address CA generated in response to the external column address becomes "0" (an address CA is hereinafter represented by a decimal number). Accordingly, the internal column address bits C1 and C0 both attain "L" while the control signal S0 attains "H". The control signal IS0 thereby attains "H" in the first circuit 712a shown in FIG. 28.

Since the internal column address CA is smaller in values than the defective column address CB by 3 or more, it leads to the relation of the control signal bits of S0 (−1) = S0 (−2) = "L", and the control signal IS0N attains "H" in accordance with the relationship of the signals shown in FIG. 29. Accordingly, in this case, the control signal IS0N is generated from the second circuit (712b) shown in FIG. 30 and attains "H". In this case, as shown in FIG. 31A, the transfer gate transistors T10a, T10b, T21a, T21b, and T32a, T32b are brought to the on-state and the internal data transmission line pairs I/00, *I/00 to I/02, *I/02 are connected to the common data bus line pairs D0, *D0 to D2, *D2, respectively, in the input/output selection circuit 72.

When the externally applied column address is "1", and the decoder circuit CD1 is selected in the first column decoder 15, NAND circuits NA1', NA2', NA3', and NA4' are selected in the second column decoder 16'. The selection gate transistors Tr1, Tr1' to Tr1' to Tr4, are thereby brought to the on-state and the internal data transmission line pairs I/01, *I/01, I/02, *I/02, I/03, *I/03, and I/00, *I/00 are connected to the bit line pairs BL1, *BL1, BL2, *BL2, BL3, *BL3 and BL4, *BL4, respectively. In this case, the internal column address CA is "1", so that it leads to the relations of C1 = "L", C0 = "H", S0 = "H", and the control signal IS1 attains "H" in the first circuit 712a shown in FIG. 28. The internal column address CA is smaller in value than the defective column address CB by 3 or more, so that it leads to S0 (−1) = S0 (−2) = "L", and therefore the control signal IS1N attains "H" in the second circuit 712b shown in FIG. 30. In this case, in the structure of the input/output selection circuit 72 shown in FIG. 31A, the internal data transmission line pairs I/01, *I/01, I/02, *I/02, and I/03, *I/03 are connected to the common data bus line pairs D0, *D0, D1, *D1 and D2, *D2, respectively.

When the external column address becomes "2" and the decoder circuit CD2 in the first column decoder 15 is selected, the NAND circuits NA2', NA3', NA4', NA5' are selected in the second column decoder 16' and the selection gate transistors Tr2, Tr2' to Tr5, Tr5' are brought to the on-state. Therefore, the internal data transmission line pairs I/02, *I/02, I/03, *I/03, I/00-,*I/00, and I/01, *I/01 are connected to the bit line pairs BL2, *BL2, BL3, *BL3, BL4, *BL4 and BL5, *BL5, respectively.

Since the internal column address CA is "2", the address bit C1 = "H", C0 = "L", and the control signal bit S0 = "H", and the control signal IS2 is generated from the first circuit 712a shown in FIG. 28.

As the internal column address CA is smaller in value than the defective column address CB by 2, it leads to S0 (−1) = "L", S0 (−2) = "H", and the control signal IS2 (−2) is generated in the second circuit 212b shown in FIG. 30. Therefore, in this case, in FIG. 31 C, the transfer gate transistors T23a, T23b, T30a, T30b, T41a, T41b are brought to the on-state and the internal data transmission line pairs I/02, *I/02, I/03, *I/03, I/01, *I/01 are connected to the common data bus line pairs D0, *D0, D1, *D1, and D2, *D2, respectively.

When the external column address is "3", and the decoder circuit CD3 is selected in the first column decoder 15, the NAND circuits NA3', NA4', NA5', NA6' are selected in the second column decoder 16' and the selection gate transistors Tr3, Tr3' to Tr6, Tr6' are brought to the on-state. In this case, the internal data transmission line pairs I/03, *I/03, I/00, *I/00, I/01, *I/01, I/02, *I/02 are connected to the bit line pairs BL3, *BL3, BL4, BL4, BL5, *BL5, and BL6, *BL6, respectively.

The internal column address CA is "3", so that it leads to C1 = "H", C0 = "H", S0 = "H" and the control signal IS3 is generated from the first circuit 712a shown in FIG. 28.

The internal column address CA is smaller in value than the defective column address CB by 1, so that it leads to S0 (−1) = "H", S0 (−2) = "L" and the control signal IS3 (−1) is generated from the second circuit 712b shown in FIG. 30. In this case, in the structure of the input/output selection circuit shown in FIG. 31B, the transfer gate transistors T24a, T24b, T33a, T33b, and T40a, T40b are brought to the on-state and the internal data transmission line pairs I/03, *I/03, I/01, *I/01, I/02, *I/02 are connected to the common data bus line pairs D0, *D0, D1, *D1, D2, *D2, respectively.

Suppose that the external column address is "4" and becomes equal in value to the defective column address. In this case, the decoder circuit CD4 is selected in the first column decoder 15, the NAND circuits NA4', NA5', NA6' and NA7' are selected in the second column decoder 16, and the selection gate transistors Tr4, Tr4' to Tr7, Tr7' are brought to the on-state. At this time, the internal data transmission line pairs I/00. *I/00, I/01, *I/01, I/02, *I/02, I/03, *I/03 are connected to the bit line pairs BL4, *BL4, BL5, *BL5, BL6, *BL6 and BL7, *BL7, respectively.

Since the internal column address CA is "4", C1 = "L", C0 = "L", S0 = "L". In this case, the control signal IS1 is generated from the first circuit 712a shown in FIG. 28.

Since the internal column address CA is equal in value to the defective column address CB, satisfying the condition that the internal column address CA is equal or larger in value than the defective column address, it leads to S0=(−1)=S0 (−2)="L" and the control signal IS1N is generated from the second circuit 712b shown in FIG. 30. Therefore, in the structure of the input/output circuit shown in FIG. 31A, the transfer gate transistors T20a, T20b, T31a, T31b, T42a, T42b are brought to the on-state and the internal data transmission line pairs I/01, *I/01, I/02, *I/02, and I/03, *I/03 are connected to the common data bus line pairs D0, *D0, D1, *D1, D2, *D2, respectively. Suppose that a remainder obtained by dividing the internal column address by 4 is j. Every time the external column address increases by 1, a control signal ISjN is generated and memory cells of 3 bits of an adjacent columns are connected to a common data bus. The bit line pair BL4, *BL4 of the defective column is equivalently placed in the non-selected state in accordance with the connecting manner described above.

In the above-mentioned structure, one defective column is repaired by selecting three pairs of internal data transmission line pairs from four internal data transmission line pairs. In this structure, however, two defective columns can be repaired by selectively connecting only two internal data transmission line pairs to a common data bus.

Figure 32:
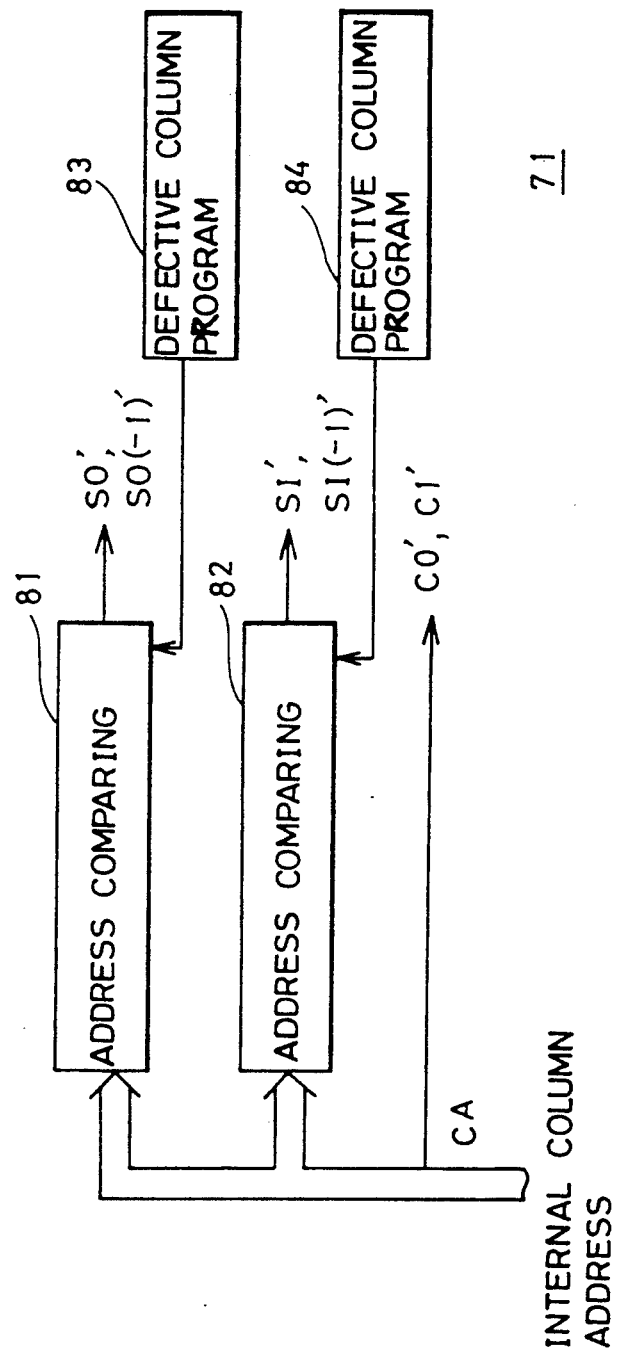
FIG. 32 is a diagram schematically showing another example of structures of the address comparing circuit and the defective address program circuit shown in FIG. 27.

FIG. 32 is a diagram showing a structure of an input/output selection control circuit for repairing two defective columns. In FIG. 32, the input/output selection control circuit 71 includes a defective column program circuit 83 for storing a first defective column, a defective column program circuit 84 for storing an address of a second defective column, a first address comparing circuit 81 for comparing the internal column address CA with a defective column address programmed in the defective column program circuit 83, and a second address comparing circuit 82 for comparing the internal column address CA with a second defective column address programmed in the defective column program circuit 84. A control signal S0' for indicating the result of the comparison is generated from the first address comparing circuit 81, and a control signal S1' for indicating the result of the comparison is generated from the second address comparing circuit 82. The defective column address programmed in the defective column program circuit 83 is smaller in value than the defective column address programmed in the second defective column program circuit 84. An address smaller in value than the column address of the actual defective column by "1" is programmed in the second defective column program circuit 84.

Figure 33:
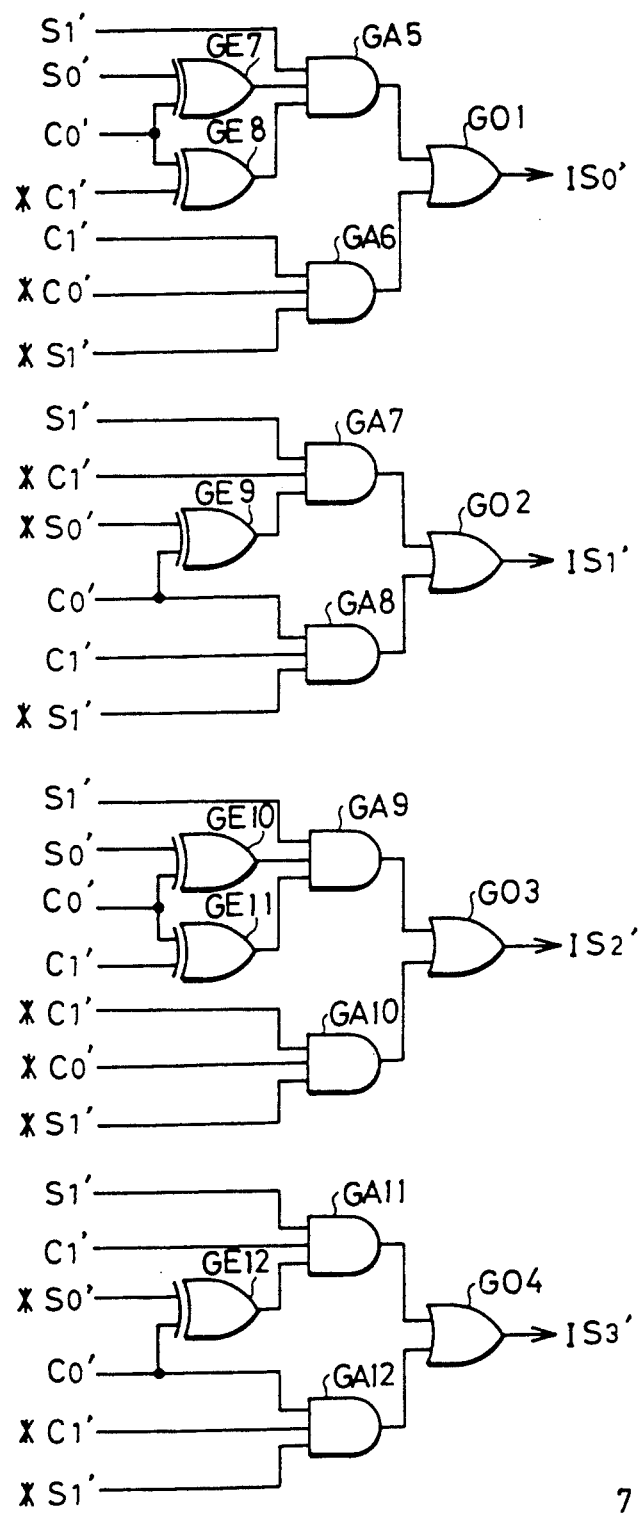
FIG. 33 is a diagram showing one example of another specific structure of the input stage in the address converting circuit shown in FIG. 27.

FIG. 33 is a diagram showing a structure of a first circuit 712a' constituting an input stage of an address converting circuit for repairing two defective columns. In FIG. 33, the first circuit 712a' includes 2-input gate circuits GE7 to GE12 for taking an exclusive logical sum received signals and detecting a coincidence/non-coincidence of the logical level of the input signals, 3-input AND circuits GA5 to GA12 for taking a logical product of received signal and 2-input OR circuits GO1 to GO4 for taking a logical sum of received signals.

The gate circuit GE7 receives the control signal S0' and the internal column address bit C0'. The gate circuit GE8 receives the internal column address bits C0' and *C1'. The gate circuit GE9 receives the control signal *S0' and the internal column address bit C0'. The gate circuit GE10 receives the control signal S0' and the internal column address bit C0'. The gate circuit GE11 receives the internal column address bits C0' and C1'. The gate circuit GE12 receives the control signal *S0' and the internal column address bit C0'.

The gate circuit GA5 receives the control signal S1' and the outputs of the gate circuits GE7 and GE8. The gate circuit GA6 receives the internal column address bits C1' and *C0' and the control signal *S1'. The gate circuit GA7 receives the control signal S1', the internal column address bit C1' and the output of the gate circuit GE9. The gate circuit GA8 receives the internal column address bits C0' and C1' and the control signal *S1'. The gate circuit GA9 receives the internal column address bit S1' and the outputs of the gate circuits GE10 and GE11. The gate circuit GA10 receives the internal column address bits *C1' and *C0' and the control signal *S1'. The gate circuit GA11 receives the control signal S1', the internal column address bit C1' and the output of the gate circuit GE12. The gate circuit GA12 receives the internal column address bits C0' and *C1' and the control signal *S1'.

The OR gate circuit GO1 receives the outputs of the AND gate circuits GA5 and GA6. The OR gate circuit GO2 receives the outputs of the AND gate circuits GA7 and GA8. The OR gate circuit GO3 receives the outputs of the AND gate circuits GA9 and GA10. The OR gate circuit GO4 receives the output of the AND gate circuits GA11 and GA12.

Each of the gate circuits GE7 to GE12 supplies a signal of "H" when the logic of the two inputs do not coincide with each other. Each of the AND circuits GA5 to GA12 supply a signal of "H" when the three inputs are all at "H". Each of the OR gate circuits GO1 to GO4 supplies a signal of "H" when at least one of the two inputs is at "H". Selection control signals IS0' to IS3' are generated from the gate circuits GO1 to GO4, respectively.

FIG. 34 is a diagram showing, in a table, the logical operation performed by the first circuit 712a' of FIG. 33. As shown in FIG. 34, any one of the control signals IS0' to IS3' attains "H" in accordance with a combination of the internal column address bits C0' and C1' of 2 least significant bits and the control signals S0' and S1' indicating the results of comparison.

From the address comparing circuits 81 and 82 shown in FIG. 32, there are generated not only the control signals S0' and S1' indicating the results of comparison between an input column address and the defective column addresses stored in the defective column program circuits 83 and 84, respectively but also the control signals S0 (−1)' and S1 (−1)' indicating the results of comparison between an input column address and addresses smaller in value than these defective column addresses by 1 (the first defective column address is hereinafter referred to as CB1 and the second defective column address is referred to as CB2).

Figure 35:
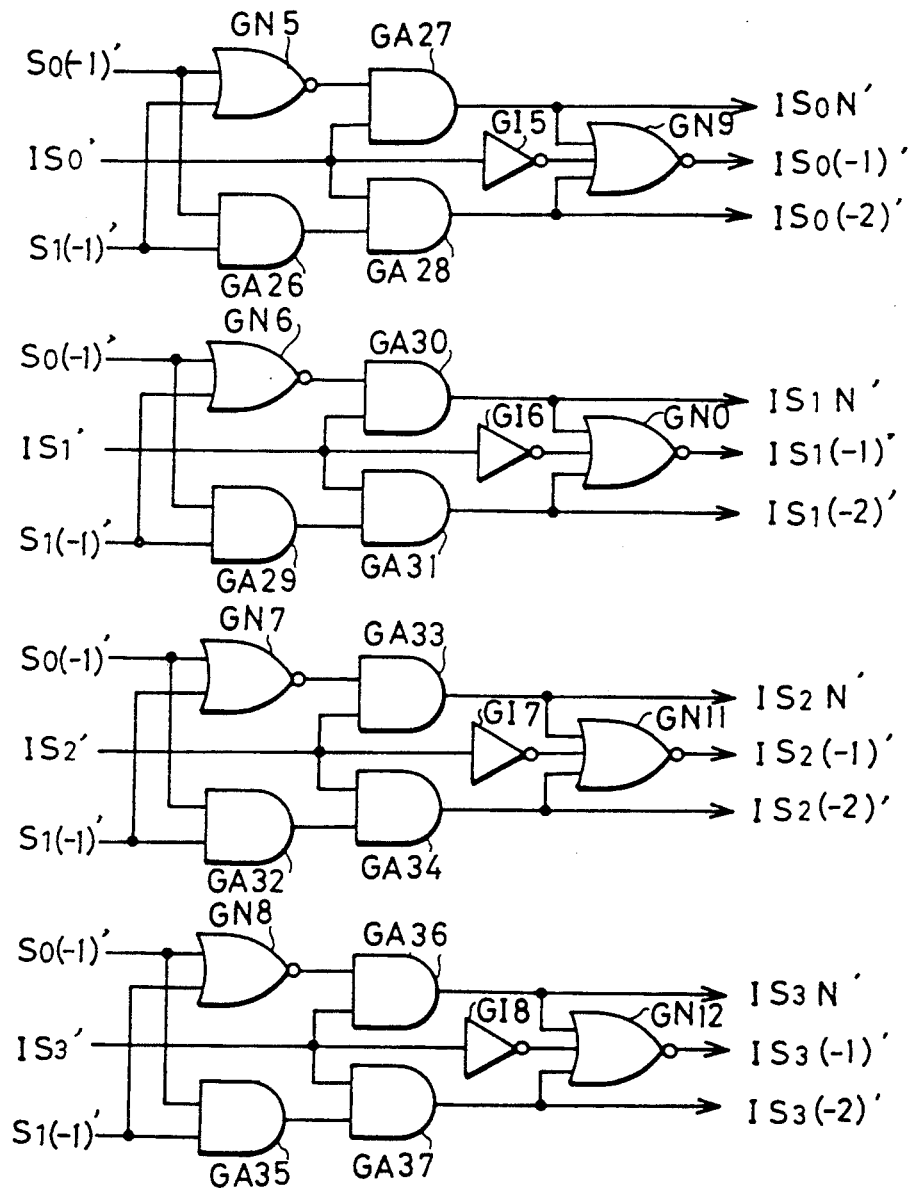
FIG. 35 is a diagram showing a structure of the output stage of an address converting circuit used in combination with the circuit shown in FIG. 33.

FIG. 35 is a diagram showing a structure of an output stage of the input/output selection control circuit. In FIG. 29, the second circuit 712b' constituting the output stage of the input/output selection control circuit 712 includes NOR circuits GN5 to GN8 for supplying a signal of "H" only when received input signals are all at "L", AND circuits GA26 to GA37, inverter circuits GI5 to GI8 and NOR circuits GN9 to GN12.

The gate circuit GN5 receives the control signals S0 1 (−1)' and S1 (−1)'. The AND circuit GA26 receives the control signals S0 (−1)' and S1 (−1)'. The AND circuit GA27 receives the output of the NOR circuit GN5 and the control signal IS0'. The AND circuit GA28 receives the control signal IS0' and the output of the AND circuit GA26. The inverter circuit GI5 receives the control signal IS0'. The NOR circuit GN9 receives the outputs of the AND circuits GA27 and GA28 and the output of the inverter circuit GI5. The control signal IS0N' is generated from the AND circuit GA27. The control signal IS0 (−1)' is generated from the NOR circuit GN9. The control signal IS0 (−2)' is generated from the AND circuit GA28.

In each of the remaining circuit blocks, the connecting manner between the gates is the same and a control signal ISk (k=1 to 3) applied thereto is only different. Control signals IS1N' to IS1 (−2)' are generated from the circuit block which receives the control signal IS1'. Control signals IS2N' to IS2 (−2)' are generated from the circuit block to which the control signal IS2' is supplied. Control signals IS3N' to IS3 (−2)' are generated from the circuit block to which the control signal IS3' is applied.

Figure 36A:
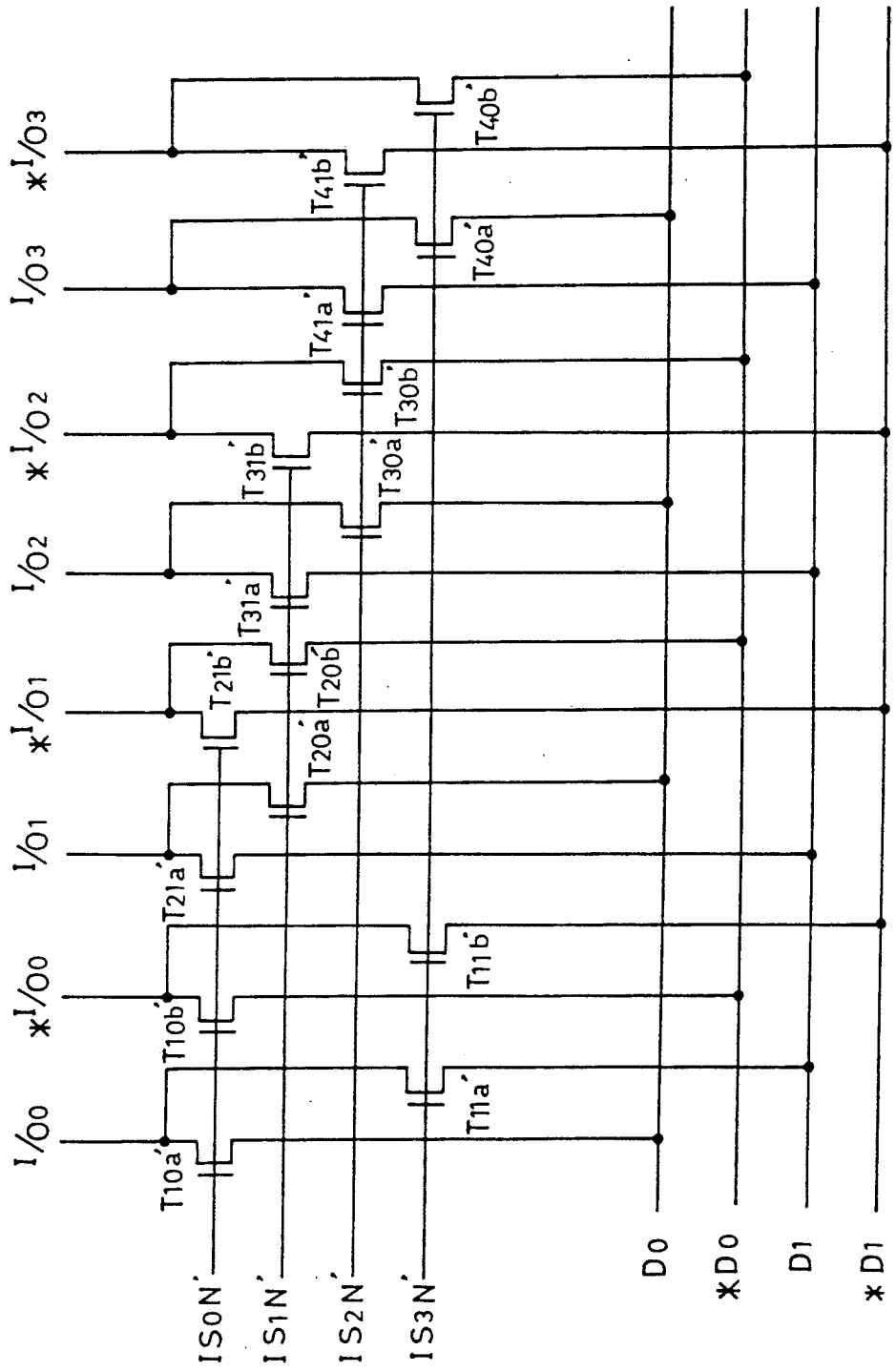
FIG. 36A is a diagram showing a specific structure of an input/output selection circuit used in combination with the circuit shown in FIG. 31A to 37.
Figure 36B:
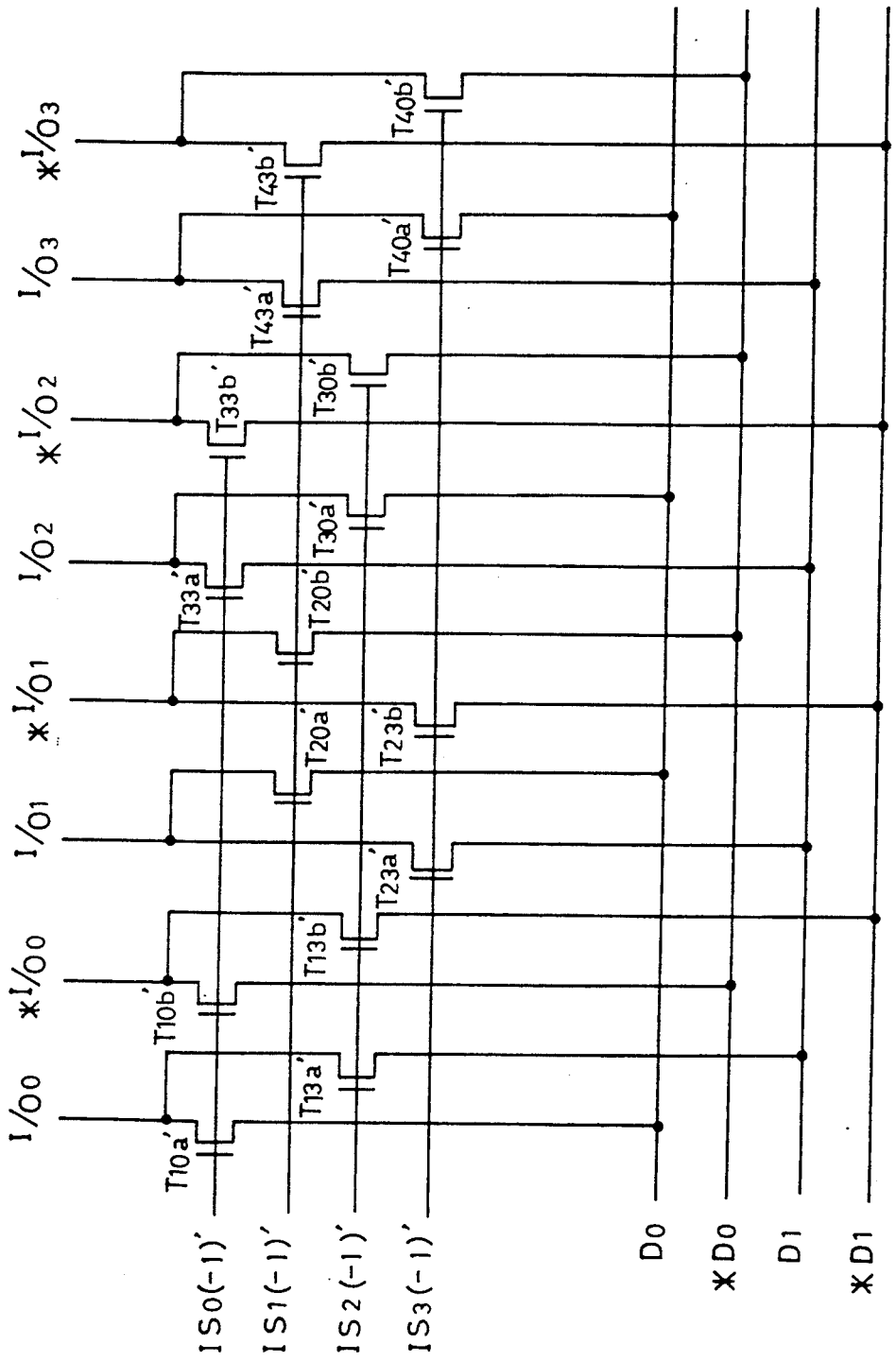
FIG. 36B is a diagram showing a specific structure of an input/output selection circuit used in combination with the circuits shown in FIGS. 31A to 33.
Figure 36C:
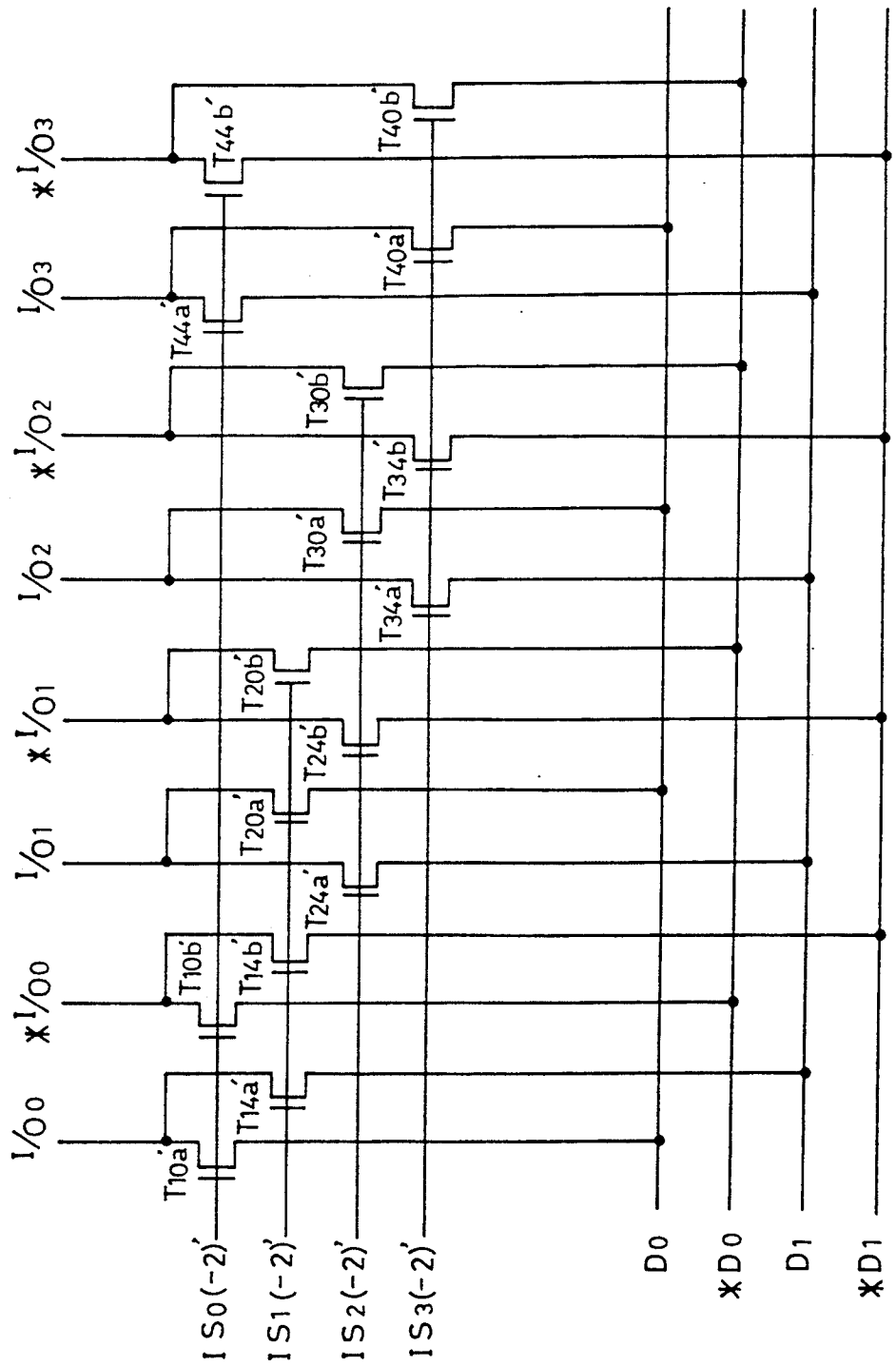
FIG. 36C is a diagram showing a specific structure of an input/output selection circuit used in combination with the circuits shown in FIGS. 31A to 33.

FIGS. 36A to 36C are diagrams showing structures of input/output selection circuits for repairing two defective columns. While the circuit structures of FIGS. 36A to 36C are shown independently of each other, this is only for making it possible to easily understand the connecting manner between internal data transmission line pairs and a common data bus when a selection control signal is applied. Each control signal in separate figures and a logical sum of each control signal is, in practice applied to transfer gate transistors indicated by the same reference numerals.

FIG. 36A is a diagram showing a structure of an input/output selection circuit related to the control signals IS0N' to IS3N'. In FIG. 36A, the transfer gate transistors T10a' and T10b' connect the internal data transmission line pair I/O0, *I/O0 to the common data bus line pair D0, *D0. The transfer gate transistors T11a' and T11b' connect the internal data transmission line pair I/O0, *I/O0 to the common data bus line pair D1, *D1 in response to the control signal IS3N'.

The transfer gate transistors T21a' and T21b' connect the internal data transmission line pair I/O1, *I/O1 to the common data bus line pair D1, *D1 in response to the control signal IS0N'. The transfer gate transistors T20a' and T20b' connect the internal data transmission line pair I/O1, *I/O1 to the common data bus line pair D0, *D0 in response to the control signal IS1N'.

The transfer gate transistors T31a' and T31b' connect the internal data transmission line pair I/O2, *I/O2 to the common data bus line pair D1, *D1 in response to the control signal IS1N'. The transfer gate transistors T30a', T30b' connect the internal data transmission line pair I/O2, *I/O2 to the common data bus line pair D0, *D0 in response to the control signal IS2N'.

The transfer gate transistors T41a' and T41b' connect the internal data transmission line pair I/O3, *I/O3 to the common data bus line pair D1, *D1 in response to the control signal IS2N'. The transfer gate transistors T40a' and T40b' connect the internal data transmission line pair I/O3, *I/O3 to the common data bus line pair D0, *D0 in response to the control signal IS3N'.

FIG. 36B is a diagram showing a structure of an input/output selection circuit related to the control signals IS0 (−1)' to IS3 (−1)'. In FIG. 36B, the transfer gate transistors T10a' and T10b' connect the internal data transmission line pair I/O0, *I/O0 to the common data bus line pair D0, *D0 in response to the control signal IS0 (−1)'. The transfer gate transistors T13a' and T13b' connect the internal data transmission line pair I/O0, *I/O0 to the common data bus line pair D1, *D1 in response to the control signal IS2 (−1).

The transfer gate transistors T20a' and T20b' connect the internal data transmission line pair I/O1, *I/O1 to the common data bus line pair D0, *D0 in response to the control signal IS1 (−1)'. The transfer gate transistors T23a' and T23b' connect the internal data transmission line pair I/O1, *I/O1 to the common data bus line pair D1, *D1 in response to the control signal IS3 (−1).

The transfer gate transistors T33a' and T33b' connect the internal data transmission line pair I/O2, *I/O2 to the common data bus line pair D1, *D1 in response to the control signal IS0 (−1). The transfer gate transistors T30a' and T30b' connect the internal data transmission line pair I/O2, *I/O2 to the common data bus line pair D0, *D0 in response to the control signal IS2 (−1)'.

The transfer gate transistors T43a' and T43b' connect the internal data transmission line pair I/O3, *I/O3 to the common data bus line pair D1, *D1 in response to the control signal IS1 (−1)'. The transfer gate transistors T40a' and T40b' connect the internal data transmission line pair I/O3, *I/O3 to the common data bus line pair D0, *D0 in response to the control signal IS3 (−1)'.

FIG. 36C is a diagram showing a structure of an input/output selection circuit related to the control signals IS0 (−2)' to IS3 (−2)'.

In FIG. 36C, the transfer gate transistors T10a' and T10b' connect the internal data transmission line pair I/O0, *I/O0 to the common data bus line pair D0, *D0 in response to the control signal IS0 (−2)'. The transfer gate transistors T14a' and T14b' connect the internal data transmission line pair I/O0, *I/O0 to the common data bus line pair D1, *D1 in response to the control signal IS1 (−2)'.

The transfer gate transistors T20a' and T20b' connect the internal data transmission line pair I/O1, *I/O1 to the common data bus line pair D0, *D0 in response to the control signal IS1 (−2)'. The transfer gate transistors T24a' and T24b' connect the internal data transmission line pair I/O1, *I/O1 to the common data bus line pair D1, *D1 in response to the control signal IS2 (−2)'.

The transfer gate transistors T30a' and T30b' connect the internal data transmission line pair I/O2, *I/O2 to the common data bus line pair D0, *D0 in response to the control signal IS2 (−2)'. The transfer gate transistors T34a' and T34b' connect the internal data transmission line pair I/O2, *I/O2 to the common data bus line pair D1. *D1 in response to the control signal IS3 (−2)'.

The transfer gate transistors T44a' and T44b' connect the internal data transmission line pair I/O3, *I/O3 to the common data bus line pair D1, *D1 in response to the control signal IS0 (−2)'. The transfer gate transistors T40a' and T40b' connect the internal data transmission line pair I/O3, *I/O3 to the common data bus line pair D0, *D0 in response to the control signal IS3 (−2)'.

The operation thereof will now be described.

If there is no defective bit or the internal column address CA is smaller in value than the first defective column address CB1, the output signals S0' and S1' from the address comparing circuits 81 and 82 are both at "H". In this case, in accordance with the relationship of the input/output signals shown in FIG. 34, the control signals IS0', IS1', IS2' and IS3' are generated for respective combinations of (L, L), (L, H), (H, L), (H, H) of 2 least significant bits of low border (C1', C0') in the internal column address CA.

Furthermore, in the second circuit 712b' shown in FIG. 35, if the internal column address CA is smaller in value than the first defective column address CB1 by 2 or more, the control signals IS0N' to IS3N' are generated corresponding to the control signals IS0' to IS3', respectively, and are brought to "H" since the control signals S0 (−1)' and S1 (−)' are both at "L".

If the internal column address CA is smaller in value than the first defective column address CB1 by 1, the control signal S0 (−1)' attains "H" and S1 (−1)' attains "L". In this case, the control signals IS0 (−1)' to IS3 (−1)' are generated corresponding to the respective control signals IS0' to IS3' and brought to "H".

If the internal column address CA is smaller in value than the first defective column address CB1 by 1 and is also smaller in value than the second defective column address CB2 by 1, the control signals S0 (−1)' and S1 (−1)' both attain "H". In this case, the control signals IS0 (−2)' to IS3 (−2)' are generated corresponding to the control signals IS0 to IS3, respectively.

If the internal column address CA is equal to or larger in value than the first defective column address CB1 and smaller in value than the second defective column address CB2, the output signals S0' and S1' generated from the address comparing circuits 81 and 82 attain "L" and "H", respectively. In this case, in accordance with the relationship between signals shown in FIG. 34, the control signals IS1', IS2' IS3', and IS0' respectively attain "H" for each state (L, L) (L, H), (H, L), (H, H) of 2 least significant bits (C1', C0') in the internal column address CA.

In this state, in the first circuit 712b shown in FIG. 35, if the internal column address CA is smaller in value than the second defective column address CB2 by 2 or more, the control signals IS0N' to IS3N' attain "H" corresponding to the respective control signals IS0' to IS3'. If the internal column address CA is smaller in value than the second defective column address CB2 by 1, the control signals IS0 (−1)' to IS3 (−1)' attain "H" corresponding to the control signals IS0' to IS3'.

If the internal column address CA is equal to or larger in value than the second defective column address CB2, the outputs S0' and S1' of the address comparing circuits 81 and 82 both attain "L", so that the control signals IS2', IS3', IS0', IS1' attain "H" respectively corresponding to a states (L, L), (L, H), (H, L), (H, H) of 2 least significant bits (C1', C0') in the internal column address CA.

The control signals IS2N', IS3N', IS0N', and IS1N' attain "H" corresponding to "H" of the control signals IS2', IS3', IS0' and IS1', respectively.

A specified example will now be described.

Suppose that there are defective bits memory cells connected to the bit line pairs BL2, *BL2 and BL4, *BL4. In this case, the first defective column address CB2 programmed in the first defective column program circuit 83 becomes "2" and the second defective column address CB program in the second defective column program circuit 84 becomes "3" which is smaller in value than the actual defective column address by 1.

If the external column address is "0" and the decoder circuit CD0 in the first column decoder 15 is selected, the NAND circuits NA0', NA1', NA2' and NA3' in the second column decoder 16' are selected. In this case, the selection gate transistors Tr0', Tr0' to Tr3', Tr3' are brought to the on-state and the bit line pairs BL0, *BL0 to BL3, *BL3 are connected to the internal data transmission line pairs I/O0, *I/O0 to I/O3, *I/O3, respectively. The internal column address CA is "0", which leads to C1'=C0'="L" and S0'=S1'="H". The control signal IS0' attains "H" in this state.

Since the internal column address CA is smaller in value than the first defective column address CB1 by 2 or more, which leads to S0 (−1)'=S1 (−1)'="L", the control signal IS0N' attains "H". Therefore, in this case, in the input/output selection circuit shown in FIG. 36A, the transfer gate transistors T10a', T10b', T21a', T21b' are brought to the on-state and the internal data transmission line pairs I/O0, *I/O0, I/O1, *I/O1 are connected to the common data bus line pairs D0, *D0, D1, *D1, respectively. The bit line pairs BL0, *BL0 and BL1, *BL1 are selected.

If the external column address is "1" and the decoder circuit CD1 in the first column decoder 15 is selected, the NAND circuits NA1', NA2', NA3' and NA4' are selected in the second column decoder 16'. At this time, the selection gate transistors Tr1, Tr1' to Tr4, Tr4' are brought to the on-state and the bit line pairs BL1, *BL1, BL2, *BL2, BL3, *BL3, and BL4, *BL4 are connected to the internal data transmission line pairs I/O1, *I/O1, I/O2, *I/O2, I/O3, *I/O3, and I/O0, *I/O0, respectively.

The internal column address CA is "1" with C1="L", C0="H", S0'=S1'="H", and the control signal IS1' is generated from the first circuit 712a' shown in FIG. 33.

The internal column address CA is smaller in value than the first defective column address CB1 by 1, and therefore S0 (−1)'="H" and S1 (−1)'="L", and then control signals IS1 (−1)' attains "H". Therefore, in the input/output selection circuit shown in FIG. 36B, the transfer gate transistors T20a', T20b', T43a', T43b' are brought to the on-state and the internal data transmission line pairs I/O1, *I/O1, I/O3, *I/O3 are connected to the common data bus line pairs D0, *D0, D1, *D1, respectively. The bit line pairs BL1, *BL1 and BL3, *BL3 are selected.

If the external column address is "2" and the decoder circuit CD2 is selected in the first column decoder 15, the NAND circuits NA2', NA3', NA4', and NA5' are selected in the second column decoder 16' and the selection gate transistors Tr2, Tr2' to Tr5, Tr5' are brought to the on-state. As a result, the internal data transmission line pairs I/O2, *I/O2, I/O3, *I/O3, I/O0, *I/O0, I/O1, *I/O1 are connected to the bit line pairs BL2, *BL2, BL3, *BL3, BL4, *BL4, and BL5, *BL5, respectively.

The internal column address CA is "2", and it leads to C1'="H", C0'="L", S0'="L", S1'="H". In this case, the control signal IS3' is generated from the first circuit 712a' shown in FIG. 33.

The internal column address CA is equal to the first defective column address CB1 and smaller in value than the second defective column address CB2 by 1, and it leads to S0 (−1)'="L", S1 (−1)'="H" and the control signal IS3 (−1)' is generated from the second circuit 712b' shown in FIG. 35. Therefore, in the input/output selection circuit shown in FIG. 36B, the transfer gate transistors T23a', T23b', and T40a', T40b' are brought to the on-state and the internal data transmission line pairs I/O3, *I/O3, and I/O1, *I/O1 are connected to the common data bus line pairs D0, *D0, and D1, *D1, respectively. The bit line pairs BL3, *BL3 and BL5, *BL5 are selected.

If the external column address is "3" and the decoder circuit CD3 is selected in the first column decoder 15, the NAND circuits NA3', NA4', NA5', and NA6' are selected in the second column decoder 16'. In this case, the selection gate transistors Tr3, Tr3' to Tr6, Tr6' are brought to the on-state and the internal data transmission line pairs I/O3, *I/O3, I/O0, *I/O0, I/O1, *I/O1, and I/O2, *I/O2 are connected to the bit line pairs BL3, *BL3, BL4, *BL4, BL5, *BL5, and B16, *BL6, respectively.

The internal column address CA is "3", and it leads to C1'="H", C0'="H", S0'=S1'="L", and the control signal IS1' attains "H".

The internal column address CA is equal in value to the second defective column address CB2, and it leads to S0 (−1)'="L", and S1 (−1)'="L" and the control signal IS1N' is generated from the first circuit 712b'. Therefore, in the input/output selection circuit shown in FIG. 36A, the transistors T20a', T20b', and T31a', T31b' are brought to the on-state and the internal data transmission line pairs I/O1, *I/O1, and I/O2, *I/O2 are connected to the common data bus line pairs D0, *D0, and D1, *D1, respectively. The bit line pairs BL5, *BL5 and BL6, *BL6 are selected.

If the external column address is "4" and the decoder circuit CD4 in the first column decoder 15 is selected, the NAND circuits NA4', NA5', NA6' and NA7' in the second column decoder 16' are selected and the selection gate transistors Tr4, T4' to Tr7, Tr7' are brought to the on-state. In this case, the internal data transmission line pairs I/O0, *I/O0, I/O1, *I/O1, I/O2, *I/O2, and I/O3, *I/O3 are connected to the bit line pairs BL4, *BL4, BL5, *BL5, BL6, *BL6 and BL7, *BL7, respectively.

The internal column address CA is "4", and it leads to C1'="L", C0'="L", S0'=S1'="L" and the control signal IS2' is generated from the first circuit 712a' shown in FIG. 33.

The internal column address CA is equal to or larger in value than the second defective column address CB2, and it leads to S0 (−1)'="L", S1 (−1)'="L", and the control signal IS2N' is generated from the second circuit 712b' shown in FIG. 35. Therefore, in the input-/output selection circuit shown in FIG. 36A, the transistors T30a', T30b', and T41a', T41b' are brought to the on-state and the internal data transmission line pairs I/O2, *I/O2, I/O3, *I/O3 are connected to the common data bus line pairs D0, *D0, D1, *D1, respectively. The bit line pairs BL6, *BL6 and BL7, *BL7 are selected.

A description will now be made as to a structure for repairing three defective columns by selecting only one internal data transmission line pair from four internal data transmission line pairs.

Figure 37:
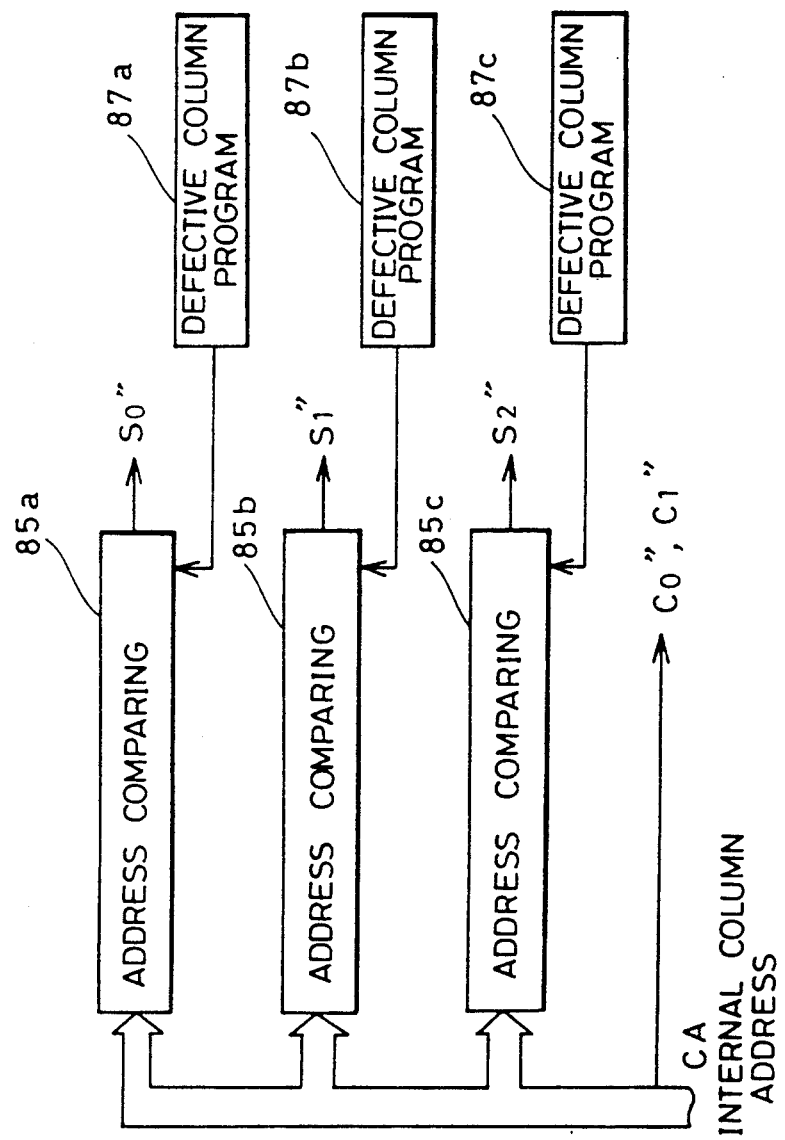
FIG. 37 is a diagram showing still another embodiment of the structure of the address comparing portion in the input/output selection control circuit block shown in FIG. 27.

FIG. 37 is a diagram showing a structure of an address comparing portion used in a structure for repairing three defective columns. In FIG. 37, the address comparing circuit block includes first, second, and third address comparing circuits 85a, 85b and 85c and first, second and third defective column program circuits 87a, 87b and 87c. These address comparing circuits 85a to 85c have the same structure as the address comparing circuit shown in FIG. 9. The first defective column program circuit 87a stores a minimum defective column address. The second defective column program circuit 87b stores a column address (a second defective column address) smaller in value than the intermediate defective column address by 1. The third defective column program circuit 87c stores an address (a third defective column address) CB3 smaller in value than the maximum defective column address by 2.

Figure 38A:
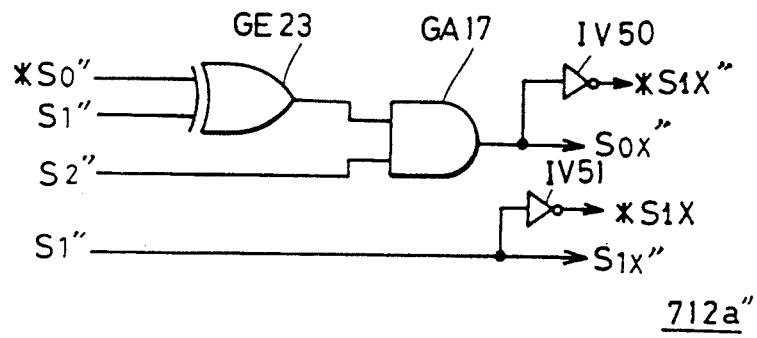
FIGS. 38A and 38B are diagrams showing still another structure of the address converting circuit shown in FIG. 27.

FIGS. 38A and B are diagrams showing one example of a specific structure of the input/output selection control circuit 712 for repairing these three defective columns. In FIG. 38A, a first circuit 712a', constituting the input stage of the input/output selection control circuit 712 includes a gate circuit GE23 for receiving a complementary signal *S0" of a control signal S0" from the address comparing circuit 85a and a control signal S1" from the address comparing circuit 85b, a gate circuit GA17 for receiving the output of the gate circuit GE23 and a control signal S2" from the address comparing circuit 85C, an inverter circuit IV50 for receiving the output of the gate circuit GA17, and an inverter circuit IV51 for receiving the control signal S1" from the address comparing circuit 85b. The gate circuit GE23 takes an exclusive logical sum of the received signals. The gate circuit GA17 takes a logical product of the received signals. The inverter circuit IV50 generates a control signal S0X" and the inverter circuit IV51 supplies a control signal *S1X".

Figure 38B:
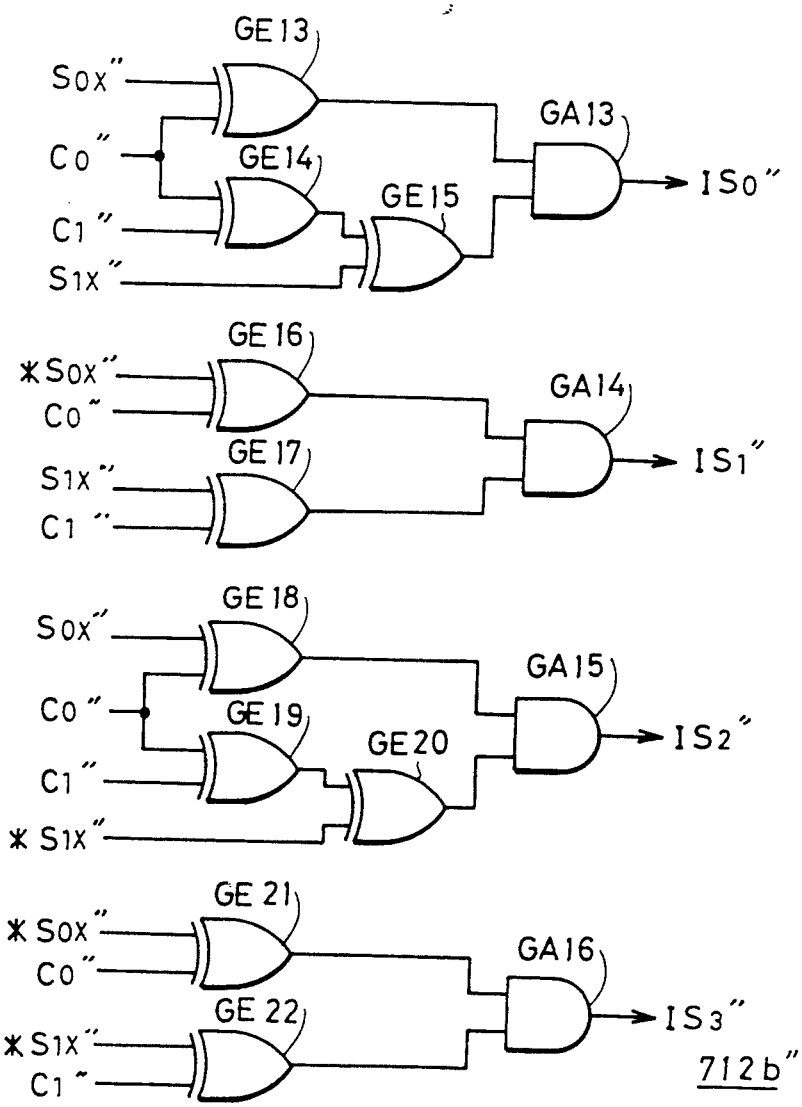

In FIG. 38B, a second circuit 712b" constituting the output stage of the input/output selection control circuit 712 includes 2-input gate circuits GE13 to GE20 for effecting an exclusive logical sum operation for applied signals and 2-input gate circuits GA13 to GA16 for effecting a logical product operation for received signals. The gate circuit GE 13 receives the control signal S0X" and a column address signal bit C0". The gate circuit GE14 receives column address bits C0" and C1". The gate circuit GE15 receives the output of the gate circuit GE14 and a control signal S1X". The gate circuit GA13 receives the outputs of the gate circuits GE13 and GE15. A selection control signal IS0" is generated from the gate circuit GA13.

The gate circuit GE16 receives a control signal *S0X" and the column address bit C0". The gate circuit GE17 receives the control signal S1X" and the column address bit C1". The gate circuit GA14 receives the outputs of the gate circuits GE16 and GE17.

A control signal IS1" is generated from the gate circuit GA14.

The gate circuit GE18 receives the control signal S0X" and the column address bit C0". The gate circuit GE19 receives column address bits C0" and C1". The gate circuit GE20 receives the output of the gate circuit GE19 and the control signal *S1X". The gate circuit GA15 receives the outputs of the gate circuits GE18 and GE20. A control signal IS2" is generated from the gate circuit GA15.

The gate circuit GE21 receives the control signal *S0X" and the column address bit C0". The gate circuit GE22 receives the control signal *S1X" and the column address bit C1". The gate circuit GA16 receives the outputs of the gate circuits GE21 and GE22. A control signal IS3" is generated from the gate circuit GA16.

FIG. 39 is a diagram showing, in a table, the relationship between input and output signals of the input/output selection control circuit shown in FIGS. 38 A and B. As shown in FIG. 39, any one of the control signals IS0" to IS3" is generated in accordance with a combination of the column address bits C1", C0" and the control signals S0", S1", S2".

Figure 40:
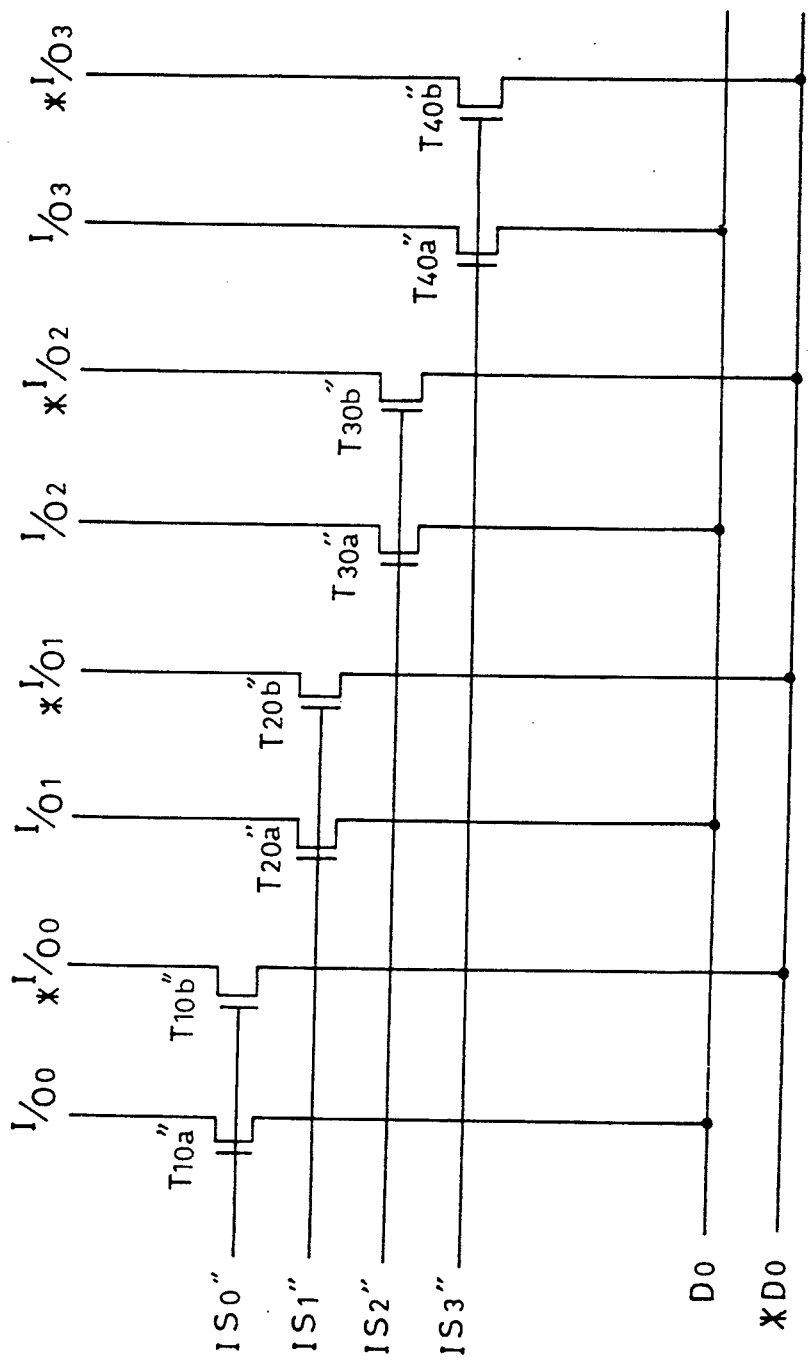
FIG. 40 is a diagram showing a specific structure of an input/output selection circuit used in combination with the address converting circuit shown in FIG. 38.

FIG. 40 is a diagram showing a structure of an input/output selection circuit for repairing these three defective columns. In FIG. 40, transfer gate transistors T10a'', T10b'' connect the internal data transmission line pair I/O0, *I/O0 to the common data bus line pair D0, *D0 in response to the control signal IS0''. Transfer gate transistors T20a'', T20b'' connect the internal data transmission line pair I/O1, *I/O1 to the common data bus line pair D0, *D0 in response to the control signal IS1''.

Transfer gate transistors T30a'', T30b'' connect the internal data transmission line pair I/O2, *I/O2 to the common data bus line pair D0, *D0 in response to the control signal IS2''. Transfer gate transistors T40a'', T40b'' connect the internal data transmission line pair I/O3, *I/O3 to the common data bus line pair D0, *D0 in response to the control signal IS3''. The operation thereof will be described in the following.

If there is no defective bit, or the internal column address CA is smaller in value than the first defective column address or the first defective column address CB1 programmed in the first defective column program circuit 87a, the output signals S0'', S1'', and S2'' from the address comparing circuits 85a to 85c all attain "H". In this case, in the input/output selection control circuit 712 (712a'', 712b'') shown in FIGS. 38A and B, the control signals IS0'', IS1'', IS2'' and IS3'' are generated respectively for the states (L, L), (L, H), (H, L), and (H, H) of 2 least significant bits (C1'', C0'') in the internal column address CA.

If the internal column address CA is equal to or larger in value than the first defective column address CB1 and smaller in value than the second defective column address CB2, the output signal S0'' of the first address comparing circuit 85a attains "L" and the output signals S1'' and S2'' from the second and the third address comparing circuits 85b and 85c attain "H". In this case, in accordance with the table in FIG. 39, the control signals IS1'', IS2'', IS3'' and IS0'' are generated respectively for the states (L, L), (L, H), (H, L), and (H, H) of 2 least significant bits (C1'', C0'') in the internal column address CA.

If the internal column address CA is equal to or larger in value than the second defective column address CB2 and smaller in value than the third defective column address CB3, the output signals S0'' and S1'' of the first and the second address comparing circuits 85a and 85b attain "L" and the output signal S2'' of the third address comparing circuit 85c attains "H". Therefore, in accordance with the table of FIG. 39, the control signals IS2'', IS3'', IS0'', and IS1'' are generated respectively for the states (L, L), (L, H), (H, L), and (H, H) of 2 least significant bits (C1'', C0'') in the internal column address CA.

If the internal column address CA is equal to or larger in value than the third defective column address CB3, the output signals S0'', S1'', and S2'' from the address comparing circuits 85a to 85c are all at "L". In this case, in accordance with the table of FIG. 39, the control signals IS3'', IS0'', IS1'', and IS2'' are generated respectively for the states (L, L), (L, H), (H, L), and (H, H) of 2 least significant bits of (C1'', C0'') in the internal column address CA.

Suppose that there are defective bits in the memory cells connected to the bit line pairs BL1, *BL1, BL2, *BL2, and BL6, *BL6, for example. In this case, the first defective column address CB1 becomes "1", the second defective column address CB2 becomes "1", and the third defective column address CB3 becomes "4".

If the external column address is "0" and the decoder circuit CD0 is selected in the first column decoder 15, the NAND circuits NA0', NA1', NA2' and NA3' are selected in the second column decoder 16'. In this case, the transistors Tr0, Tr0' to Tr3, Tr3' are brought to the on-state and the internal data transmission line pairs I/O0, *I/O0 to I/O3, *I/O3 are connected to the bit line pairs BL0, *BL0 to BL3, *BL3, respectively.

The internal column address CA is "0", which leads to C1''=C0''="L", S0''=S1''=S2''="H". In this case, the control signal IS0'' is generated in the input/output selection control circuit 712 shown in FIGS. 38A and 38B. In this case, in FIG. 40, the transfer gate transistors T10a'', T10b'' are brought to the on-state and the internal data transmission line pair I/O0, *I/O0 is connected to the common data bus line pair D0, *D0. The bit line pair BL0, *BL0 is selected.

If the external column address is "1" and the decoder circuit CD1 is selected in the column decoder 15, the NAND circuits NA1', NA2', NA3' and NA4' are selected in the second column decoder 16' and the selection gate transistors Tr1, Tr1' to Tr4, Tr4' are brought to the on-state. In this state, the internal data transmission line pairs I/O1, *I/O1, I/O2, *I/O2, I/O3, *I/O3, and I/O0, *I/O0 are connected to the bit line pairs BL1, *BL1, BL2, *BL2, BL3, *BL3, and BL4, *BL4, respectively.

Since the internal column address CA is "1", which leads to C1''="L", C0''="H", S0''=S1''="L", and S2''="H", the control signal IS3'' is generated from the second circuit 712b'' shown in FIG. 38B. In this case, the transfer gate transistors T40a'', T40b'' are brought to the on-state and the internal data transmission line pair I/O3, *I/O3 is connected to the common data bus line pair D0, *D0. In this case, the bit line pair BL3, *BL3 is connected to the input/output circuit.

If the external column address is "2" and the decoder circuit CD2 is selected in the first column decoder 15, the NAND circuits NA2', NA3', NA4', and NA5' are selected in the second column decoder 16' and the selection gate transistors Tr2, Tr2' to Tr5, Tr5' assume an on-state. In this state, the internal data transmission line pairs I/O2, *I/O2, I/O3, *I/O3, I/O0, *I/O0, and I/O1, *I/O1 are connected to the bit line pairs BL2, *BL2, BL3, *BL3, BL4, *BL4, and BL5, *BL5, respectively.

Since the internal column address CA is "2", it leads to C1''="H", C0''="L", S0''=S1''="L", and S2''="H", the control signal IS0'' is generated from the second circuit 712b''. In this state, the transfer gate transistors T10a'', T10b'' assume an on-state and the bit line pair BL4, *BL4 is connected to the common data bus line pair D0, *D0 over the internal data transmission line pair I/O0, *I/O0.

If the external column address is "3" and the decoder circuit CD3 is selected in the first column decoder 15, the NAND circuits NA3', NA4', NA5' and NA6' are selected in the second column decoder 16' and the selection gate transistors Tr3, Tr3' to Tr6, Tr6' assume an on-state. In this state, the internal data transmission line pairs I/O3, *I/O3, I/O0, *I/O0, I/O1, *I/O1, I/O2, *I/O2 are connected to the bit line pairs BL3, *BL3, BL4, *BL4, BL5, *BL5, and BL6, *BL6, respectively.

Since the internal column address CA is "3", which leads to C1''="H", C0''="H", S0''=S1''="L", S2''="H" and the control signal IS1'' is generated from the second circuit 712b″ shown in FIG. 38B. In this stage, the transfer gate transistors T20a″, T20b″ are brought to the on-state in FIG. 40 and the bit line pair BL5, *BL5 is connected to the common data bus line pair D0, *D0 over the internal data transmission line I/O1, *I/O1.

If the external column address is "4" and the decoder circuit CD4 is selected in the first column decoder 15, the NAND circuits NA4′, NA5′, NA6′, and NA7′ are selected in the second column decoder 16′. In this case, the selection gate transistors Tr3, Tr3′ to Tr6, Tr6′ are brought to the on-state and the internal data transmission line pairs I/O3, *I/O3, I/O0, *I/O0, I/O1, *I/O1, I/O2, *I/O2 are connected to the bit line pairs BL3, *BL3, BL4, *BL4, BL5, *BL5 and BL6, *BL6, respectively.

The internal column address CA is "3", leading to C1″="H", C0″="H", S0″=S1″="L", and S2″="H" and, in accordance with the table of the relationship between signals shown in FIG. 39, the control signal IS1″ is generated from the second circuit 712b″. In this case, the bit line pair BL5, *BL5 is connected to the common data bus line pair D0, *D0 through the internal data transmission line pair I/O1, *I/O1.

If the external column address is "4" and the decoder circuit CD4 is selected in the first column decoder 15, the NAND circuits NA4′, NA5′, NA6′ and NA7′ are selected in the second column decoder 16′ and the selection gate transistors Tr4, Tr4′ to Tr7, Tr7′ are brought to the on-state. In this state, the internal data transmission line pairs I/O0, *I/O0, I/O1, *I/O1, *I/O2, I/O2, I/O3, *I/O3 are connected to the bit line pair BL4, *BL4, BL5, *BL5, BL6, *BL6, BL7, *BL7, respectively.

Since the internal column address CA is "4", which leads to C1″=C0″="L" and S0″=S1″=S2″="L". In this state, the control signal IS3″ is generated from the input/output selection control circuit 712 (712a″, 712b″) shown in FIGS. 38A and 38B. Therefore, in the input/output selection circuit shown in FIG. 40, the transfer gate transistors T40a″, T40b″ are brought to the on-state and the bit line pair BL7, *BL7 is connected to the common data bus line pair D0, *D0 through the internal data transmission line pair I/O3, *I/O3.

Then every time the column address increases by 1, a bit line pair is sequentially connected to the common data bus line pair D0, *D0 through an internal data transmission line pair. The internal data transmission line pair selected at this time is determined by the control signals IS1″ to IS3″ and these control signals are determined by 2 least significant bits C1″, C0″ in the column address.

Providing an additional selection control circuit as described above makes it possible to set the number of data input/output bits of a semiconductor memory device in accordance with the number of defective columns which exist internally and to obtain a semiconductor memory device with a higher product yield.

This structure can be further into a structure with multibits. For example, a NAND circuit contained in the second column decoder 16′ is connected to receive outputs of five decoder circuits so that five pairs of bit lines may be simultaneously selected in the structure. In this case, if one pair of bit lines is assigned for redundancy, any adjoining memory cells of 4 bits or memory cells of 4 bits corresponding to an external column address can be accessed simultaneously. Therefore, this scheme can be also employed as applied a high-speed mode in place of the nibble mode or the static mode supported in a normal semiconductor memory device. That is, a semiconductor memory device can be obtained in which writing/reading of data can be performed at high speed when the structure is adapted such that 4 bits are simultaneously, externally selected in response to an arbitrary external column address, the memory cells of 4 bits simultaneously selected are sequentially connected to an input/output buffer of 1 bit (input/output circuit), for example, starting with a bit line pair defined by 2 least significant bits of the column address or in the order of the number of the internal data output line pairs.

Figure 41:
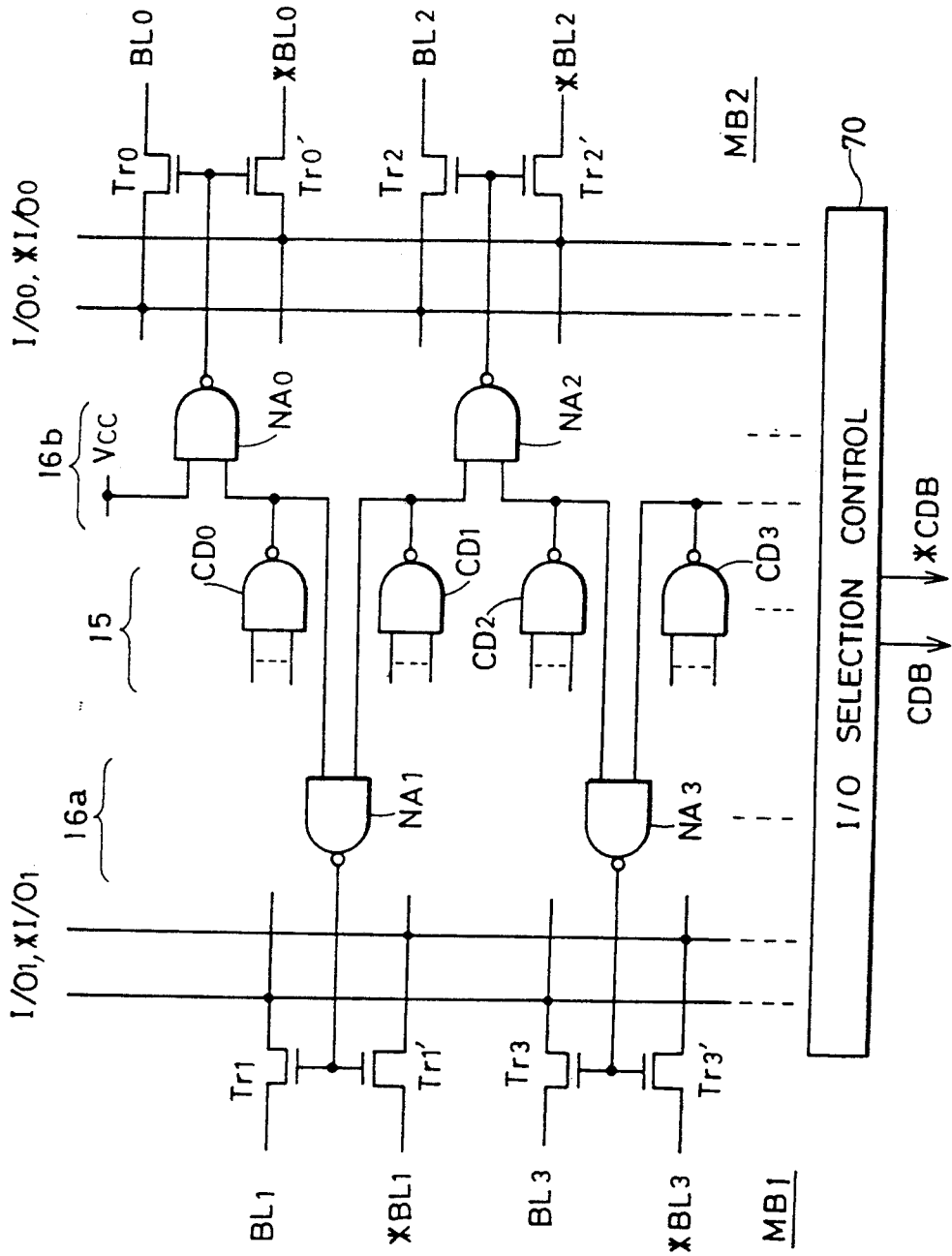
FIG. 41 is a diagram showing a structure of column selecting circuitry in a semiconductor memory device in accordance with a fourth aspect of the invention.

FIG. 41 is a diagram schematically showing still another example of a structure of a column selecting circuitry in a semiconductor memory device having this defect repairing function. In FIG. 41, a memory cell array is divided into two blocks MB1 and MB2.

Second column decoders 16a and 16b are provided for the memory cell blocks MB1 and MB2. The first memory block MB1 includes bit line pairs of odd numbers and the second memory block MB2 includes bit line pairs of even numbers. In this structure, when one decoder circuit CDi is selected, one column is selected from each of the memory cell blocks MB1 and MB2. The selected bit line pair of the memory cell block MB1 is connected to the internal data transmission line pair I/O1, *I/O1. The selected bit line pair of the memory cell block MB2 is connected to the internal data transmission line pair I/O0, *I/O0. The internal data transmission line pairs I/O1, I/O1 and I/O0, *I/O0 are connected to an I/O selection control block 70. The selection control block 70 connects one of the two internal data transmission line pairs I/O0, *I/O0 and I/O1, *I/O1 to a common data bus line pair CDB, *CDB. Therefore, in the circuit structure shown in FIG. 41 as well, a combination of bit line pairs simultaneously selected by one decoder circuit can be changed and one defective column can be repaired in the same manner as that of the structure shown in FIG. 22.

While the output of the input/output selection circuit 72 is transmitted to the input/output circuit 7 in the above-mentioned structure, this structure may be adapted such that the input and the output of the input/output circuit 7 are selected by the input/output selection circuit 72 and then connected to the input/output buffer or the data selecting operation is performed internal to the input/output circuit 7.

Figure 42:
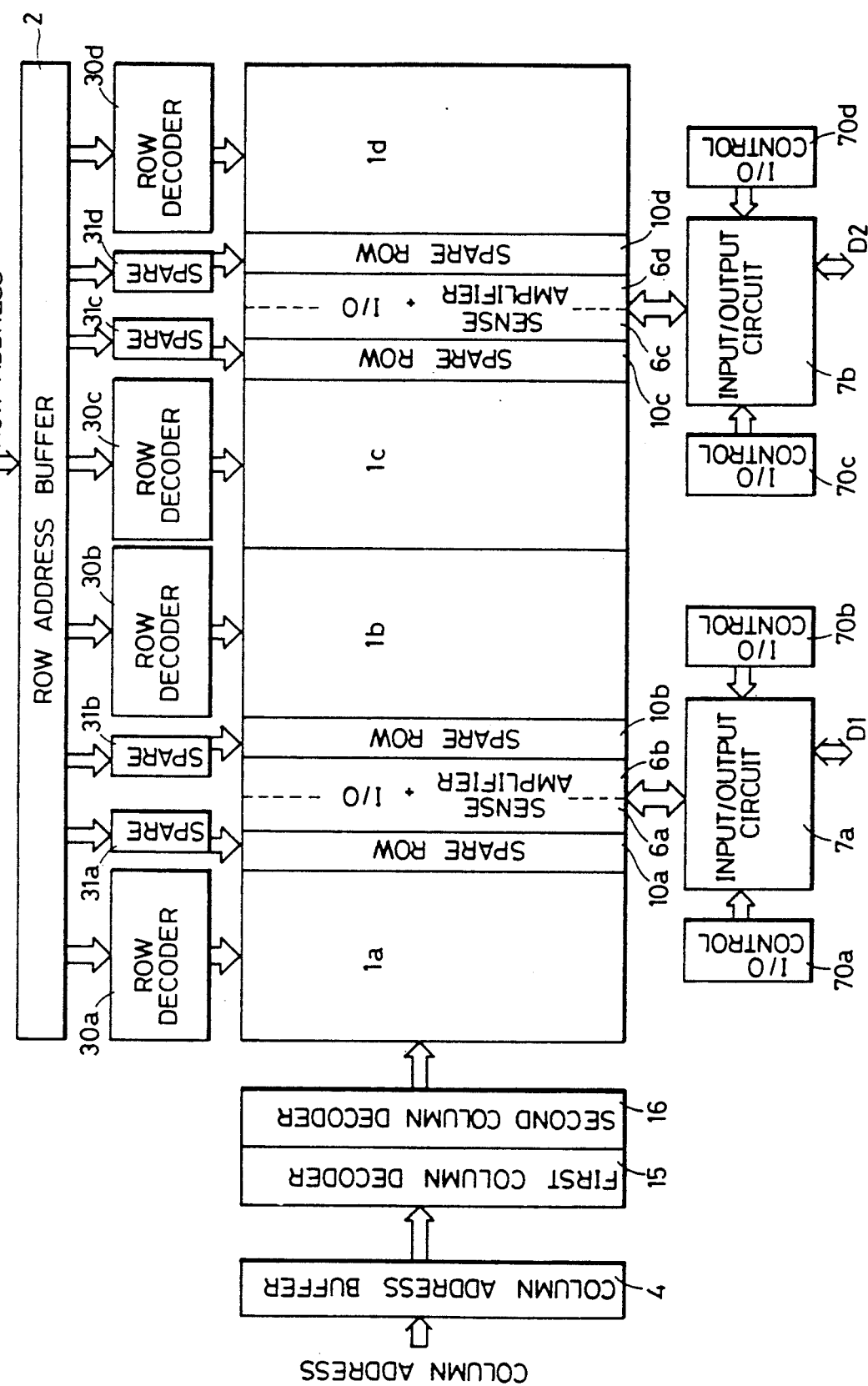
FIG. 42 is a diagram showing still another modified example of the semiconductor memory device shown in FIG. 41.

FIG. 42 is a diagram showing an example of a structure of a semiconductor memory device in accordance with still another embodiment of the invention. The semiconductor memory device shown in FIG. 42 provides an improvement to the semiconductor memory device shown in FIG. 8. The memory cell array of the semiconductor memory device shown in FIG. 42 is divided into four blocks 1a, 1b, 1c, and 1d. Normal row decoders 30a to 30d and spare row decoders 31a to 31d are provided corresponding to each of the memory cell blocks 1a to 1d. An internal row address is transmitted to each of the row decoders 30a to 30d and 31a to 31d from a row address buffer 2.

Spare row (redundant row) memory cell arrays 10a to 10d are provided corresponding to each of the memory cell blocks 1a to 1d. Furthermore, (sense amplifier +I/O) blocks 6a to 6d are provided corresponding to each of the memory blocks 1a to 1d, respectively in order to effect the inputting/outputting and the output of data with each memory cell array block.

The semiconductor memory device shown in FIG. 42 further includes a first column decoder 15 and a second column decoder 16 commonly provided for the memory cell blocks 1a to 1d. The column selecting operations of the first column decoder 15 and the second column decoder 16 in each memory cell block is the same as that in the above-mentioned embodiment.

Input/output circuits 7a and 7b are provided in order to effect inputting/outputting of data of each memory cell block 1a to 1d. The input/output circuit 7b effects inputting/outputting of data with the memory cell blocks 1a and 1b through the blocks 6a and 6b. The input/output circuit 7b effects inputting/outputting of data with the memory cell blocks 1c and 1d through the blocks 6c and 6d.

I/O selection control blocks 70a to 70d are provided to the memory cell blocks 1a to 1d, respectively, for repairing a defective column. The I/O selection control block 70a repairs a defective column in the memory cell block 1a. The I/O selection control block 70b repairs a defective column in the memory cell block 1b. The I/O control blocks 70c and 70d repair defective column in the memory cell blocks 1c and 1d, respectively.

In the structure shown in FIG. 42, while the column decoders 15 and 16 are commonly provided for the memory cell blocks 1a to 1d, the I/O selection control blocks 70a to 70d are provided independently for each of the memory cell blocks 1a to 1d, so that repairing of a defective column can be effected independently in each of the memory cell blocks 1a to 1d. Therefore, the efficiency of utilizing a redundant column memory cell array can be significantly improved compared with the structure of the conventional semiconductor memory device shown in FIG. 8. Since the operation of repairing a redundant column in each memory cell block is the same as the operation of repairing a defective column described above, the description thereof will not be repeated.

It may be configured so that data D1 and D2 (common data bus) from the input/output circuits 7a and 7c is directly connected to external pin terminals, or the selecting operation is effected by another input/output circuit (not shown) and the data on one of the data bus line pair is only connected to an external pin terminal.

The structure of the semiconductor memory device shown in FIG. 42 may be configured so that two adjacent memory cell blocks on one side (1a and 1b or 1c and 1d) are selectively activated or, furthermore, only one memory cell block is selectively activated instead of all the memory cell blocks 1a to 1d being brought to an operating state. In this case, only one input/output circuit is activated in accordance with a memory cell block which is activated.

Figure 43:
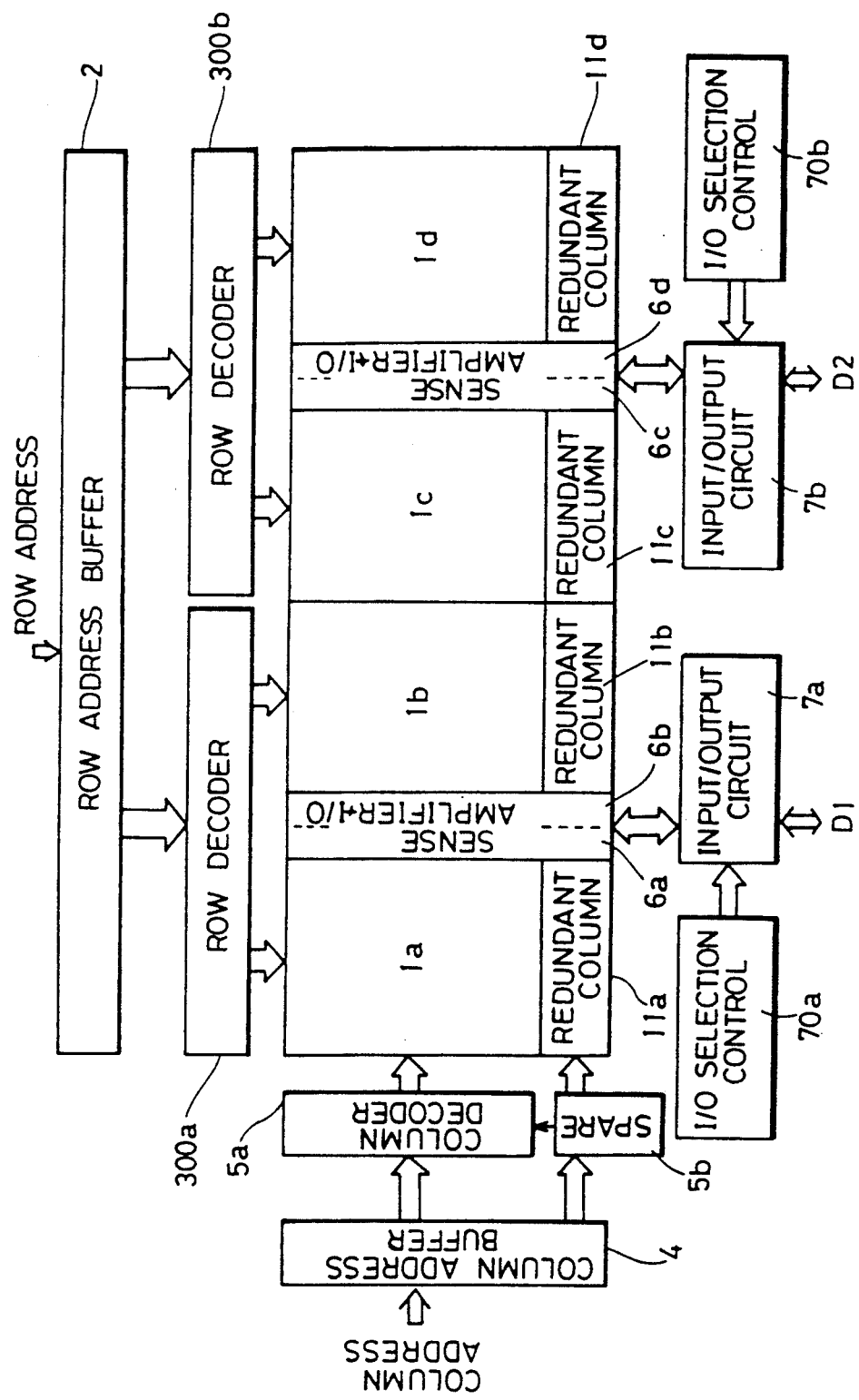
FIG. 43 is a diagram showing another modified example of the semiconductor memory device shown in FIG. 42.

FIG. 43 is a diagram schematically showing a structure of a semiconductor memory device in accordance with still another embodiment of the present invention, having a defective bit repairing function. In FIG. 43, there is shown a structure for repairing a defective row. In FIG. 43, redundant column memory cell arrays 11a to 11d are provided for memory cell array blocks 1a to 1d, respectively. A column address buffer 4 and a normal column decoder 5a are provided commonly for the memory cell blocks 1a to 1d and a spare column decoder 5b is provided commonly for the redundant column memory cell arrays 11a to 11d. (Sense amplifier +I/O) blocks 6a to 6d are provided for the memory cell blocks 1a to 1d, respectively. An input/output circuit 7a is provided for the (sense amplifier +I/O) blocks 6a and 6b and an input/output circuit 7b is provided commonly for the (sense amplifier +I/O) blocks 6c and 6d.

An I/O selection control circuit block 70a is provided for effecting an operation of selecting an internal data transmission line pair in the input/output circuit 7a and an I/O selection control circuit block 70b is provided for effecting an operation of selecting an internal data transmission line pair in the input/output circuit 7b.

A row decoder 300a is provided commonly for the memory cell blocks 1a and 1b and a row decoder 300b is provided commonly for the memory cell blocks 1c and 1d. An internal row address is transmitted to the row decoders 300a and 300b from a row address buffer 2.

Figure 44:
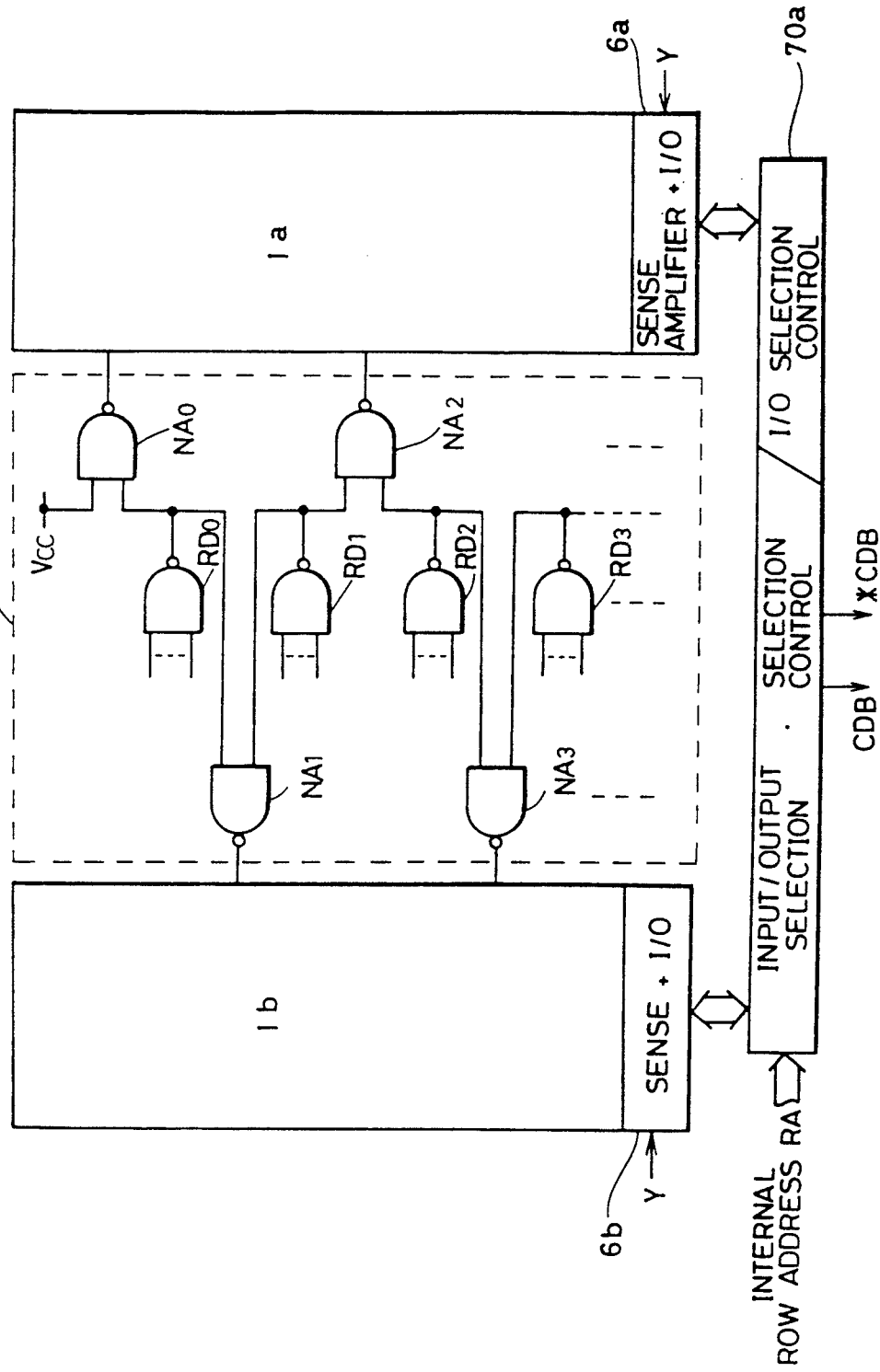
FIG. 44 is a diagram specifically showing one example of a structure of row selecting circuitry in the semiconductor memory device shown in FIG. 43.

FIG. 44 is a diagram schematically showing the structure of the row decoder 300 (one of 300a and 300b) shown in FIG. 43. In FIG. 44, the row decoder 300a includes NAND type decode circuits RD0 to RD3, . . . for decoding an internal row address, and NAND circuits NA0 to NA3 responsive to the outputs of the decode circuits RD0 to RD3, . . . for selecting one word line (not shown) from the memory cell blocks 1a and 1b, respectively. While the decoder 300a includes n decode circuits and n+1 NAND circuits, four decode circuits and four corresponding NAND circuits are representatively shown in FIG. 44. Word lines of even-numbered row addresses are arranged in the memory cell block 1a and word lines of odd-numbered row addresses are arranged in the memory cell block 1b. In this structure, when one row decode circuit is selected, one word line is selected simultaneously from the memory cell blocks 1a and 1b.

The memory cell blocks 1a and 1b are connected to an I/O selection control block 70a through (sense amplifier +I/O) blocks 6a and 6b. The I/O selection control block 70a selects a memory cell of one of the memory cell blocks 1a and 1b and connects the same to common data bus line pair CDB, *CDB in response to a part of an internal row address RA. The selection control operation of the I/O selection control block 70a is the same as the operation described above at the time of repairing a defective column, except that a control signal is generated from the internal row address RA and the defective row address.

In accordance with the structure shown in FIGS. 43 and 44, while data is read out from one memory cell block (at this time, the number of bits of data to be read is optionally determined), a defective row in one of the memory cell blocks can be repaired. That is, selecting a memory cell can be performed avoiding a defective row by switching a manner of the control operation (selecting operation) in the I/O selection control block 70a depending on an applied row address is of row addresses of higher order or row addresses of lower order with respect to that of the defective row.

The operation described above is performed also in the same way in the memory cell blocks 1c and 1d. The structure of the semiconductor memory device shown in FIG. 43 may be configured so that all the memory cell blocks 1a to 1d need not be activated at the same time and either one block of the memory cell blocks 1a and 1b or the memory cell blocks 1c and 1d is only activated.

The operation of repairing a defective row in the semiconductor memory device shown in FIG. 44 is the same as that of the memory device shown in FIG. 41. Accordingly, as shown in FIG. 41, when a bit line pair is repaired in a block dividing structure, only one I/O selection control block 70 is enough for two memory cell blocks. This is because data from one memory cell block is selected. It may be configured so that either one of the memory cell blocks 1a and 1b or the memory cell blocks 1c and 1d is only activated.

A semiconductor memory device has been described as one example of a semiconductor circuit device in the above-mentioned embodiments. The semiconductor circuit device, however, may have a structure, in place of the semiconductor memory device, that it has a functional block including a plurality of functional circuits arranged at least in columns and a desired functional circuit is selected from the functional block by an externally applied address signal.

Figure 45:
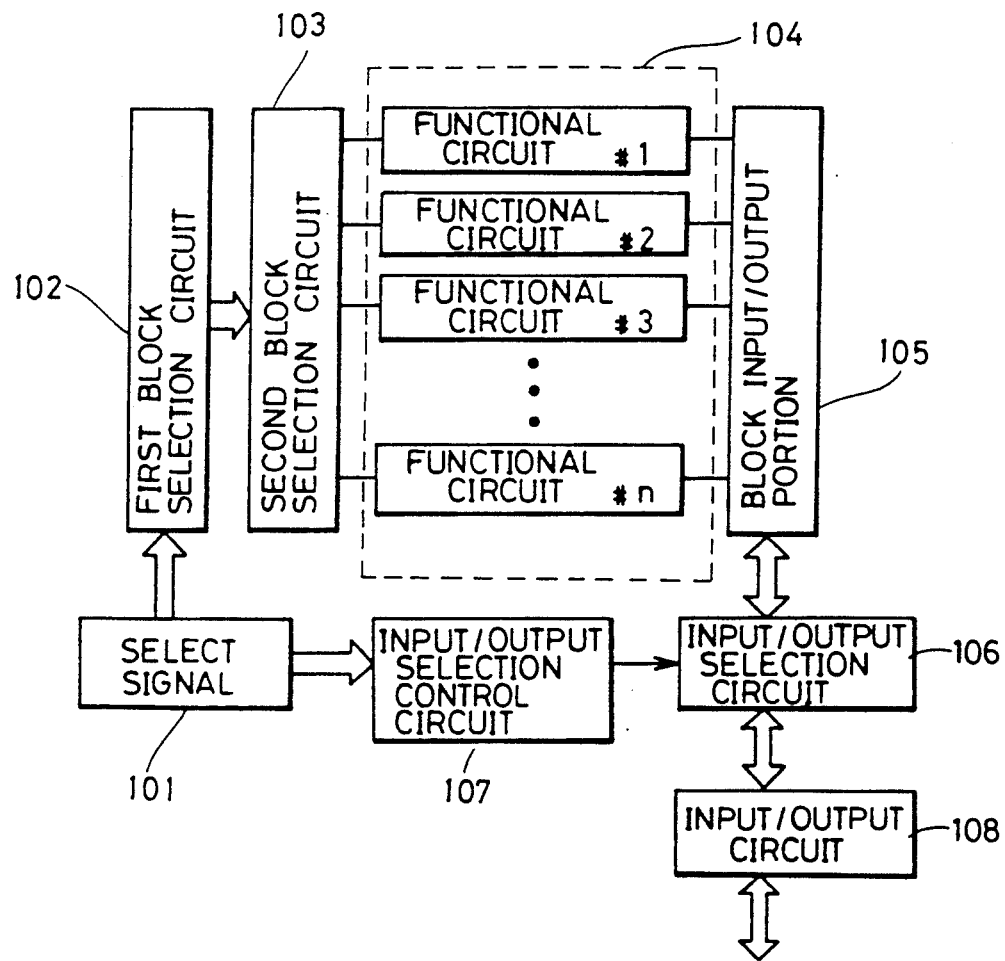
FIG. 45 is a diagram showing one example of a structure of a semiconductor circuit device in accordance with a fifth aspect of the invention.

FIG. 45 is a diagram showing a structure of a semiconductor circuit device in accordance with still another embodiment of the invention. In FIG. 45, the semiconductor circuit device includes a functional block 104 including n functional circuits #1 to #n arranged at least in columns. Each of the functional circuits #1 to #n may be a signal converting circuit for converting the output of the sensor to a desired electric signal as far as it performs a predetermined function. It may be a solid state image sensor such as a CCD. The functional circuits #1 to #n may be a sensor and arithmetic circuits for performing a predetermined operation. The semiconductor circuit device has a function of and a predetermined functional circuit effecting writing and/or reading of data into and/or from the functional block 104.

The semiconductor circuit device shown in FIG. 45 includes a select signal generating circuit 101 for generating a select signal for designating a functional circuit contained in the functional block 104, a first block selection circuit 102 for decoding the select signal and generating a first block select signal, and a second block selection circuit 103 for generating a signal which selects a predetermined plurality of functional circuits from the functional block 104 in accordance with the first block select signal. The semiconductor circuit device further includes a block input/output portion 105 for connecting a functional circuit selected by the second block selection circuit 103 to an input/output selection circuit 106, and an input/output selection control circuit 107 responsive to the select signal from the select signal generating circuit 101 for further selecting a functional circuit selected in the input/output selection circuit 106. The functional circuit selected by the input/output selection circuit 106 is connected to an input/output circuit 108 which is in turn connected to an outside of the device.

When the semiconductor circuit device shown in FIG. 45 is compared with the semiconductor memory device shown in FIG. 16, the select signal generating circuit 101 corresponds to the column address buffer 4. The first block selection circuit 102 corresponds to the first column decoder 15. The second block selection circuit 103 corresponds to the second column decoder 16 (16'). The block input/output portion 105 corresponds to the I/O gate block contained in the (sense amplifier+I/O) block 6. The input/output selection circuit 106 corresponds to the input/output selection circuit 72. The input/output selection control circuit 107 corresponds to the input/output selection control circuit 71 and the input/output circuit 108 corresponds to the input/output circuit 7. Therefore, the operation of the semiconductor circuit device shown in FIG. 45 is the same as the operation at the time of selecting a defective row or defective column in repairing a defective bit as described above. That is, the memory cell array 1 is replaced with the functional block 104. A detailed description of the semiconductor circuit device shown in FIG. 45 will not be repeated.

When the functional circuits #1 to #n in the functional block 104 respectively perform a predetermined processing in parallel and the output of a predetermined functional circuit among them is monitored or processed outside, for example, in a case that data is read from each scanning line like in a CCD (Charge Coupled Device), a defective functional circuit supplies a meaningless or incorrect processing result. In a case of a structure in which the output from a selected functional circuit is further processed, a desired processing result cannot be obtained if certain functional circuit is defective. In such a case, in accordance with the present invention, some processing can be effected by removing the defective functional circuit and only using the outputs of the remaining functional circuits and thus a signal processing system can be obtained, which is superior in a backup characteristic.

In this case, the present invention is also applicable in a large scale signal processor if a defective column address (an address indicating a defective functional circuit) in the input/output selection control circuit is adapted to be externally programmable, for example, with a DIP switch or the like.

When it is configured so that such a defective column address is externally programmable, even if the functional circuits contained in the functional block 104 are all operating normally, the outputs of the functional circuits except a desired functional circuit can be obtained continuously, by setting this defective column address and a signal processing system having high flexibility and capable of switching a target object for which a signal is to be processed as required, can be obtained.

It is apparent that the decoder circuits shown in FIGS. 15 to 17 can be also used for repairing a defective bit (defective function). From the foregoing, the effects of the present invention are as follows.

(1) A plurality of subsequent stage circuits are simultaneously activated and the same subsequent stage circuit is activated in a duplicated way in response to the outputs of different decoder circuits, so that it will be possible to freely set a combination of subsequent stage circuits to be simultaneously activated and to provide great flexibility in combination of subsequent stage circuits to be selected simultaneously with a single signal inputting.

(2) A plurality of rows or columns are simultaneously selected from a memory cell array at the same time and the same row or column is selected in a duplicated way in accordance with the outputs of different decoder circuits, so that it will be possible to freely set a combination of rows or columns to be simultaneously selected, to select a desired combination of rows or column in accordance with the content of processing, and to obtain a semiconductor device capable of performing an operation at high speed.

(3) It is configured so that an address signal is predecoded to generate a group number specifying signal and an element number specifying signal, the sum of the numbers of activated bits is kept constant all the time, and a plurality of subsequent stage circuits are selected in response to the group number specifying signal and the element number specifying signal obtained by the predecode, so that a semiconductor circuit device can be obtained capable of selecting a desired combination of subsequent stage circuits at high speed without increasing the scale of the decoder circuit.

(4) It is configured so that a plurality of functional circuits are simultaneously selected in response to an address signal, the combinations of the plurality of functional circuits to be simultaneously selected can be changed, at least one functional circuit is further selected from the plurality of functional circuits selected simultaneously, using a part of the external address, and the manner in which at least one functional circuit is selected is switched in accordance with comparison between an address indicating a functional circuit to be removed and the external address, so that it will be possible to successively select a desired combination of functional circuits without selecting an unnecessary functional circuit.

(5) It is configured so that a plurality of rows or columns are simultaneously selected from a memory cell array in accordance with an external address, the combinations of rows or columns to be simultaneously selected can be changed, a column is further selected from the memory cells selected simultaneously, using part of the external address, and the selecting manner in which a column is selected is switched in accordance with comparison between the defective row or column address and the selected row or column address, so that it is not necessary to provide a link element in each decoder circuit output portion, for disconnecting the defective row or the defective column from the decoder circuit. The defective row or the defective column is replaced with a normal row or a normal column without any spare row or column decoder, so that it is unnecessary to bring a normal decoder to the inactive state, which has been once brought to the active state, and a semiconductor memory device capable of a high speed access can be obtained. Since there is no link element used, a semiconductor memory device with high reliability can be obtained, which never causes a defect such as short-circuit of a signal line due to a blown fuse at the time of blowing off a link element provided in the decoder output.

(6) In addition to the effect of (5) described above, is possible to perform repairing of a defective row/defective column independently in each memory cell block and thus to obtain a semiconductor memory device with high efficiency of using a redundant memory cell array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device responsive to an input signal for selectively activating a plurality of subsequent stage circuits, comprising:
   selection means responsive to said input signal for simultaneously activating a predetermined number of subsequent stage circuits among said plurality of subsequent stage circuits, said selection means selecting and activating the same subsequent stage circuit for different input signals in a duplicated way.

2. The device according to claim 1, wherein said selection means includes:
   first decode means including a plurality of decode circuits and responsive to said input signal for selectively activating at least one of said plurality of decode circuits, an activated decode circuit generating an activation signal; and
   second decode means responsive to the activation signal from said first decode means for simultaneously activating said predetermined number of subsequent stage circuits among said plurality of subsequent stage circuits, said second decode means including a plurality of activation circuits provided respectively to said plurality of subsequent stage circuits, each of said activation circuits receiving output signals of a plurality of decode circuits and activating a related subsequent stage circuit when an activation signal is contained in the received output signals.

3. The device according to claim 2, wherein each of said activation circuits receives output signals of a plurality of successively adjacent decode circuits.

4. The device according to claim 2, wherein each of said activation circuits receives output signals of a plurality of decode circuits which are provided in a loop manner.

5. The device according to claim 1, wherein each of said plurality of subsequent stage circuits has allocated a group number and an element number indicating a position in a related group, said input signal includes a plurality of bits, and
   said selection means includes:
   first decode means for specifying successively adjacent bits in said input signal of the plurality of bits and generating a group number specifying signal and an element number specifying signal each including a plurality of bits, the sum of active bits of said group number specifying signal and active bits of said element number specifying signals being 3 or more; and
   second decode means responsive to said group number specifying signal and said element number specifying signal for activating corresponding subsequent stage circuits.

6. The device according to claim 5, wherein said second decode means includes a plurality of gate circuits provided respectively to said plurality of subsequent stage circuits for receiving a related group number specifying signal bit and a related element number specifying signal bit, and being activated when received signal bits are all in an active state.

7. The device according to claim 6, wherein said element numbers are sequentially allotted to each of said subsequent stage circuits in a mirror-reflecting fashion with respect to a boundary line of groups, and
   said first decode means activates successively adjacent bits of at least one of said group number specifying signal bits and said element number specifying bits.

8. The device according to claim 7, wherein said first decode means generates said group number specifying signal and said element number specifying signal so that two successively adjacent gate circuits may be simultaneously activated.

9. The device according to claim 1, wherein
   each of said subsequent stage circuits includes a column selection gate for connecting a column line to which a column of memory cells are connected to a corresponding internal data bus line among a plurality of internal data bus lines.

10. The device according to claim 1, wherein said plurality of subsequent stage circuits are divided into at least two blocks, and
   said selection means includes means for activating one subsequent stage circuit from each block.

11. The device according to claim 1, wherein
   each of said subsequent stage circuits includes a word line to which a row of memory cells are connected.

12. The device according to claim 9, wherein
   said input signal is a column address, and wherein said device further includes:
   defective address storing means for storing an address of a column including a defective memory cell among the column lines as a defective address;
   comparing means for comparing a received column address and said defective address; and
   bus selection means responsive to bits of at least a part of said column address and an output signal of said comparing means for selecting a predetermined number of internal data bus lines among said plurality of internal data bus lines, and
   said bus selection means includes selection control means for selecting a bus line from said plurality of internal data bus lines so that a column designated by said defective address may be brought into a non-selected state in any case.

13. The device according to claim 12, wherein
   said bus selection means includes a plurality of connecting gates for connecting said plurality of internal data bus lines to a plurality of common data bus lines provided separately, said connecting gates being arranged so that one internal data bus line can be connected to each of said common data bus lines, and
   said selection control means includes means for shifting when there is a defective memory cell an order of connection in one direction in a sequential manner in which simultaneously selected columns are connected to said common data bus lines from the order in the sequential manner when there is no column containing a defective memory cell so that a column containing a defective memory cell may be non-selected, in accordance with the output signal of said comparing means and at least part of said column address.

14. The device according to claim 12, wherein said plurality of subsequent stage circuits are divided into a plurality of blocks, and
   said defective address storing means, said comparing means, and said bus selection means are provided for each of said plurality of blocks separately.

15. The device according to claim 11, wherein said plurality of word lines are divided into a plurality of blocks, and wherein said device further comprises:
   defective address storing means for storing an address of a word line to which a defective memory cell is connected as a defective address;
   comparing means for comparing an external address supplied as said input signal with said defective address;
   column selection means for selecting a memory cell from the memory cells on a word line selected by said selection means for each block in accordance with an externally applied column address; and
   input/output selection means responsive to at least part of said external address and an output signal of said comparing means, for further selecting a memory cell from memory cells selected by said column selection means, said input/output selection means bringing any memory cell of a row designated by said defective address into a non-selected state in any cases.

16. The device according to claim 1, wherein said plurality of subsequent stage circuits includes functional circuits each for performing a predetermined function, and wherein said device further comprises:
   address storing means for storing an address which specifies a predetermined defective functional circuit;
   comparing means for comparing said input signal and the stored address; and
   means responsive to at least an output signal of said comparing means for further selecting a predetermined number of functional circuits from the plurality of functional circuits selected by said selection means so that the defective functional circuit at said stored address may be brought to the non-selected state.

17. A method of selectively activating a plurality of subsequent stage circuits in response to an input signal, comprising the step of:
   simultaneously activating a predetermined number of subsequent stage circuits from said plurality of subsequent stage circuits in response to said input signal, said plurality of subsequent stage circuits being arranged to be activated in a duplicated way in response to different input signals.

18. The method according to claim 17, wherein said step of simultaneously activating includes a step of activating subsequent stage circuits successively adjacent to each other in a predetermined relationship.

19. The method according to claim 17, wherein said step of simultaneously activating comprises the steps of:
   decoding said input signal and generating a first select signal; and
   simultaneously activating said predetermined number of subsequent stage circuits in response to said generated first select signal, a combination of subsequent stage circuits simultaneously activated being predetermined corresponding to the first select signal 20. The method according to claim 17, wherein
   each of said plurality of subsequent stage circuits includes a group number and an element number indicating a position in the group, and said input signal comprises a plurality of bits, and,
   said step of simultaneously activating comprises the steps of:
   decoding a plurality of successively adjacent bits of said input signal and generating a group number specifying signal and an element number specifying signal each including a plurality of bits, the plurality of successively adjacent bits being in an active state in at least one of said group number specifying signal and said element number specifying signal; and
   activating a corresponding subsequent stage circuit in response to said group number specifying signal and said element number specifying signal.

21. The method according to claim 17, further comprising the steps of:
   storing a predetermined address which specifies a predetermined defective subsequent stage circuit;

comparing said input signal and said predetermined address; and further selecting a predetermined number of subsequent stage circuits from said simultaneously activated subsequent stage circuits in response to at least the result of comparison in said step of comparing, so that the defective subsequent stage circuit specified by said stored address may be brought to a non-selected state.

22. The method according to claim 21, wherein said step of further selecting comprises steps of:

connecting said predetermined number of subsequent stage circuits to a plurality of data buses in a predetermined sequence, said predetermined sequence being determined by a part of said input signal; and modifying said predetermined sequence in accordance with the output signal of said comparing means so that the subsequent stage circuit specified by said defective address may be non-selected.

* * * * *